(12) United States Patent
Seong et al.

(10) Patent No.: US 12,268,075 B2
(45) Date of Patent: Apr. 1, 2025

(54) COLOR TRANSFORMATION SUBSTRATE AND DISPLAY DEVICE

(71) Applicant: Samsung Display Co., LTD., Yongin-si (KR)

(72) Inventors: Jae Min Seong, Suwon-si (KR); Keun Chan Oh, Hwaseong-si (KR); Gak Seok Lee, Hwaseong-si (KR); Sun Kyu Joo, Suwon-si (KR); Byung Chul Kim, Suwon-si (KR); In Ok Kim, Osan-si (KR); In Seok Song, Pocheon-si (KR); Ji Eun Jang, Suwon-si (KR); Chang Soon Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 946 days.

(21) Appl. No.: 17/419,982

(22) PCT Filed: Mar. 13, 2019

(86) PCT No.: PCT/KR2019/002865
§ 371 (c)(1),
(2) Date: Jun. 30, 2021

(87) PCT Pub. No.: WO2020/141651
PCT Pub. Date: Jul. 9, 2020

(65) Prior Publication Data
US 2022/0085114 A1    Mar. 17, 2022

(30) Foreign Application Priority Data

Dec. 31, 2018  (KR) .................. 10-2018-0174245

(51) Int. Cl.
*H01L 27/32*   (2006.01)
*H10K 50/86*   (2023.01)
(Continued)

(52) U.S. Cl.
CPC ........... *H10K 59/38* (2023.02); *H10K 50/865* (2023.02); *H10K 59/12* (2023.02)

(58) Field of Classification Search
None
See application file for complete search history.

(56) References Cited

U.S. PATENT DOCUMENTS

| | | | |
|---|---|---|---|
| 2013/0242228 A1* | 9/2013 | Park | G02F 1/133617 257/E33.012 |
| 2016/0079311 A1* | 3/2016 | Lim | H10K 50/858 257/40 |

(Continued)

FOREIGN PATENT DOCUMENTS

| | | |
|---|---|---|
| CN | 103972265 A | 8/2014 |
| CN | 108254966 A | 7/2018 |

(Continued)

OTHER PUBLICATIONS

Korean Office Action—Korean Application No. 10-2018-0174245 dated Dec. 20, 2024, citing references listed within.

(Continued)

*Primary Examiner* — William C Trapanese
(74) *Attorney, Agent, or Firm* — CANTOR COLBURN LLP

(57) ABSTRACT

A color transformation substrate comprises: a base portion having first and second light-blocking areas and first to third light-transmitting areas, where the light-transmitting areas are successively positioned along a first direction; first to third color filters positioned in the first to third light-transmitting areas, respectively; a light-blocking member positioned in the first light-blocking area, and including part contacting the base portion; a color pattern positioned in the second light-blocking area so as to contact the base portion; a first wavelength conversion pattern positioned on the second color filter so as to wavelength-convert light having (Continued)

a first color into light having a second color; and a second wavelength conversion pattern positioned on the third color filter so as to wavelength-convert light having the first color into light having a third color different from light having the second color. The color pattern and the first color filter comprise the same color material.

18 Claims, 43 Drawing Sheets

(51) Int. Cl.
*H10K 59/12* (2023.01)
*H10K 59/38* (2023.01)

(56) References Cited

U.S. PATENT DOCUMENTS

| | | | | |
|---|---|---|---|---|
| 2017/0062529 | A1* | 3/2017 | Paek | ........................ H10K 59/38 |
| 2018/0052362 | A1* | 2/2018 | Kang | ................ G02F 1/133528 |
| 2018/0164640 | A1* | 6/2018 | Kim | .................. G02F 1/133504 |
| 2018/0203292 | A1 | 7/2018 | Kim et al. | |
| 2020/0258945 | A1* | 8/2020 | Joo | ........................ H10K 59/38 |

FOREIGN PATENT DOCUMENTS

| | | | |
|---|---|---|---|
| CN | 108628036 | A | 10/2018 |
| JP | 2007103027 | A | 4/2007 |
| JP | 5609878 | B2 | 10/2014 |
| KR | 1020100114101 | A | 10/2010 |
| KR | 1020150123802 | A | 11/2015 |
| KR | 1020150129551 | A | 11/2015 |
| KR | 1020170026885 | A | 3/2017 |
| KR | 1020180018969 | A | 2/2018 |
| KR | 1020180025081 | A | 3/2018 |
| KR | 1020180044474 | A | 5/2018 |
| KR | 1020180066936 | A | 6/2018 |
| KR | 1020200054382 | A | 5/2020 |

OTHER PUBLICATIONS

Chinese Office Action - Chinese Application No. 201980087268.4 dated Jan. 20, 2024, citing references listed within.
International Search Report mailed Sep. 30, 2019 for PCT/KR2019/002865, citing the above reference(s).

* cited by examiner

COLOR TRANSFORMATION SUBSTRATE AND DISPLAY DEVICE

TECHNICAL FIELD

The present invention relates to a color conversion substrate and a display device.

BACKGROUND ART

With the development of multimedia, display devices are becoming more important. Accordingly, various types of display devices such as liquid crystal display ("LCD") devices, organic light-emitting diode ("OLED") display devices, and the like have been developed.

Among these display devices, the OLED display device includes an organic light-emitting element which is a self-luminous element. The organic light-emitting element may include two opposing electrodes and an organic light-emitting layer interposed therebetween. Electrons and holes provided from the two opposing electrodes are recombined in the light-emitting layer to generate excitons, and the generated excitons transition from an excited state to a ground state and thus light may be emitted.

Since such an OLED display device does not require a separate light source, the OLED display device may be configured as a thin and lightweight display device with low power consumption and have advantageous quality characteristics such as a wide viewing angle, high luminance and contrast, and fast response time. Thus, such an OLED display device has attracted attention as a next-generation display device.

DISCLOSURE

Technical Problem

A method of arranging a color conversion pattern or a wavelength conversion pattern for each pixel on a light path from a light source to a viewer can be exemplified as one method of allowing each pixel of a display device to uniquely represent one basic color.

Aspects of the present invention provide a color conversion substrate capable of improving display quality and a display device having improved display quality.

Technical Solution

One aspect of the present invention provides a color conversion substrate including: a base portion in which a first light-blocking area, a second light-blocking area, a first light-transmitting area, a second light-transmitting area, and a third light-transmitting area are defined, where the first light-transmitting area, the second light-transmitting area, and the third light-transmitting area are sequentially disposed along a first direction; a first color filter disposed on the base portion and disposed in the first light-transmitting area; a second color filter disposed on the base portion and disposed in the second light-transmitting area; a third color filter disposed on the base portion and disposed in the third light-transmitting area; a light-blocking member including a first light-blocking member which is disposed on the base portion, disposed in the first light-blocking area, and includes a portion in contact with the base portion; a color pattern including a first color pattern which is disposed on the base portion, disposed in the second light-blocking area, and in contact with the base portion; a first wavelength conversion pattern disposed on the second color filter and which wavelength-converts light of a first color into light of a second color, and a second wavelength conversion pattern disposed on the third color filter and which wavelength-converts the light of the first color into light of a third color, where the light of the third color is different from the light of the second color, where the color pattern and the first color filter include the same colorant.

In some embodiments, the first light-blocking area may be disposed between the first light-transmitting area and the second light-transmitting area which are arranged along the first direction, and the second light-blocking area may be disposed between the second light-transmitting area and the third light-transmitting area which are arranged along the first direction.

In some embodiments, the first color filter may transmit the light of the first color and block the light of the second color and the light of the third color, the second color filter may transmit the light of the second color and block the light of the first color and the light of the third color, and the third color filter may transmit the light of the third color and block the light of the first color and the light of the second color.

In some embodiments, the light-blocking member may further include a second light-blocking member which is disposed in the second light-blocking area and may be disposed on the color pattern in the second light-blocking area.

In some embodiments, the second light-blocking member may not be in direct contact with the base portion in the second light-blocking area.

In some embodiments, the light-blocking member further includes a third light-blocking member which is in direct contact with the base portion, and the light-blocking member may completely surround the first light-transmitting area in a plan view.

In some embodiments, the color pattern may further include a second color pattern which is disposed in the first light-blocking area and may be in contact with the base portion in the first light-blocking area, a portion of the first light-blocking member in the first light-blocking area may be disposed on the second color pattern, and another portion of the first light-blocking member in the first light-blocking area may be in direct contact with the base portion.

In some embodiments, a first contact area, in which the first light-blocking member is in direct contact with the base portion in the first light-blocking area, may be disposed relatively closer to the first light-transmitting area than a second contact area in which the second color pattern is in contact with the base portion in the first light-blocking area.

In some embodiments, a first contact area, in which the first light-blocking member is in contact with the base portion in the first light-blocking area, may be disposed in areas of the first light-blocking area i) between a second contact area, in which the second color pattern is in direct contact with the base portion, and the first light-transmitting area and ii) between the second contact area and the second light-transmitting area.

In some embodiments, the light-blocking member may further include a second light-blocking member which is disposed in the second light-blocking area, a portion of the second light-blocking member in the second light-blocking area may be disposed on the first color pattern, and another portion of the second light-blocking member in the second light-blocking area may be in direct contact with the base portion.

In some embodiments, a first contact area, in which the another portion of the second light-blocking member is in direct contact with the base portion in the second light-blocking area, may be disposed in areas of the second light-blocking area i) between a second contact area, in which the color pattern is in contact with the base portion, and the second light-transmitting area and ii) between the second contact area and the third light-transmitting area.

In some embodiments, the first light-blocking area may be disposed adjacent to the first light-transmitting area and extend along a second direction intersecting the first direction, and the second light-blocking area may be disposed between the second light-transmitting area and the third light-transmitting area and extend along the second direction.

In some embodiments, the color conversion substrate may further include a light-transmitting pattern disposed on the first color filter, wherein the light-transmitting pattern may include a base resin and a scatterer disposed in the base resin.

In some embodiments, the color conversion substrate may further include a first capping layer disposed on the base portion and covering the first color filter, the second color filter, the third color filter, the light-blocking member, and the color pattern, wherein the first capping layer may be made of an inorganic material, and the light-transmitting pattern, the first wavelength conversion pattern, and the second wavelength conversion pattern may be disposed on the first capping layer.

In some embodiments, the first capping layer may be in direct contact with the light-blocking member.

In some embodiments, the color conversion substrate may further include a second capping layer disposed on the first capping layer and covering the light-transmitting pattern, the first wavelength conversion pattern, and the second wavelength conversion pattern, and a color mixing preventing member disposed on the second capping layer and disposed between the light-transmitting pattern and the first wavelength conversion pattern and between the first wavelength conversion pattern and the second wavelength conversion pattern.

Another aspect of the present invention provides a display device including a first base portion in which a first light-emitting area and a second light-emitting area are defined, a first light-emitting element disposed on the first base portion and disposed in the first light-emitting area, a second light-emitting element disposed on the first base portion and disposed in the second light-emitting area, a thin-film encapsulation layer disposed on the first light-emitting element and the second light-emitting element, a second base portion disposed on the thin-film encapsulation layer, a blue color filter disposed on a surface of the second base portion, which faces the thin-film encapsulation layer, and overlapping the first light-emitting element in a plan view, a red color filter disposed on the surface of the second base portion and overlapping the second light-emitting element in the plan view, a light-blocking member disposed on the surface of the second base portion, disposed between the blue color filter and the red color filter, and in direct contact with the second base portion, a color pattern disposed on the surface of the second base portion, disposed on an opposite side of the light-blocking member with the red color filter therebetween, and in direct contact with the second base portion, a light-transmitting pattern disposed on the blue color filter, and a wavelength conversion pattern disposed on the red color filter, where each of the first light-emitting element and the second light-emitting element includes an organic light-emitting layer which emits blue light, the wavelength conversion pattern is configured to wavelength-convert blue light into red light, and the color pattern includes a blue colorant.

In some embodiments, the wavelength conversion pattern may include a base resin and a quantum dot dispersed in the base resin.

In some embodiments, the display device may further include a capping layer disposed on the light-transmitting pattern and the wavelength conversion pattern, and a filler disposed between the thin-film encapsulation layer and the capping layer, wherein the capping layer may be in direct contact with the filler.

In some embodiments, the display device may further include a capping layer disposed between the light-transmitting pattern and the blue color filter, wherein the capping layer may be in direct contact with the light-blocking member.

Other details of embodiments for solving the above problems are included in the detailed description and the drawings.

Advantageous Effects

According to embodiments of the present invention, it is possible to provide a color conversion substrate capable of improving display quality and a display device having improved display quality.

Effects according to the embodiments are not limited by the content exemplified above, and more various effects are included in the present specification.

MODES OF THE INVENTION

Figure 1:
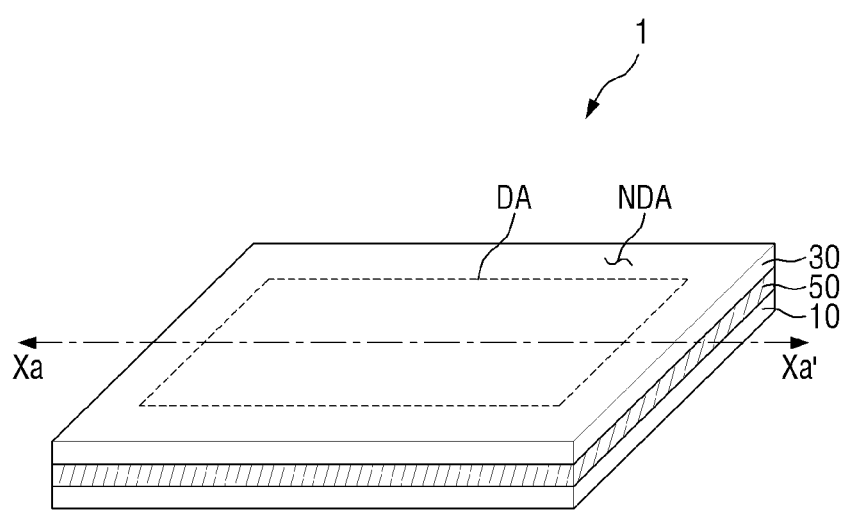
FIG. 1 is a schematic perspective view of a display device according to one embodiment.
Figure 1:
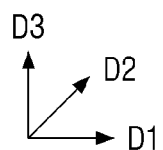

Advantages and features of the present invention and methods for accomplishing the same will be more clearly understood from embodiments described below with reference to the accompanying drawings. However, the present invention is not limited to the following embodiments but may be implemented in various different forms. The embodiments are provided only to complete the present invention and to fully provide a person having ordinary skill in the art to which the present invention pertains with the category of the present invention, and the present invention will be defined by the appended claims.

It will be understood that when an element or a layer is referred to as being "on" or "above" another element or layer, it can be directly on or above another element or layer or intervening elements or layers may be present. On the other hand, a case in which an element or a layer is "directly on" or "directly above" another element or layer refers to a case in which no other elements or layer are interposed between the element or layer and the other element or layer. Throughout the specification, like reference numerals refer to like components.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below.

Although the terms first, second, third, fourth, and the like are used to describe various components, these components are not substantially limited by these terms. These terms are used only to distinguish one component from another component. Therefore, a first component described below may be substantially one of a second component, a third component, and a fourth component within the technical spirit of the present invention.

The embodiments described herein will be described with reference to a plan view and a cross-sectional view that are idealized schematic views of the present invention. Accordingly, modifications may be made in the form of exemplary views due to manufacturing technology, an allowable error, and/or the like. Therefore, the embodiments of the present invention will not be limited to particular forms shown in the drawings and include changes made by a manufacturing process. Thus, areas illustrated in the drawings are schematic in nature and their shapes are not intended to illustrate the precise shape of an area of an element and are not intended to limit the scope of the present invention.

Hereinafter, embodiments of the present invention will be described with reference to the accompanying drawings.

Figure 2:
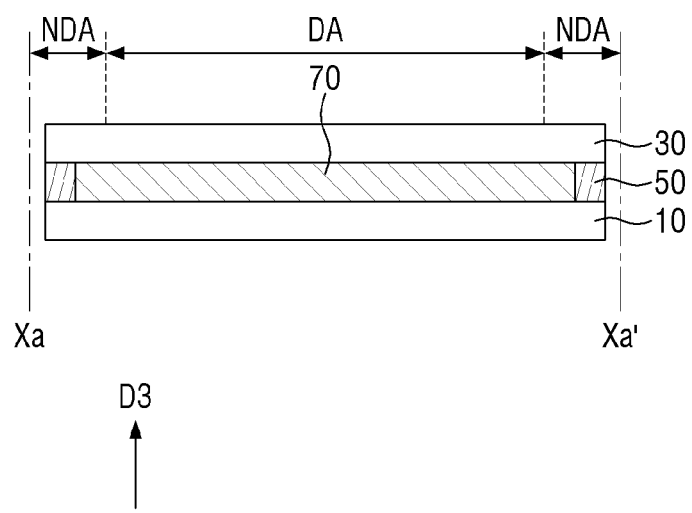
FIG. 2 is a schematic cross-sectional view of the display device taken along line Xa-Xa' of FIG. 1.
Figure 3:
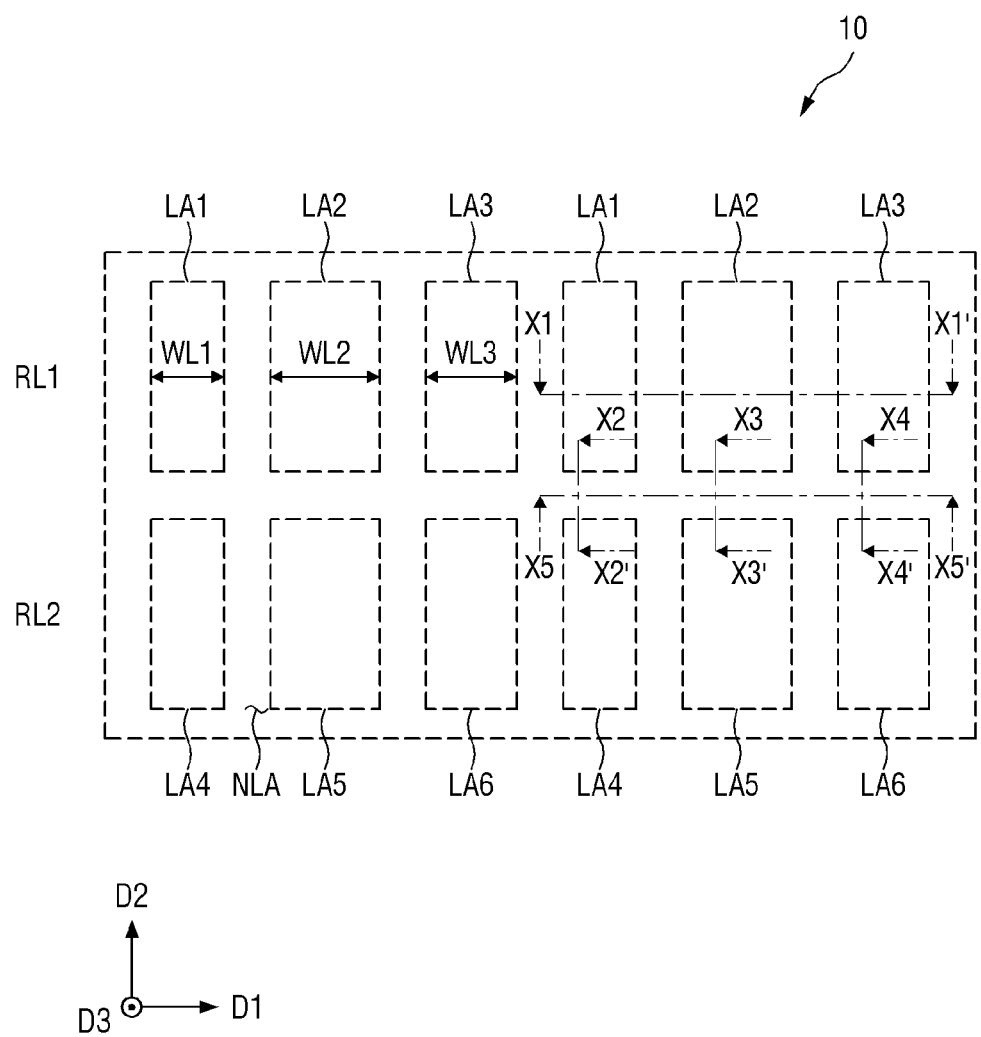
FIG. 3 is a schematic plan view of a display substrate in a display area of the display device shown in FIGS. 1 and 2.

FIG. 1 is a schematic perspective view of a display device according to one embodiment, FIG. 2 is a schematic cross-sectional view of the display device according to one embodiment, taken along line X1-X1' of FIG. 1, and FIG. 3 is a schematic plan view of a display substrate shown in FIGS. 1 and 2, and more specifically, a schematic plan view of the display substrate in a display area.

Referring to FIGS. 1 to 3, a display device 1 may be applied to a variety of electronic devices, for example, small and medium electronic devices such as a tablet personal computer ("PC"), a smartphone, a car navigation unit, a camera, a center information display ("CID") provided in a vehicle, a wristwatch-type electronic device, a personal digital assistant ("PDA"), a portable multimedia player ("PMP"), and a game console, and medium and large electronic devices such as a television, an external billboard, a monitor, a PC, and a laptop computer. The above description is merely presented as an example, and, alternatively, the display device 1 may be employed in other electronic devices without departing from the concept of the present invention.

In some embodiments, the display device 1 may have a rectangular shape in a plan view. The display device 1 may include two short sides (i.e., latitudinal sides) extending in a first direction D1 and two long sides (i.e., longitudinal sides) extending in a second direction D2 intersecting the first direction D1. A corner at which the long side and the short side of the display device 1 meet may have a right angle, but the present invention is not limited thereto, and the corner may also have a curved surface. A planar shape of the display device 1 is not limited to the illustrated shape and may be a circular shape or other shapes.

The display device 1 may include a display area DA in which an image is displayed and a non-display area NDA in which an image is not displayed. In some embodiments, the non-display area NDA may be disposed around a periphery of the display area DA and may surround the display area DA.

Unless otherwise defined, the terms "above," "upper side," "upper portion," "top," and "top surface," as used herein, refer to a direction indicated by an arrow in a third direction D3 intersecting the first and second directions D1 and D2 based on the drawing, and the terms "below," "lower side," "lower portion," "bottom," and "bottom surface," as used herein, refer to a direction opposite to the direction indicated by the arrow in the third direction D3 based on the drawing.

When a stacked structure of the display device 1 is briefly described, in some embodiments, the display device 1 may include a display substrate 10 and a color conversion substrate 30 facing the display substrate 10 and may further include a sealing portion 50 configured to couple the display substrate 10 and the color conversion substrate 30 and a filler 70 which fills a space between the display substrate 10 and the color conversion substrate 30.

The display substrate 10 may include elements and circuits for displaying an image, for example, a pixel circuit such as a switching element, a pixel-defining layer that defines a light-emitting area and a non-light-emitting area, which will be described below, in the display area DA, and a self-light-emitting element. In an embodiment, the self-light-emitting element may include at least one of an organic light-emitting diode, a quantum dot light-emitting diode, an inorganic micro light-emitting diode (for example, "micro LED"), and an inorganic nano light-emitting diode (for example, nano LED). Hereinafter, for convenience of description, an example of the case in which the self-light-emitting element is an organic light-emitting diode ("OLED") will be described.

The color conversion substrate 30 may be disposed on the display substrate 10 and face the display substrate 10. In some embodiments, the color conversion substrate 30 may include a color conversion pattern that converts a color of incident light. In some embodiments, the color conversion pattern may include at least one of a color filter and a wavelength conversion pattern.

The sealing portion 50 may be disposed between the display substrate 10 and the color conversion substrate 30 in the non-display area NDA. The sealing portion 50 may be disposed along edges of the display substrate 10 and the color conversion substrate 30 in the non-display area NDA to surround the display area DA in a plan view. The display substrate 10 and the color conversion substrate 30 may be coupled to each other through the sealing portion 50.

In some embodiments, the sealing portion 50 may be made of or include an organic material. As an example, the sealing portion 50 may be made of or include an epoxy-based resin, but the present invention is not limited thereto.

The filler 70 may be disposed in a space which is surrounded by the sealing portion 50 and between the display substrate 10 and the color conversion substrate 30. The filler 70 may fill the space between the display substrate 10 and the color conversion substrate 30.

In some embodiments, the filler 70 may be made of or include a material that may transmit light. In some embodiments, the filler 70 may be made of or include an organic material. As an example, the filler 70 may be made of or include a Si-based organic material, an epoxy-based organic material, or the like, but the present invention is not limited thereto. In another embodiment, the filler 70 may be omitted.

Figure 4:
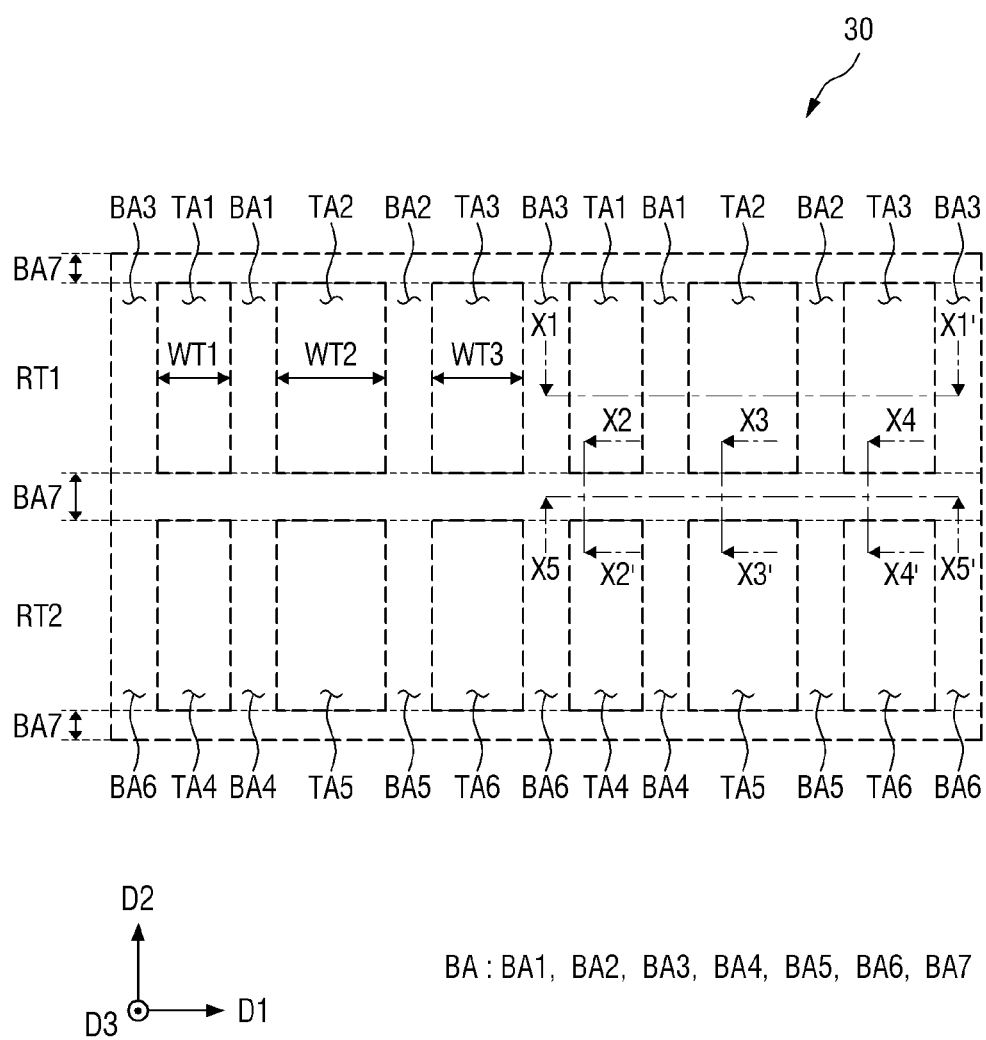
FIG. 4 is a schematic plan view of a color conversion substrate in the display area of the display device shown in FIGS. 1 and 2.

FIG. 3 is a schematic plan view of the display substrate in the display area of the display device shown in FIGS. 1 and 2, and FIG. 4 is a schematic plan view of the color conversion substrate in the display area of the display device shown in FIGS. 1 and 2.

With further reference to FIGS. 3 and 4 in addition to FIGS. 1 and 2, a plurality of light-emitting areas LA1, LA2, LA3, LA4, LA5, and LA6, and a non-light-emitting area NLA may be defined in the display substrate 10 in the display area DA. The light-emitting areas LA1, LA2, LA3, LA4, LA5, and LA6 may be areas in which light generated by a light-emitting element of the display substrate 10 may be emitted to the outside of the display substrate 10, and the non-light-emitting area NLA may be an area in which light may not be emitted to the outside of the display substrate 10.

In some embodiments, the light emitted from the light-emitting areas LA1, LA2, LA3, LA4, LA5, and LA6 to the outside of the display substrate 10 may be light of a first color. In some embodiments, the light of the first color may be blue light and may have a peak wavelength in a range of about 430 nanometers (nm) to 470 nm.

In some embodiments, in the display area DA, a first light-emitting area LA1, a second light-emitting area LA2, and a third light-emitting area LA3 may be sequentially and repeatedly arranged along the first direction D1 in a first row RL1 of the display substrate 10. In addition, a fourth light-emitting area LA4, a fifth light-emitting area LA5, and a sixth light-emitting area LA6 may be sequentially and repeatedly arranged along the first direction D1 in a second row RL2. The second row RL2 is adjacent to the first row RL1 along the second direction D2.

In some embodiments, a first width WL1 of the first light-emitting area LA1, which is measured along the first direction D1, may be less than each of a second width WL2 of the second light-emitting area LA2 and a third width WL3 of the third light-emitting area LA3, which are measured along the first direction D1. In some embodiments, the second width WL2 of the second light-emitting area LA2 and the third width WL3 of the third light-emitting area LA3 may be different from each other. As an example, the second width WL2 of the second light-emitting area LA2 may be greater than the third width WL3 of the third light-emitting area LA3. Further, in some embodiments, an area of the first light-emitting area LA1 may be less than each of an area of the second light-emitting area LA2 and an area of the third light-emitting area LA3 or may be greater than each of the area of the second light-emitting area LA2 and the area of the third light-emitting area LA3.

The fourth light-emitting area LA4 adjacent to the first light-emitting area LA1 along the second direction D2 may be different from the first light-emitting area LA1 only in that the fourth light-emitting area LA4 is disposed in the second row RL2. The width and area of the fourth light-emitting area LA4 and the structure of components disposed therein may be substantially the same as those of the first light-emitting area LA1.

Similarly, the second light-emitting area LA2 and the fifth light-emitting area LA5 adjacent to each other along the second direction D2 may have substantially the same structure, and the third light-emitting area LA3 and the sixth light-emitting area LA6 adjacent to each other along the second direction D2 may have substantially the same structure.

In the display area DA of the color conversion substrate 30, a plurality of light-transmitting areas TA1, TA2, TA3, TA4, TA5, and TA6 and a light-blocking area BA may be defined. The light-transmitting areas TA1, TA2, TA3, TA4, TA5, and TA6 may be areas in which light emitted from the display substrate 10 is transmitted through the color conversion substrate 30 and is provided to the outside of the display device 1. The light-blocking area BA may be an area in which light emitted from the display substrate 10 is not transmitted through the color conversion substrate 30 and is not provided to the outside of the display device 1.

In some embodiments, in the display area DA, a first light-transmitting area TA1, a second light-transmitting area TA2, and a third light-transmitting area TA3 may be sequentially and repeatedly arranged along the first direction D1 in a first row RT1 of the color conversion substrate 30. The first light-transmitting area TA1 may correspond to the first light-emitting area LA1 or overlap the first light-emitting area LA1 in a plan view. Similarly, the second light-transmitting area TA2 may correspond to the second light-emitting area LA2, and the third light-transmitting area TA3 may correspond to the third light-emitting area LA3.

In some embodiments, the light of the first color, which is provided from the display substrate 10, may be provided to the outside of the display device 1 after passing through the first light-transmitting area TA1, the second light-transmitting area TA2, and the third light-transmitting area TA3. When the light emitted from the first light-transmitting area TA1 to the outside of the display device 1 is referred to as a first exit light, the light emitted from the second light-transmitting area TA2 to the outside of the display device 1 is referred to as a second exit light, and the light emitted from the third light-transmitting area TA3 to the outside of the display device 1 is referred to as a third exit light, the first exit light may be the light of the first color, the second exit light may be light of a second color different from the first color, and the third exit light may be light of a third color different from the first color and the second color. In some embodiments, the light of the first color may be blue light having a peak wavelength in a range of 430 nm to 470 nm as described above, and the light of the second color may be red light having a peak wavelength in a range of about 610 nm to 650 nm. Further, the light of the third color may be green light having a peak wavelength in a range of about 510 nm to 550 nm.

A fourth light-transmitting area TA4, a fifth light-transmitting area TA5, and a sixth light-transmitting area TA6 may be sequentially and repeatedly arranged along the first direction D1 in a second row RT2. The second row RT2 is adjacent to the first row RT1 along the second direction D2. The fourth light-transmitting area TA4 may correspond to the fourth light-emitting area LA4, the fifth light-transmitting area TA5 may correspond to the fifth light-emitting area LA5, and the sixth light-transmitting area TA6 may correspond to the sixth light-emitting area LA6.

Similar to the first light-emitting area LA1, the second light-emitting area LA2, and the third light-emitting area LA3, in some embodiments, a first width WT1 of the first light-transmitting area TA1, which is measured along the first direction D1, may be less than each of a second width WT2 of the second light-transmitting area TA2 and a third width WT3 of the third light-transmitting area TA3, which are measured along the first direction D1. In some embodiments, the second width WT2 of the second light-transmitting area TA2 and the third width WT3 of the third light-transmitting area TA3 may be different from each other. As an example, the second width WT2 of the second light-transmitting area TA2 may be greater than the third width WT3 of the third light-transmitting area TA3. Further, in some embodiments, an area of the first light-transmitting area TA1 may be less than each of an area of the second light-transmitting area TA2 and an area of the third light-transmitting area TA3, or may be greater than each of the area of the second light-transmitting area TA2 and the area of the third light-transmitting area TA3.

The first light-transmitting area TA1 and the fourth light-transmitting area TA4, which are adjacent to each other along the second direction D2, may have substantially the same width, area, and structure of components disposed therein and color of light emitted to the outside of the display device 1.

Similarly, the second light-transmitting area TA2 and the fifth light-transmitting area TA5, which are adjacent to each other along the second direction D2, may have substantially the same structure, and the color of light emitted to the outside of the display device 1 from the second light-transmitting area TA2 and the fifth light-transmitting area TA5 may also be substantially the same. Similarly, the third light-transmitting area TA3 and the sixth light-transmitting area TA6, which are adjacent to each other along the second direction D2, may have substantially the same structure, and the color of light emitted to the outside of the display device 1 from the third light-transmitting area TA3 and the sixth light-transmitting area TA6 may also be substantially the same.

In the display area DA, the light-blocking area BA may be disposed around the light-transmitting areas TA1, TA2, TA3, TA4, TA5, and TA6 of the color conversion substrate 30. In some embodiments, when the light-blocking area BA is divided into areas, the light-blocking area BA may include a first light-blocking area BA1, a second light-blocking area BA2, a third light-blocking area BA3, a fourth light-blocking area BA4, a fifth light-blocking area BA5, a sixth light-blocking area BA6, and a seventh light-blocking area BA7.

The first light-blocking area BA1 may be disposed between the first light-transmitting area TA1 and the second light-transmitting area TA2 which are adjacent to each other along the first direction D1, the second light-blocking area BA2 may be disposed between the second light-transmitting area TA2 and the third light-transmitting area TA3 which are adjacent to each other along the first direction D1, and the third light-blocking area BA3 may be disposed between the third light-transmitting area TA3 and the first light-transmitting area TA1 which are adjacent to each other along the first direction D1.

The fourth light-blocking area BA4 may be disposed between the fourth light-transmitting area TA4 and the fifth light-transmitting area TA5 which are adjacent to each other along the first direction D1, the fifth light-blocking area BA5 may be disposed between the fifth light-transmitting area TA5 and the sixth light-transmitting area TA6 which are adjacent to each other along the first direction D1, and the sixth light-blocking area BA6 may be disposed between the sixth light-transmitting area TA6 and the fourth light-transmitting area TA4 which are adjacent to each other along the first direction D1.

The seventh light-blocking area BA7 may be disposed between the first row RT1 and the second row RT2 which are adjacent to each other along the second direction D2.

Hereinafter, the structure of the display device 1 will be described in more detail.

Figure 5:
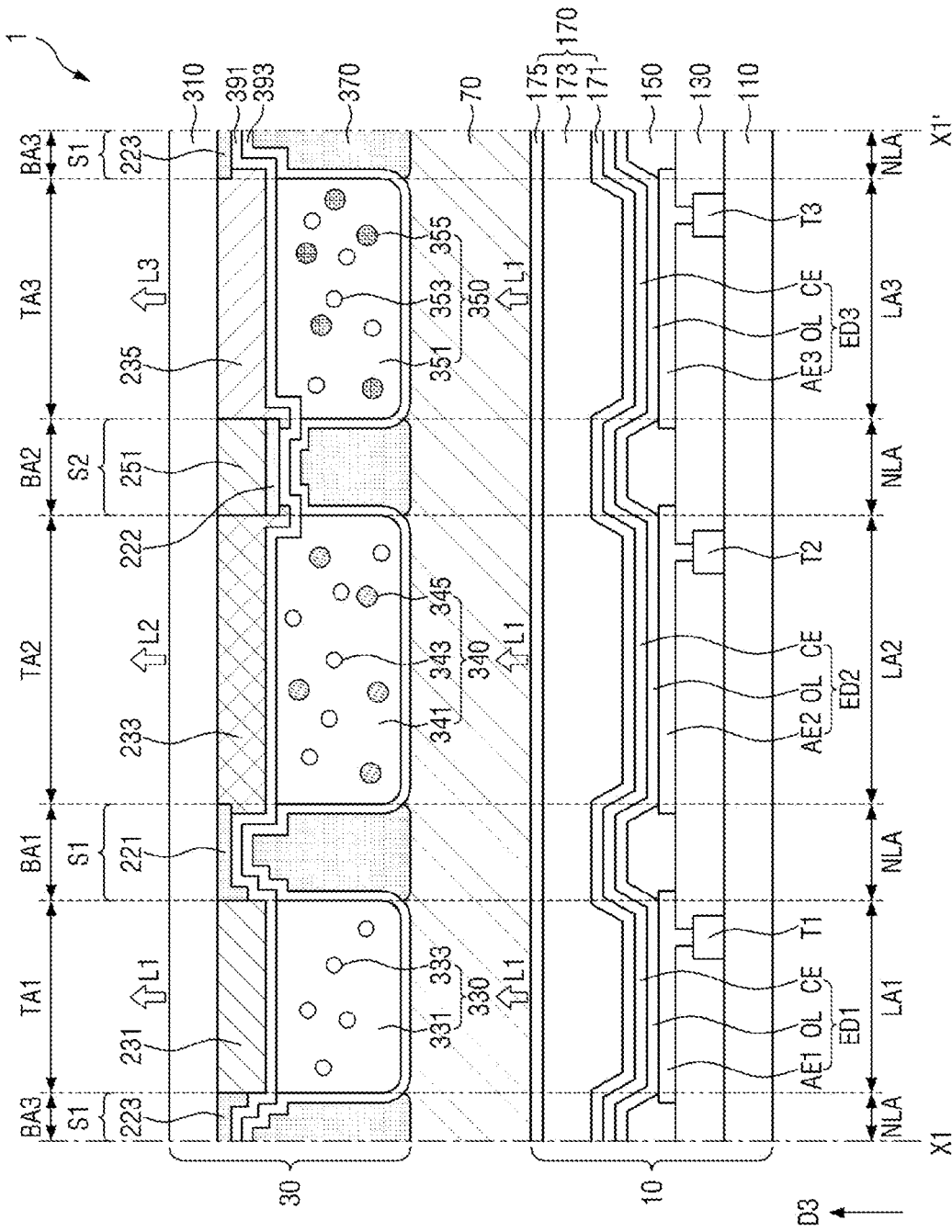
FIG. 5 is a cross-sectional view of the display device according to one embodiment taken along line X1-X1' of FIGS. 3 and 4.
Figure 6:
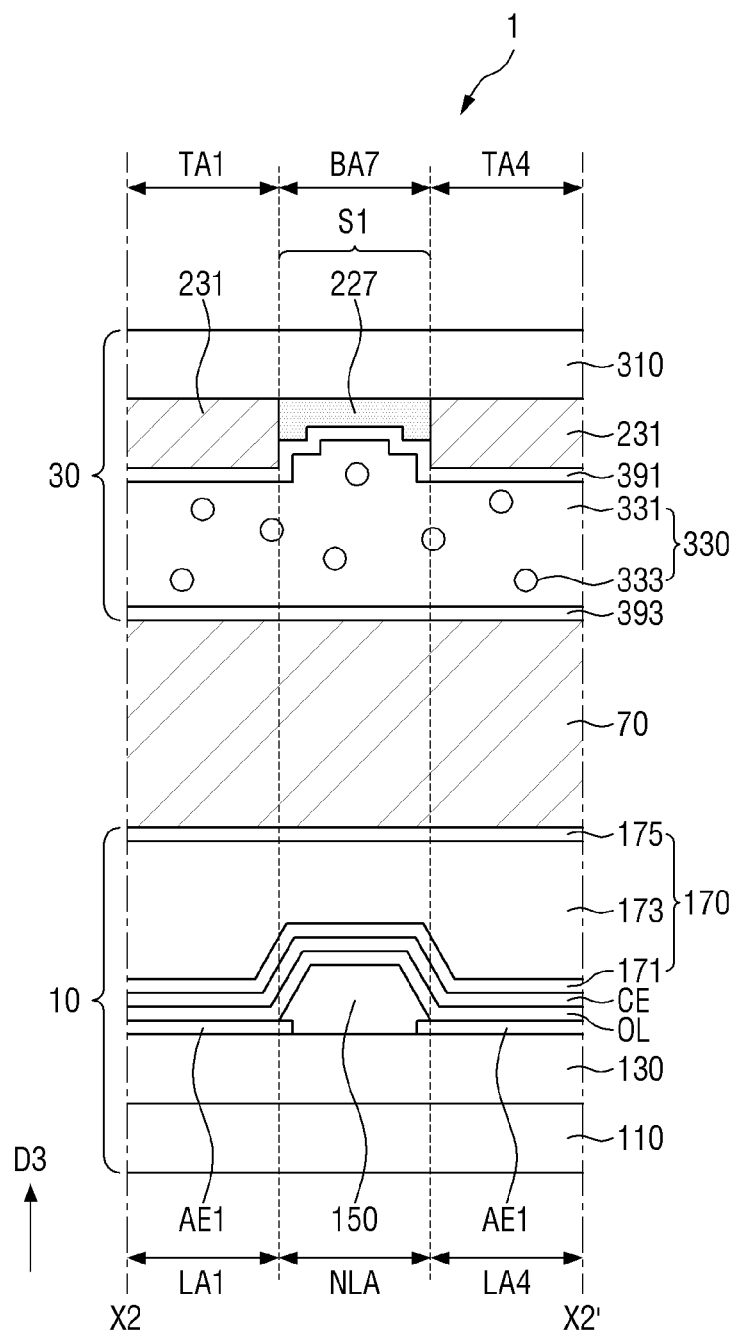
FIG. 6 is a cross-sectional view of the display device according to one embodiment taken along line X2-X2' of FIGS. 3 and 4.
Figure 7:
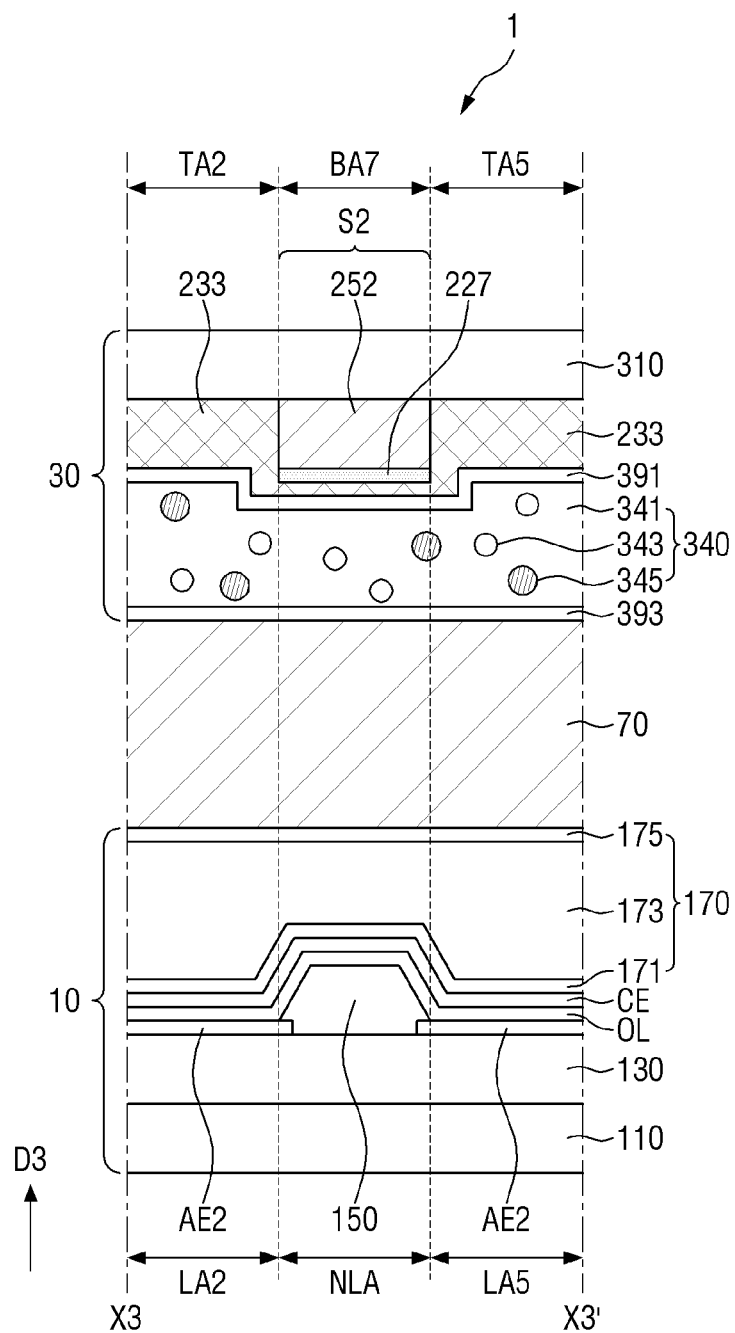
FIG. 7 is a cross-sectional view of the display device according to one embodiment taken along line X3-X3' of FIGS. 3 and 4.
Figure 8:
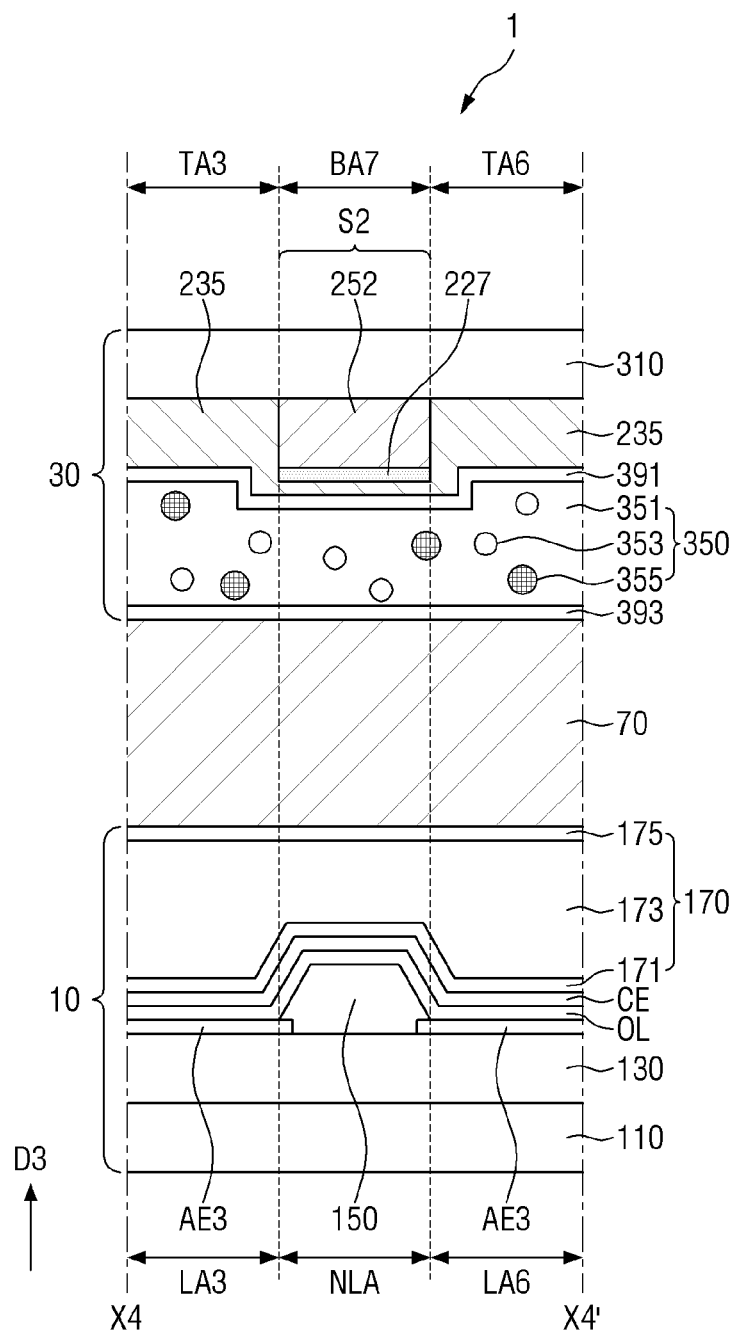
FIG. 8 is a cross-sectional view of the display device according to one embodiment taken along line X4-X4' of FIGS. 3 and 4.
Figure 9:
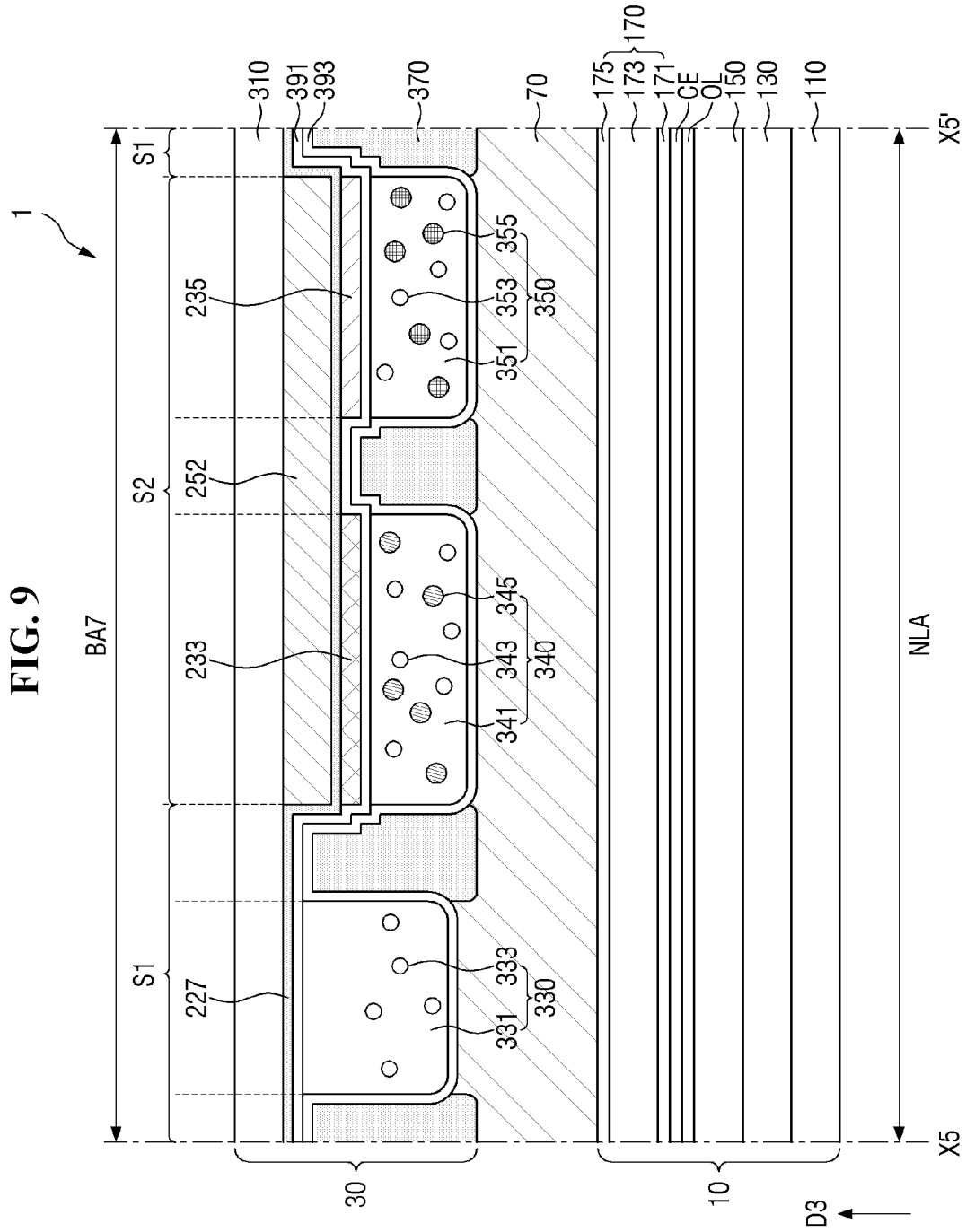
FIG. 9 is a cross-sectional view of the display device according to one embodiment taken along line X5-X5' of FIGS. 3 and 4.

FIG. 5 is a cross-sectional view of the display device according to one embodiment taken along line X1-X1' of FIGS. 3 and 4, FIG. 6 is a cross-sectional view of the display device according to one embodiment taken along line X2-X2' of FIGS. 3 and 4, FIG. 7 is a cross-sectional view of the display device according to one embodiment taken along line X3-X3' of FIGS. 3 and 4, FIG. 8 is a cross-sectional view of the display device according to one embodiment taken along line X4-X4' of FIGS. 3 and 4, and FIG. 9 is a cross-sectional view of the display device according to one embodiment taken along line X5-X5' of FIGS. 3 and 4.

With further reference to FIGS. 5 to 9 in addition to FIGS. 3 and 4, the display device 1 may include the display substrate 10 and the color conversion substrate 30 as described above and may further include the filler 70 disposed between the display substrate 10 and the color conversion substrate 30.

Hereinafter, the display substrate 10 will be described in more detail.

A first base portion 110 may be made of or include a light-transmitting material. In some embodiments, the first base portion 110 may be a glass substrate or a plastic substrate. In a case in which the first base portion 110 is a plastic substrate, the first base portion 110 may have flexibility. In some embodiments, the first base portion 110 may further include a separate layer, such as a buffer layer or an insulating layer, disposed on the glass substrate or plastic substrate.

In some embodiments, as described above, the plurality of light-emitting areas LA1, LA2, LA3, LA4, LA5, and LA6 and the non-light-emitting area NLA may be defined in the first base portion 110.

As shown in FIG. 5, switching elements T1, T2, and T3 may be disposed on the first base portion 110. In some embodiments, a first switching element T1 may be disposed in the first light-emitting area LA1, a second switching element T2 may be disposed in the second light-emitting area LA2, and a third switching element T3 may be disposed in the third light-emitting area LA3. However, the present invention is not limited thereto, and in another embodiment, at least one of the first switching element T1, the second switching element T2, and the third switching element T3 may be disposed in the non-light-emitting area NLA.

Although not shown in the drawings, a plurality of signal lines (e.g., gate lines, data lines, power lines, and the like) through which signals are transmitted to each switching element may be further disposed on the first base portion 110.

An insulating layer 130 may be disposed on the first switching element T1, the second switching element T2, and the third switching element T3. In some embodiments, the insulating layer 130 may be a planarization layer. In some embodiments, the insulating layer 130 may be formed of an organic layer. As an example, the insulating layer 130 may include an acrylic-based resin, an epoxy-based resin, an imide-based resin, an ester-based resin, or the like. In some embodiments, the insulating layer 130 may include a positive photosensitive material or a negative photosensitive material.

As shown in FIGS. 5 to 8, a first anode AE1, a second anode AE2, and a third anode AE3 may be disposed on the insulating layer 130. The first anode AE1 is disposed in the first light-emitting area LA1 and at least a portion thereof may extend to the non-light-emitting area NLA. The second anode AE2 may be disposed in the second light-emitting area LA2 and at least a portion thereof may extend to the non-light-emitting area NLA, and the third anode AE3 may be disposed in the third light-emitting area LA3 and at least a portion thereof may extend to the non-light-emitting area NLA. The first anode AE1 may be connected to the first switching element T1 through the insulating layer 130, the second anode AE2 may be connected to the second switching element T2 through the insulating layer 130, and the third anode AE3 may be connected to the third switching element T3 through the insulating layer 130.

In some embodiments, the widths or areas of the first anode AE1, the second anode AE2, and the third anode AE3 may be different from each other.

The first anode AE1, the second anode AE2, and the third anode AE3 may be reflective electrodes, and in this case, the first anode AE1, the second anode AE2, and the third anode AE3 may each be a metal layer containing metal such as Ag, Mg, Al, Pt, Pd, Au, Ni, Nd, Ir, and Cr. In another embodiment, the first anode AE1, the second anode AE2, and the third anode AE3 may further include a metal oxide layer stacked on the metal layer. In an embodiment, the first anode AE1, the second anode AE2, and the third anode AE3 may each have a double-layer structure of ITO/Ag, Ag/ITO, ITO/Mg, or ITO/MgF, or may have a multi-layer structure such as ITO/Ag/ITO.

A pixel-defining layer 150 may be disposed on the first anode AE1, the second anode AE2, and the third anode AE3.

The pixel-defining layer 150 may define an opening exposing the first anode AE1, an opening exposing the second anode AE2, and an opening exposing the third anode AE3, and may define the first light-emitting area LA1, the second light-emitting area LA2, the third light-emitting area LA3, and the non-light-emitting area NLA. That is, an area of the first anode AE1, which is exposed without being covered by the pixel-defining layer 150, may be the first light-emitting area LA1. Similarly, an area of the second anode AE2, which may be exposed without being covered by the pixel-defining layer 150, may be the second light-emitting area LA2, and an area of the third anode AE3, which may be exposed without being covered by the pixel-defining layer 150, may be the third light-emitting area LA3. In addition, an area in which the pixel-defining layer 150 is disposed may be the non-light-emitting area NLA.

In some embodiments, the pixel-defining layer 150 may include an organic insulating material such as an acrylic-based resin (polyacrylates resin), an epoxy resin, a phenolic resin, a polyamide-based resin, a polyimide-based resin, an unsaturated polyester-based resin, a polyphenylene-based resin (poly phenylenether resin), a polyphenylenesulfide-based resin, or benzocyclobutene ("BCB").

As shown in FIGS. 5 to 9, an organic light-emitting layer OL may be disposed on the first anode AE1, the second anode AE2, and the third anode AE3. In some embodiments, the organic light-emitting layer OL may emit light L1 of a first color, for example, blue light. That is, the organic light-emitting layer OL may include a blue light-emitting layer. In some embodiments, the organic light-emitting layer OL may include two or more blue light-emitting layers and may further include a charge generation layer disposed between the two blue-light-emitting layers.

In some embodiments, the organic light-emitting layer OL may have a shape of a continuous layer formed over the plurality of light-emitting areas LA1, LA2, LA3, LA4, LA5, and LA6 and the non-light-emitting area NLA.

As shown in FIGS. 5 to 9, a cathode CE may be disposed on the organic layer OL.

In some embodiments, the cathode CE may have a semi-transmissive or transmissive property. In a case in which the cathode CE has a semi-transmissive property, the cathode CE may include Ag, Mg, Cu, Al, Pt, Pd, Au, Ni, Nd, Ir, Cr, Li, Ca, LiF/Ca, LiF/Al, Mo, Ti, or a compound or mixture thereof, such as a mixture of Ag and Mg. In addition, in a case in which the cathode CE has a thickness of tens to hundreds of angstroms, the cathode CE may have a semi-transmissive property.

In a case in which the cathode CE has a transmissive property, the cathode CE may include transparent conductive oxide ("TCO"). For example, the cathode CE may include tungsten oxide ($W_xO_y$), titanium oxide ($TiO_2$), indium tin oxide ("ITO"), indium zinc oxide ("IZO"), zinc oxide (ZnO), indium tin zinc oxide ("ITZO"), magnesium oxide (MgO), or the like.

The first anode AE1, the organic light-emitting layer OL, and the cathode CE may constitute a first organic light-emitting element ED1. The second anode AE2, the organic light-emitting layer OL, and the cathode CE may constitute a second organic light-emitting element ED2. The third anode AE3, the organic light-emitting layer OL, and the cathode CE may constitute a third organic light-emitting element ED3. Each of the first organic light-emitting element ED1, the second organic light-emitting element ED2, and the third organic light-emitting element ED3 may emit the light L1 of the first color, for example, blue light, and the light L1 of the first color may be provided to the color conversion substrate 30.

As shown in FIGS. 5 to 9, a thin-film encapsulation layer 170 is disposed on the cathode CE. The thin-film encapsulation layer 170 is commonly disposed in the first light-emitting area LAL the second light-emitting area LA2, the third light-emitting area LA3, and the non-light-emitting area NLA. In some embodiments, the thin-film encapsulation layer 170 directly covers the cathode CE. In some embodiments, a capping layer (not shown) covering the cathode CE may be further disposed between the thin-film encapsulation layer TFE and the cathode CE, and in this case, the thin-film encapsulation layer TFE may directly cover the capping layer.

In some embodiments, the thin-film encapsulation layer 170 may include a first encapsulation inorganic layer 171, an encapsulation organic layer 173, and a second encapsulation inorganic layer 175 that are sequentially stacked on the cathode CE.

In some embodiments, each of the first encapsulation inorganic layer 171 and the second encapsulation inorganic layer 175 may be made of or include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

In some embodiments, the encapsulation organic layer 173 may be made of or include an acrylic-based resin, a methacrylic-based resin, polyisoprene, a vinyl-based resin, an epoxy-based resin, a urethane-based resin, a cellulose-based resin, a perylene-based resin, or the like.

However, the structure of the thin-film encapsulation layer 170 is not limited to the above-described example, and in addition, the stacked structure of the thin-film encapsulation layer 170 may be variously changed.

The color conversion substrate 30 will now be described with further reference to FIGS. 10 to 15 in addition to FIGS. 5 to 9.

Figure 10:
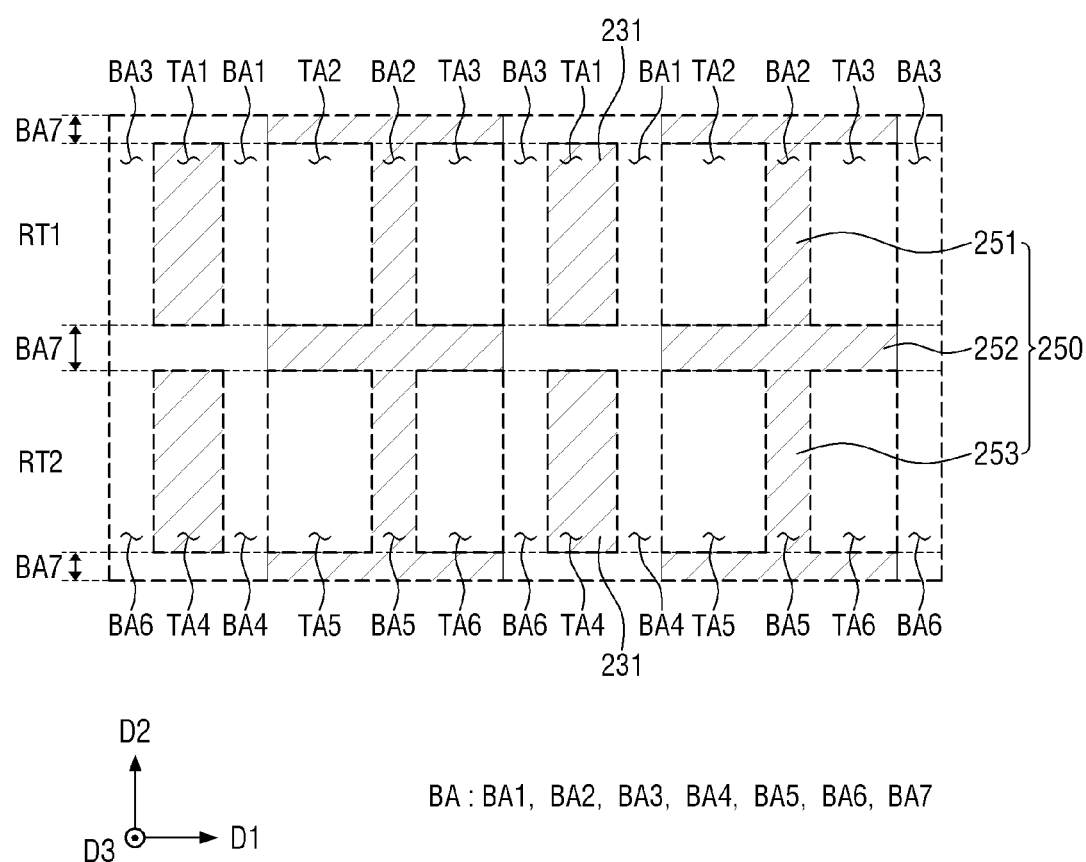
FIG. 10 is a schematic plan view illustrating an arrangement of a first color filter and a color pattern in the color conversion substrate of the display device according to one embodiment.
Figure 11:
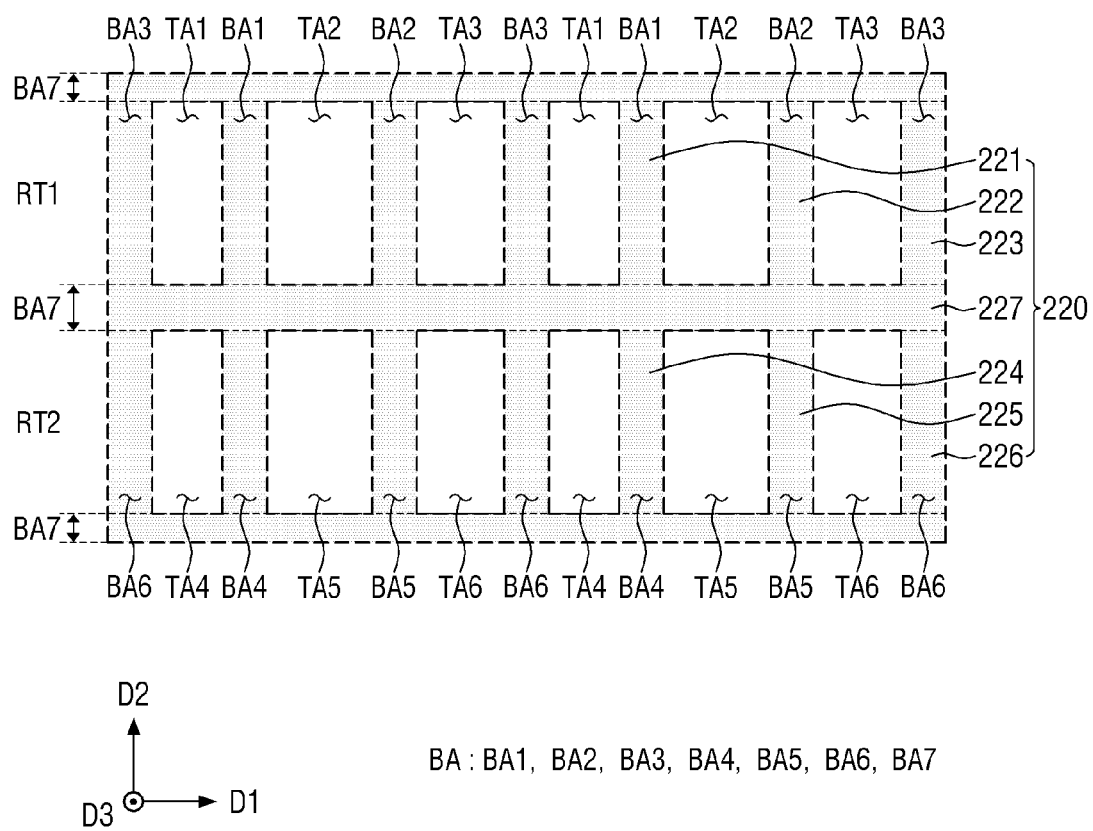
FIG. 11 is a schematic plan view illustrating an arrangement of a light-blocking member in the color conversion substrate of the display device according to one embodiment.
Figure 12:
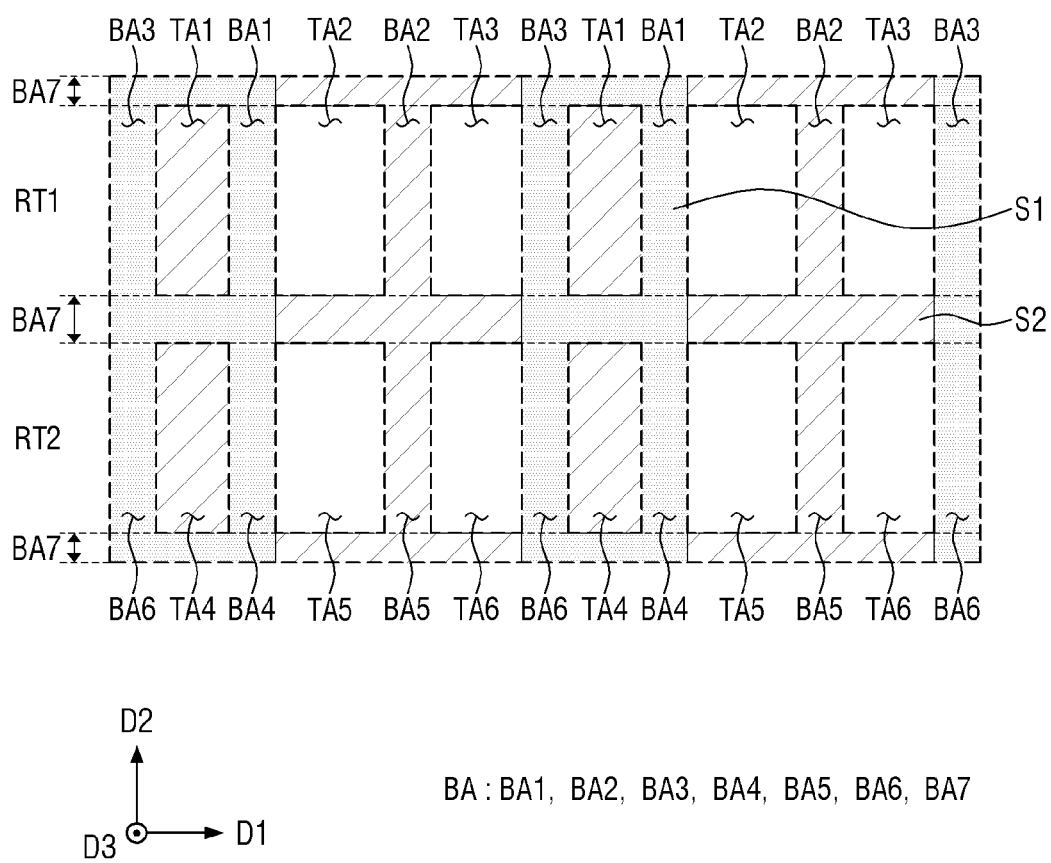
FIG. 12 is a schematic plan view illustrating an arrangement of a first contact area and a second contact area in the color conversion substrate of the display device according to one embodiment.
Figure 13:
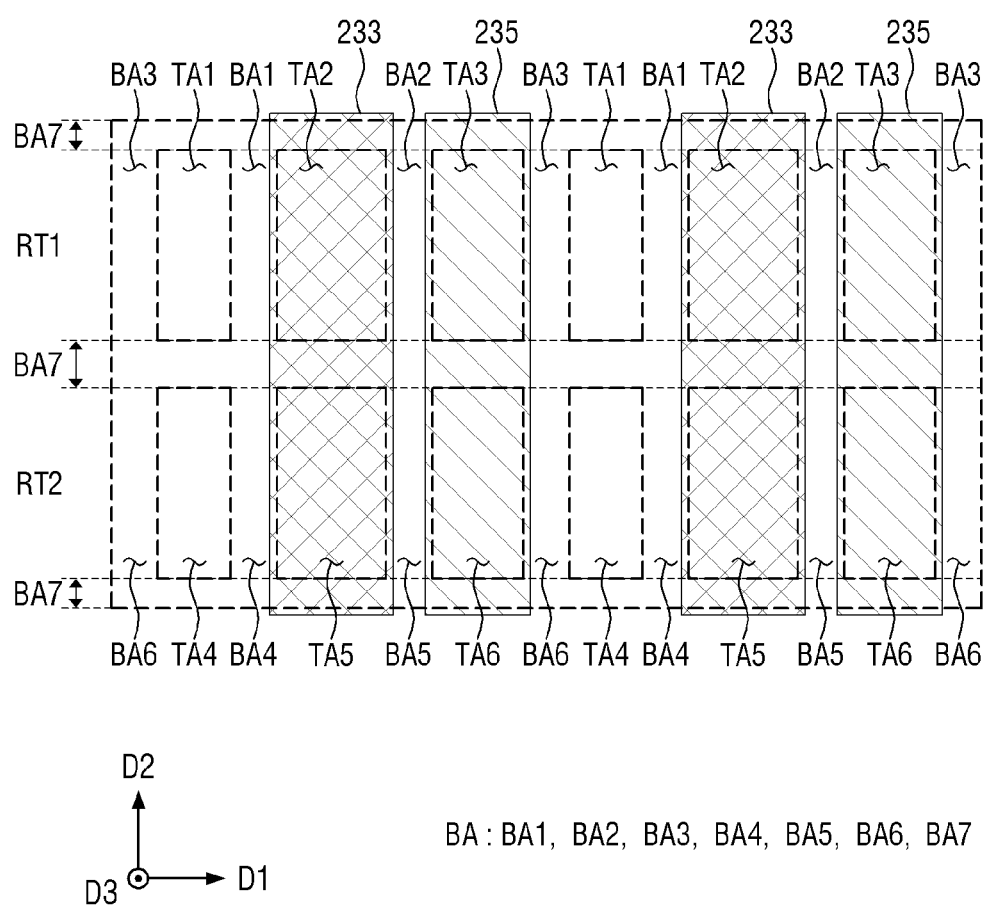
FIG. 13 is a schematic plan view illustrating an arrangement of a second color filter and a third color filter in the color conversion substrate of the display device according to one embodiment.
Figure 14:
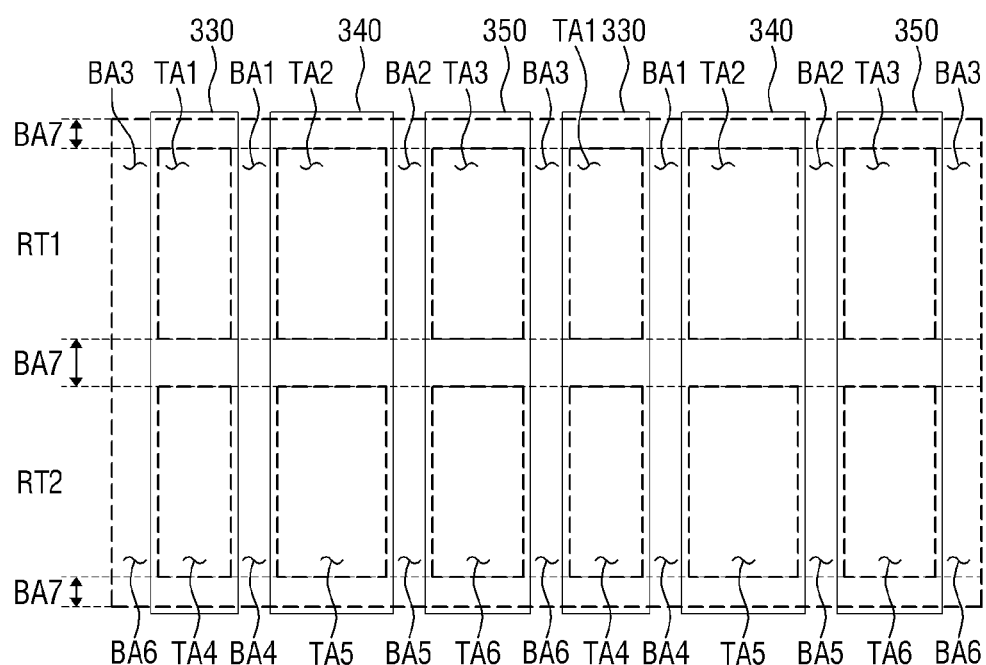
FIG. 14 is a schematic plan view illustrating an arrangement of a first wavelength conversion pattern, a second wavelength conversion pattern, and a light-transmitting pattern in the color conversion substrate of the display device according to one embodiment.

FIG. 10 is a schematic plan view illustrating an arrangement of a first color filter and a color pattern in the color conversion substrate of the display device according to one embodiment, FIG. 11 is a schematic plan view illustrating an arrangement of a light-blocking member in the color conversion substrate of the display device according to one embodiment, FIG. 12 is a schematic plan view illustrating an arrangement of a first contact area and a second contact area in the color conversion substrate of the display device according to one embodiment, FIG. 13 is a schematic plan view illustrating an arrangement of a second color filter and a third color filter in the color conversion substrate of the display device according to one embodiment, and FIG. 14 is a schematic plan view illustrating an arrangement of a first wavelength conversion pattern, a second wavelength conversion pattern, and a light-transmitting pattern in the color conversion substrate of the display device according to one embodiment.

Referring to FIGS. 3 to 15, a second base portion 310 shown in FIGS. 5 to 9 may be made of or include a light-transmitting material. In some embodiments, the second base portion 310 may include a glass substrate or a plastic substrate. In some embodiments, the second base portion 310 may further include a separate layer, for example, an insulating layer such as an inorganic layer, disposed on the glass substrate or plastic substrate.

In some embodiments, as described above, the plurality of light-transmitting areas TA1, TA2, TA3, TA4, TA5, and TA6 and the light-blocking area BA may be defined in the second base portion 310 as shown in FIG. 4.

As shown in FIGS. 5 to 10, a first color filter 231 and a color pattern 250 may be disposed on one surface of the second base portion 310 facing the display substrate 10.

The first color filter 231 may be disposed on one surface of the second base portion 310 and may be disposed in the first light-transmitting area TA1 and the fourth light-transmitting area TA4. In some embodiments, the first color filter 231 disposed in the first light-transmitting area TA1 and the first color filter 231 disposed in the fourth light-transmitting area TA4 may be spaced apart from each other along the second direction D2.

The first color filter 231 may selectively transmit the light of the first color (e.g., blue light) and may block or absorb the light of the second color (e.g., red light) and the light of the third color (e.g., green light). In some embodiments, the first color filter 231 may be a blue color filter and may include a blue colorant such as a blue dye or a blue pigment.

The color pattern 250 may absorb a portion of the light entering the color conversion substrate 30 from the outside of the display device 1, thereby reducing reflected light due to external light. A significant portion of the external light is reflected, causing a problem of distorting color gamut of the color conversion substrate 30. However, in a case in which the color pattern 250 is disposed on the second base portion 310 according to the present embodiment, color distortion due to external light reflection may be effectively reduced.

In some embodiments, the color pattern 250 may include a blue colorant such as a blue dye or a blue pigment. In some embodiments, the color pattern 250 may be made of or include the same material as the first color filter 231 and may be formed simultaneously with the first color filter 231 during the formation of the first color filter 231. In a case in which the color pattern 250 includes a blue colorant, external light or reflected light transmitted through the color pattern 250 has a blue wavelength band. Sensitivity for each color perceived by user's eyes (user's eye color sensitivity) typically varies according to the color of light. More specifically, light of the blue wavelength band may be perceived less sensitively by a user than each of light of a green wavelength band and light of a red wavelength band. Thus, since the color pattern 250 includes a blue colorant, the user may perceive reflected light relatively less sensitively.

The color pattern 250 may be disposed on one surface of the second base portion 310 and may be disposed in the light-blocking area BA. In some embodiments, the color pattern 250 may be in direct contact with one surface of the second base portion 310.

In some embodiments, the color pattern 250 may be disposed in the second light-blocking area BA2, the fifth light-blocking area BA5, and the seventh light-blocking area BA7 of the light-blocking area BA and may not be disposed in the first light-blocking area BA1, the third light-blocking area BA3, the fourth light-blocking area BA4, and the sixth light-blocking area BA6 of the light-blocking area BA. Further, in some embodiments, the color pattern 250 may not be disposed between the first light-blocking area BA1 and the fourth light-blocking area BA4 and between the third light-blocking area BA3 and the sixth light-blocking area BA6 in the seventh light-blocking area BA7.

In some embodiments, the color pattern 250 may include a first color pattern 251 disposed in the second light-blocking area BA2, a second color pattern 252 disposed in a partial area of the seventh light-blocking area BA7, and a third color pattern 253 disposed in the fifth light-blocking area BA5. In some embodiments, the first color pattern 251 and the third color pattern 253 may be connected to the second color pattern 252.

As shown in FIGS. 5 to 9 and 11, a light-blocking member 220 may be disposed on one surface of the second base portion 310 facing the display substrate 10. The light-blocking member 220 may be disposed in the light-blocking area BA to block the transmission of light. In some embodiments, the light-blocking member 220 may be disposed in a substantially grid shape in a plan view as shown in FIG. 11.

In some embodiments, the light-blocking member 220 may include an organic light-blocking material and may be formed through a coating and exposure process for an organic light-blocking material.

As described above, the external light has a problem of distorting color gamut of a color conversion panel. However, in a case in which the light-blocking member 220 is disposed on the second base portion 310 according to the present embodiment, at least a portion of the external light may be absorbed so that color distortion due to external light reflection may be effectively reduced. In some embodiments, the light-blocking member 220 may prevent light from penetrating between adjacent light-transmitting areas, which may cause color mixing, thereby further improving the color gamut.

In some embodiments, the light-blocking member 220 may include a first light-blocking member 221 disposed in the first light-blocking area BA1, a second light-blocking member 222 disposed in the second light-blocking area BA2, a third light-blocking member 223 disposed in the third light-blocking area BA3, a fourth light-blocking member 224 disposed in the fourth light-blocking area BA4, a fifth light-blocking member 225 disposed in the fifth light-blocking area BA5, a sixth light-blocking member 226 disposed in the sixth light-blocking area BA6, and a seventh light-blocking member 227 disposed in the seventh light-blocking area BA7. In some embodiments, the first light-blocking member 221, the second light-blocking member 222, and the third light-blocking member 223 may be connected to the seventh light-blocking member 227, and the fourth light-blocking member 224, the fifth light-blocking member 225, and the sixth light-blocking member 226 may also be connected to the seventh light-blocking member 227.

A portion of the light-blocking member 220 may be in direct contact with one surface of the second base portion 310, and another portion of the light-blocking member 220, e.g., a portion thereof overlapping the color pattern 250 in a plan view, may be disposed on the color pattern 250. In some embodiments, a portion of the seventh light-blocking member 227 of the light-blocking member 220 which does not overlap the color pattern 250 in a plan view, the first light-blocking member 221, the third light-blocking member 223, the fourth light-blocking member 224, and the sixth light-blocking member 226 may be in direct contact with the second base portion 310. A portion of the seventh light-blocking member 227 which overlaps the second color pattern 252, the second light-blocking member 222 overlapping the first color pattern 251, and the fifth light-blocking member 225 overlapping the third color pattern 253 in a plan view may not be in direct contact with the second base portion 310.

When a portion in which one surface of the second base portion 310 is in direct contact with the light-blocking member 220 is referred to as a first contact area, and a portion in which one surface of the second base portion 310 is in direct contact with the color pattern 250 is referred to as a second contact area, as shown in FIG. 12, a first contact area S1 may be disposed on the first light-blocking area BA1, the third light-blocking area BA3, the fourth light-blocking area BA4, and the sixth light-blocking area BA6, and the first contact area S1 may also be disposed on a portion of the seventh light-blocking area BA7 i) between the first light-blocking area BA1 and the fourth light-blocking area BA4, ii) between the first light-transmitting area TA1 and the fourth light-transmitting area TA4, and iii) between the third light-blocking area BA3 and the sixth light-blocking area BA6. Accordingly, the first contact area S1 may completely surround the first light-transmitting area TA1 and the fourth light-transmitting area TA4. A second contact area S2 may be disposed in an area other than the first contact area S1 of the light-blocking area BA. That is, the second contact area S2 shown in FIG. 12 may be substantially the same as the area in which the color pattern 250 shown in FIG. 10 is disposed, and the first contact area S1 shown in FIG. 12 may be substantially the same as the area in which the light-blocking member 220 shown in FIG. 11 is disposed, except for the area in which the color pattern 250 shown in FIG. 12 is disposed.

As shown in FIGS. 5 to 9 and 13, a second color filter 233 and a third color filter 235 may be disposed on one surface of the second base portion 310 facing the display substrate 10.

The second color filter 233 may be disposed in the second light-transmitting area TA2 and the fifth light-transmitting area TA5, and the third color filter 235 may be disposed in the third light-transmitting area TA3 and the sixth light-transmitting area TA6.

As shown in FIG. 5, in some embodiments, one side of the second color filter 233 may be disposed in the first light-blocking area BA1 and may be disposed on the first light-blocking member 221, and the other side of the second color filter 233 may be disposed in the second light-blocking area BA2 and may be disposed on the first color pattern 251 and the second light-blocking member 222.

As shown in FIG. 5, in some embodiments, one side of the third color filter 235 may be disposed in the second light-blocking area BA2 and may be disposed on the first color pattern 251 and the second light-blocking member 222. In addition, in some embodiments, the other side of the third color filter 235 may be disposed in the third light-blocking area BA3 and may be disposed on the third light-blocking member 223.

As shown in FIG. 13, in some embodiments, the second color filter 233 and the third color filter 235 may be formed in a stripe shape extending along the second direction D2 and may cross the seventh light-blocking area BA7 between the first row RT1 and the second row RT2. Accordingly, in the seventh light-blocking area BA7, the second color filter 233 and the third color filter 235 may be disposed on the seventh light-blocking member 227. The second color filter 233 and the third color filter 235 may cover the second color pattern 252 and the seventh light-blocking member 227, respectively, in the seventh light-blocking area BA7.

In some embodiments, the second color filter 233 may block or absorb the light of the first color (e.g., blue light). That is, the second color filter 233 may function as a blue light-blocking filter that blocks blue light. In some embodiments, the second color filter 233 may transmit only the light of the second color (e.g., red light) and block or absorb the light of the first color (e.g., blue light) and the light of the third color (e.g., green light). As an example, the second color filter 233 may be a red color filter and may include a red colorant.

The third color filter 235 may block or absorb the light of the first color (e.g., blue light). That is, the third color filter 235 may also function as a blue light-blocking filter. In some embodiments, the third color filter 235 may transmit only the light of the third color (e.g., green light) and block or absorb the light of the first color (e.g., blue light) and the light of the second color (e.g., red light). As an example, the third color filter 235 may be a green color filter and may include a green colorant.

As shown in FIGS. 5 to 9, a first capping layer 391 covering the light-blocking member 220, the color pattern 250, the first color filter 231, the second color filter 233, and the third color filter 235 may be disposed on one surface of the second base portion 310. In some embodiments, the first capping layer 391 may be in direct contact with the first color filter 231, the second color filter 233, and the third color filter 235.

The first capping layer 391 may be further in direct contact with the light-blocking member 220. As an example, as shown in FIG. 5, the first light-blocking member 221 may be in direct contact with the first capping layer 391 in the first light-blocking area BA1. Further, the second light-blocking member 222 may be in direct contact with the first capping layer 391 in the second light-blocking area BA2, and the third light-blocking member 223 may be in direct contact with the first capping layer 391 in the third light-blocking area BA3. In addition, as shown in FIG. 6, the seventh light-blocking member 227 may also be in direct contact with the first capping layer 391 in the seventh light-blocking area.

The first capping layer 391 may prevent impurities such as moisture or air from being introduced from the outside and damaging or contaminating the light-blocking member 220, the color pattern 250, the first color filter 231, the second color filter 233, and the third color filter 235. In addition, the first capping layer 391 may prevent the colorants included in the first color filter 231, the second color filter 233, and the third color filter 235 from being diffused to other elements, e.g., a first wavelength conversion pattern 340, a second wavelength conversion pattern 350, and the like. In some embodiments, the first capping layer 391 may be made of or include an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

As shown in FIGS. 5 to 9 and 14, a light-transmitting pattern 330, the first wavelength conversion pattern 340, and the second wavelength conversion pattern 350 may be disposed on the first capping layer 391.

The light-transmitting pattern 330 may be disposed on the first capping layer 391 and may be disposed in the first light-transmitting area TA1 and the fourth light-transmitting area TA4. In some embodiments, the light-transmitting pattern 330 may have a stripe shape extending along the second direction D2 as shown in FIG. 14 and may cross the seventh light-blocking area BA7 between the first row RT1 and the second row RT2.

The light-transmitting pattern 330 may transmit incident light. The light L1 of the first color, which is blue light provided from the first organic light-emitting element ED1, is emitted to the outside of the display device 1 after passing through the light-transmitting pattern 330 and the first color filter 231. That is, the first exit light emitted from the first light-transmitting area TA1 may be the light L1 of the first color, which is blue light, emitted from the first organic light-emitting element ED1.

In some embodiments, the light-transmitting pattern 330 may further include a first base resin 331 and a first scatterer 333 dispersed in the first base resin 331.

The first base resin 331 may be made of or include a material having high light transmittance. In some embodiments, the first base resin 331 may be made of or include an organic material. For example, the first base resin 331 may include an organic material such as an epoxy-based resin, an acrylic-based resin, a cardo-based resin, or an imide-based resin.

The first scatterer 333 may have a refractive index different from that of the first base resin 331 and may form an optical interface with the first base resin 331. For example, the first scatterer 333 may be light scattering particles. The first scatterer 333 is not particularly limited as long as it is a material capable of scattering at least a portion of the transmitted light. For example, the first scatterer 333 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like. The first scatterer 333 may scatter incident light in random directions regardless of the incident direction of the light without substantially changing the wavelength of the light transmitted through the light-transmitting pattern 330.

The light L1 of the first color, which is blue light, provided from the first organic light-emitting element ED1, is emitted to the outside of the display device 1 after passing through the light-transmitting pattern 330 and the first color filter 231. That is, the first exit light emitted from the first light-transmitting area TA1 may be the light L1 of the first color, which is blue light, emitted from the first organic light-emitting element ED1.

The first wavelength conversion pattern 340 may be disposed on the first capping layer 391 and may be disposed in the second light-transmitting area TA2 and the fifth light-transmitting area TA5. In some embodiments, the first wavelength conversion pattern 340 may have a stripe shape extending along the second direction D2 as shown in FIG. 14 and may cross the seventh light-blocking area BA7 between the first row RT1 and the second row RT2.

The first wavelength conversion pattern 340 may convert or shift a peak wavelength of incident light into another specific peak wavelength and emit light having the converted or shifted specific peak wavelength. In some embodiments, the first wavelength conversion pattern 340 may convert the light L1 of the first color, which is blue light, provided from the second organic light-emitting element ED2, into red light in a range of about 610 nm to 650 nm and emit the red light.

In some embodiments, the first wavelength conversion pattern 340 may include a second base resin 341 and a first wavelength shifter 345 dispersed in the second base resin 341 and may further include a second scatterer 343 dispersed in the second base resin 341.

The second base resin 341 may be made of or include a material having high light transmittance. In some embodiments, the second base resin 341 may be made of or include an organic material. In some embodiments, the second base resin 341 may be made of or include the same material as the first base resin 331 or may include at least one of the materials exemplified as the constituent material of the first base resin 331.

The first wavelength shifter 345 may convert or shift a peak wavelength of incident light to another specific peak wavelength. In some embodiments, the first wavelength shifter 345 may convert the light L1 of the first color, which is blue light provided from the second organic light-emitting element ED2, into red light having a single peak wavelength in a range of about 610 nm to 650 nm and emit the red light. Examples of the first wavelength shifter 345 include quantum dots, quantum rods, or phosphors. For example, the quantum dots may be particulate materials that emit light of a specific color while electrons transition from a conduction band to a valence band.

The quantum dots may be semiconductor nanocrystalline materials. The quantum dots may have a specific band gap according to their composition and size, and thus, may absorb light and then emit light having an inherent wavelength. Examples of semiconductor nanocrystals of the quantum dots may include group IV nanocrystals, group II-VI compound nanocrystals, group III-V compound nanocrystals, group IV-VI nanocrystals, and a combination thereof.

Light emitted from the first wavelength shifter 345 may have a full width of half maximum ("FWHM") of an emission wavelength spectrum of about 45 nm or less, about 40 nm or less, or about 30 nm or less. Thus, the color purity and color gamut of colors displayed by the display device 1 may be further improved. In addition, the light emitted from the first wavelength shifter 345 may be emitted in various directions regardless of the incident direction of incident light. Accordingly, the lateral visibility of the second color displayed in the second light-transmitting area TA2 may be improved.

A portion of the light L1 of the first color, which is provided from the second organic light-emitting element ED2, may be emitted to the outside after passing through the first wavelength conversion pattern 340 without being converted into red light by the first wavelength shifter 345. Of the light L1 of the first color, a component incident on the second color filter 233 without being converted by the first wavelength conversion pattern 340 may be blocked by the second color filter 233. On the other hand, red light into which a portion of the light L1 of the first color has been converted by the first wavelength conversion pattern 340 may be emitted to the outside after passing through the second color filter 233. Accordingly, the light emitted to the outside of the display device 1 in the second light-transmitting area TA2 may be light L2 of the second color, which is red light.

The second scatterer 343 may have a refractive index different from that of the second base resin 341 and may form an optical interface with the second base resin 341. For example, the second scatterer 343 may be light scattering particles. Other details of the second scatterer 343 are substantially the same as or similar to those of the first scatterer 333, and thus a detailed description thereof will be omitted.

The second wavelength conversion pattern 350 may be disposed on the first capping layer 391 and may be disposed in the third light-transmitting area TA3 and the sixth light-transmitting area TA6. In some embodiments, the second wavelength conversion pattern 350 may have a stripe shape extending along the second direction D2 as shown in FIG. 14 and may cross the seventh light-blocking area BA7 between the first row RT1 and the second row RT2.

The second wavelength conversion pattern 350 may convert or shift a peak wavelength of incident light into another specific peak wavelength and emit light having the converted or shifted specific peak wavelength. In some embodiments, the second wavelength conversion pattern 350 may convert the light L1 of the first color, which is blue light provided from the third organic light-emitting element ED3, into green light in a range of about 510 nm to 550 nm and emit the green light.

In some embodiments, the second wavelength conversion pattern 350 may include a third base resin 351 and a second wavelength shifter 355 dispersed in the third base resin 351 and may further include a third scatterer 353 dispersed in the third base resin 351.

The third base resin 351 may be made of or include a material having high light transmittance. In some embodiments, the third base resin 351 may be made of or include an organic material. In some embodiments, the third base resin 351 may be made of or include the same material as the first base resin 331 or may include at least one of the materials exemplified as the constituent material of the first base resin 331.

The second wavelength shifter 355 may convert or shift a peak wavelength of incident light to another specific peak wavelength. In some embodiments, the second wavelength shifter 355 may convert blue light having a peak wavelength in a range of about 430 nm to 470 nm into green light having a peak wavelength in a range of about 510 nm to 550 nm.

Examples of the second wavelength shifter 355 include quantum dots, quantum rods, or phosphors. A more detailed description of the second wavelength shifter 355 is substantially the same as or similar to that described above in the description of the first wavelength shifter 345 and thus will be omitted.

In some embodiments, both the first wavelength shifter 345 and the second wavelength shifter 355 may include quantum dots. In this case, the diameter of the quantum dots constituting the first wavelength shifter 345 may be greater than the diameter of the quantum dots constituting the second wavelength shifter 355.

The third scatterer 353 may have a refractive index different from that of the third base resin 351 and may form an optical interface with the third base resin 351. For example, the third scatterer 353 may be light scattering particles. Other details of the third scatterer 353 are substantially the same as or similar to those of the second scatterer 343, and thus a detailed description thereof will be omitted.

The light L1 of the first color emitted from the third organic light-emitting element ED3 may be provided in the second wavelength conversion pattern 350, and the second wavelength shifter 355 may convert the light L1 of the first color provided from the third organic light-emitting element ED3 into green light having a peak wavelength in a range of about 510 nm to 550 nm and emit the green light.

A portion of the light L1 of the first color, which is blue light, may be emitted after passing through the second wavelength conversion pattern 350 without being converted into green light by the second wavelength shifter 355 and may be blocked by the third color filter 235. On the other hand, green light into which a portion of the light L1 of the first color has been converted by the second wavelength conversion pattern 350 may be emitted to the outside after passing through the third color filter 235. Accordingly, the light emitted to the outside of the display device 1 in the third light-transmitting area TA3 may be light L3 of the third color, which is green light.

As shown in FIGS. 5 to 9, a second capping layer 393 may be disposed on the light-transmitting pattern 330, the first wavelength conversion pattern 340, and the second wavelength conversion pattern 350. The second capping layer 393 may cover the light-transmitting pattern 330, the first wavelength conversion pattern 340, and the second wavelength conversion pattern 350. The second capping layer 393 may be in direct contact with the first capping layer 391 and may seal the light-transmitting pattern 330, the first wavelength conversion pattern 340, and the second wavelength conversion pattern 350. Accordingly, impurities such as moisture or air may be prevented from being introduced from the outside and damaging or contaminating the light-transmitting pattern 330, the first wavelength conversion pattern 340, and the second wavelength conversion pattern 350. In some embodiments, the second capping layer 393 may be made of or include an inorganic material. In some embodiments, the second capping layer 393 may be made of or include the same material as the first capping layer 391 or may include at least one of the materials mentioned in the description of the first capping layer 391. When the first capping layer 391 and the second capping layer 393 are all made of or include an inorganic material, an inorganic-inorganic bond may be formed at a portion in which the first capping layer 391 is in direct contact with the second capping layer 393, thereby effectively preventing the moisture or air from being introduced from the outside.

As shown in FIGS. 5 to 9, a color mixing preventing member 370 may be disposed on the second capping layer 393. The color mixing preventing member 370 may be disposed in the light-blocking area BA to block the transmission of light. More specifically, the color mixing preventing member 370 may be disposed between the light-transmitting pattern 330 and the first wavelength conversion pattern 340 and between the first wavelength conversion pattern 340 and the second wavelength conversion pattern 350, to prevent color mixing between adjacent light-transmitting areas. In some embodiments, the color mixing preventing member 370 may be formed in a stripe shape extending along the second direction D2.

In some embodiments, the color mixing preventing member 370 may include an organic light-blocking material and may be formed through a coating and exposure process for an organic light-blocking material.

As described above, the filler 70 may be disposed in the space between the color conversion substrate 30 and the display substrate 10. In some embodiments, as shown in FIGS. 5 to 9, the filler 70 may be disposed between the second capping layer 393 and the thin-film encapsulation layer 170, and between the color mixing preventing member 370 and the thin-film encapsulation layer 170. In some embodiments, the filler 70 may be in direct contact with the second capping layer 393 and the color mixing preventing member 370.

Figure 15:
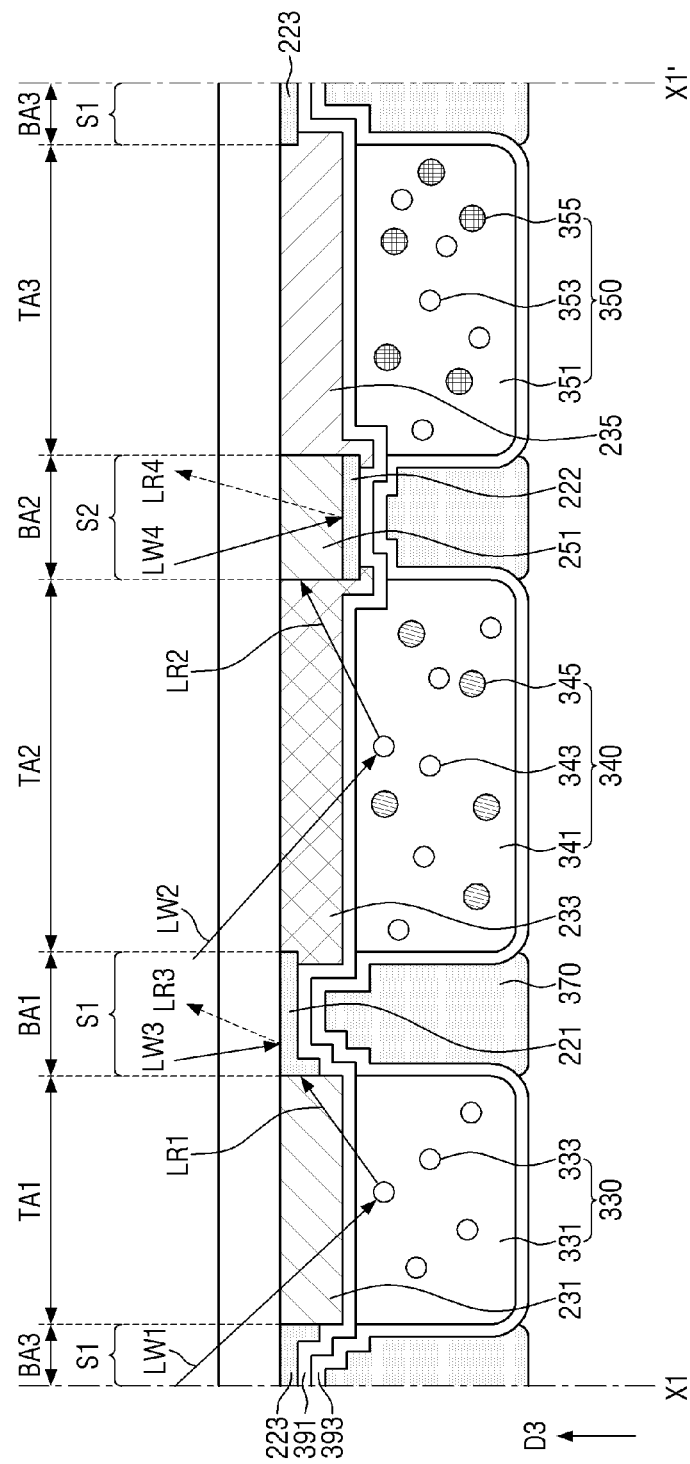
FIG. 15 is a view illustrating external light and reflected light that is generated due to the external light incident on the color conversion substrate shown in FIG. 5.

FIG. 15 is a view illustrating external light and reflected light that is generated due to the external light incident on the color conversion substrate shown in FIG. 5.

Referring to FIG. 15, of external light LW1 incident on the first light-transmitting area TA1, a red wavelength component and a green wavelength component are blocked by the first color filter 231. However, a blue wavelength component of the external light LW1 may be transmitted through the first color filter 231 and reflected by the light-transmitting pattern 330: the first scatterer 333. Reflected light LR1 in the first light-transmitting area TA1 is a blue light having a blue wavelength component and thus may be transmitted through the first color filter 231. However, the first light-blocking member 221 disposed in the first light-blocking area BA1 may block a light incident to the first light-blocking member 221 regardless of the wavelength thereof, and thus the reflected light LR1, which is blue light, may be blocked by the first light-blocking member 221. Accordingly, color distortion caused by the reflection of the external light LW1 may be effectively reduced.

Of external light LW2 incident on the second light-transmitting area TA2, a green wavelength component and a blue wavelength component are blocked by the second color filter 233. However, a red wavelength component of the external light LW2 may be transmitted through the second color filter 233 and reflected by the first wavelength conversion pattern 340: the second scatterer 343, or the first wavelength shifter 345. Reflected light LR2 in the second light-transmitting area TA2 is red light having a red wavelength component and thus may be transmitted through the second color filter 233. However, the first color pattern 251 disposed in the second light-blocking area BA2 may transmit blue light but block red light and green light, and thus the reflected light LR2, which is red light, may be blocked by the first color pattern 251. Accordingly, color distortion caused by the reflection of the external light LW2 may be effectively reduced.

Similarly, of external light incident on the third light-transmitting area TA3, reflected light reflected by the second wavelength conversion pattern 350 may be green light, but the green light that is reflected light may be blocked by the third light-blocking member 223 disposed in the third light-blocking area BA3 and the first color pattern 251 disposed in the second light-blocking area BA2.

External light LW3 incident on the first light-blocking area BA1 may be absorbed by the first light-blocking member 221. However, a portion of the external light LW3 may be reflected by the first light-blocking member 221, and the reflected light LR3 in the first light-blocking area BA1 may include all of a red wavelength component, a green wavelength component, and a blue wavelength component. When the reflected light LR3 is red light or green light, the sensitivity perceived by a user's eye is higher than a case in which the reflected light LR3 is blue light. Thus, there is a possibility that the reflected light LR3 is sensitively perceived by the user.

On the other hand, of external light LW4 incident on the second light-blocking area BA2, a red wavelength component and a green wavelength component are blocked by the first color pattern 251. A blue wavelength component of the external light LW4 may be transmitted through the first color pattern 251 but may be absorbed by the second light-blocking member 222 disposed on the first color pattern 251. In addition, even when the light is partially reflected by the second light-blocking member 222, reflected light LR4 has a blue wavelength component, and thus the possibility that the reflected light LR4 is sensitively perceived by the user is lowered.

That is, according to the present embodiment, the first contact area S1 (see FIG. 12) in which the second base portion 310 is in direct contact with the light-blocking member 220 (see FIG. 11) is disposed around a periphery of the first light-transmitting area TA1, and the second contact area S2 (see FIG. 12) in which the second base portion 310 is in direct contact with the color pattern 250 (see FIG. 10) is disposed between the second light-transmitting area TA2 and the third light-transmitting area TA3 so that the first light-transmitting area TA1 may not only have an area designed as intended but also reduce the reflection of external light. Further, instead of arranging only the second contact area S2 (see FIG. 12) in the light-blocking area BA (see FIG. 12), the first contact area S1 (see FIG. 12) is further disposed in the light-blocking area BA (see FIG. 12) so that it is possible to effectively reduce a phenomenon in which a display color becomes bluish due to reflected light, that is, the display color changes to bluish.

Figure 16:
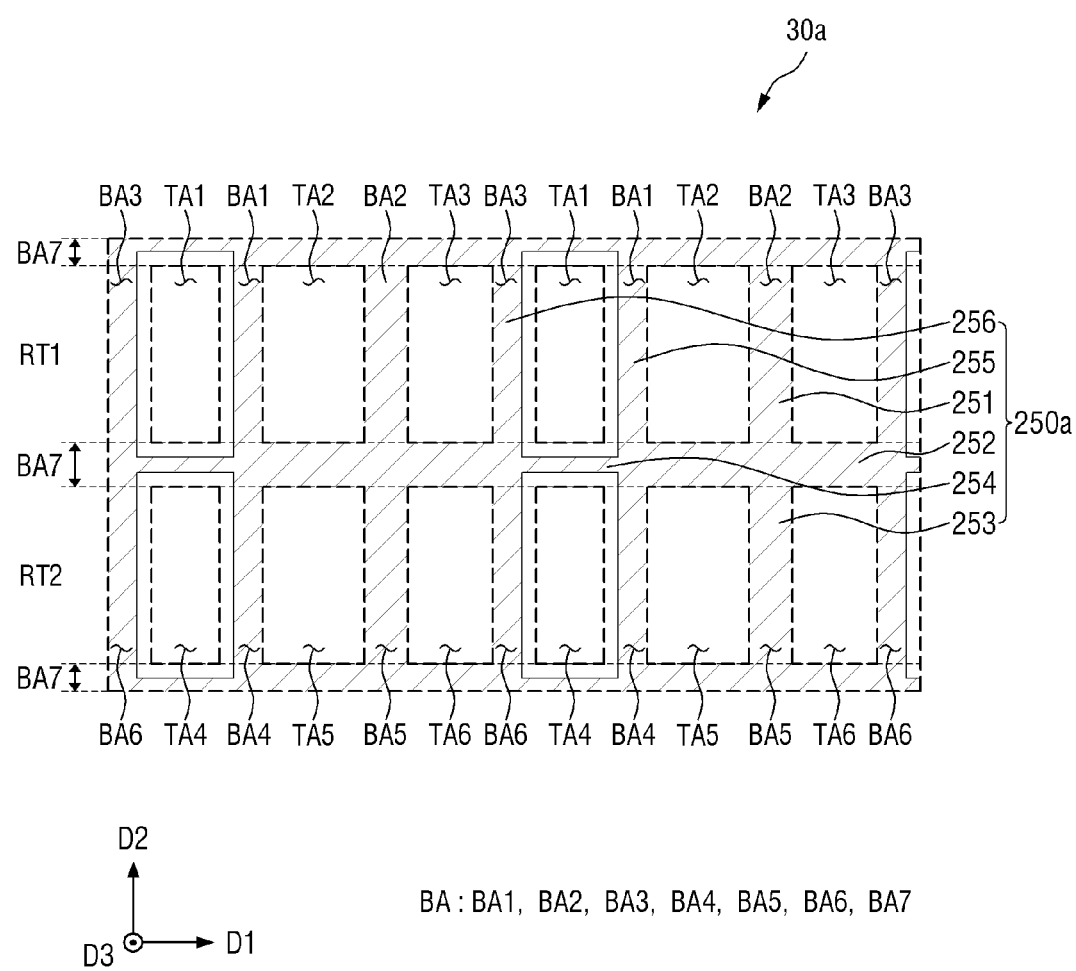
FIG. 16 is a schematic plan view illustrating an arrangement of a color pattern in a color conversion substrate of a display device according to another embodiment.
Figure 17:
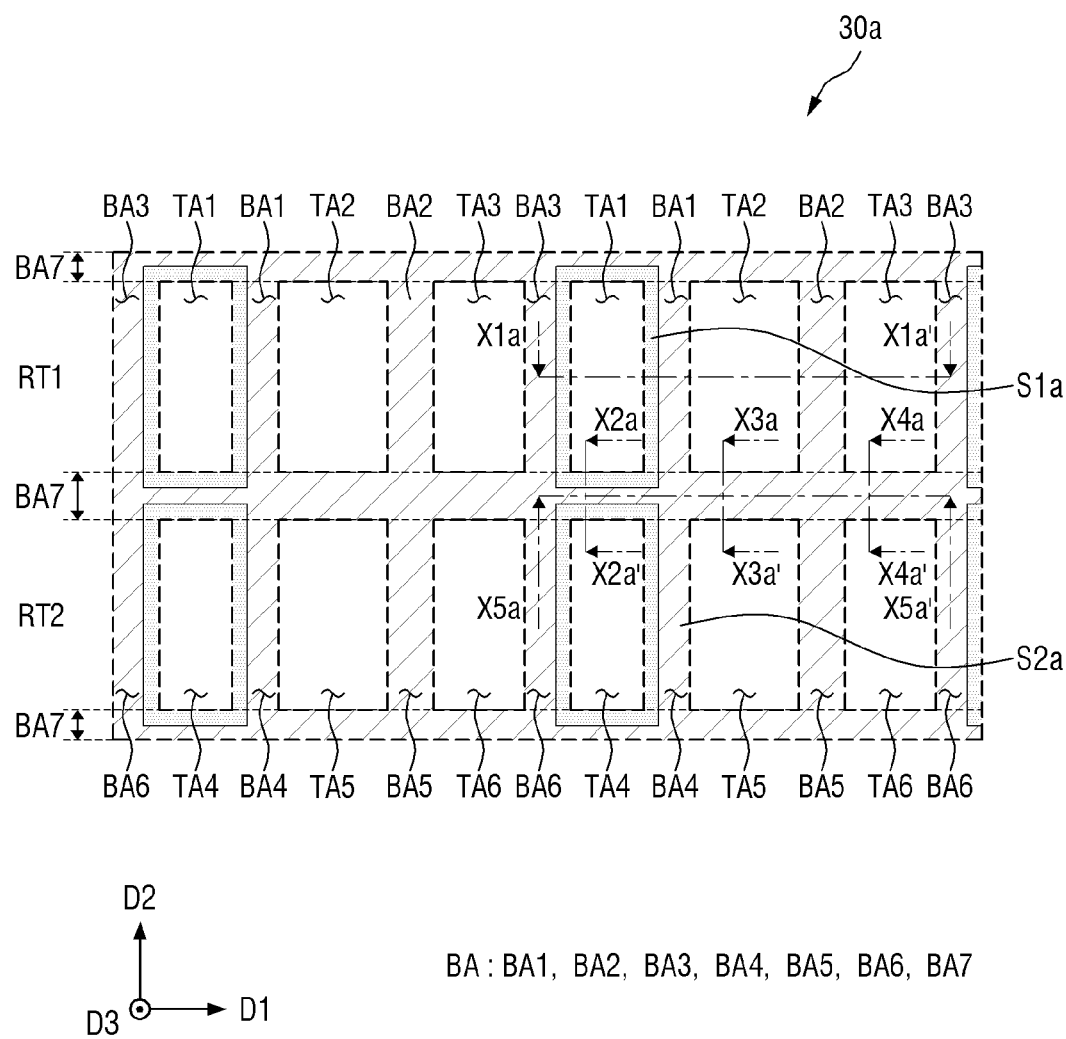
FIG. 17 is a schematic plan view illustrating an arrangement of a first contact area and a second contact area in the color conversion substrate of the display device according to another embodiment.
Figure 18:
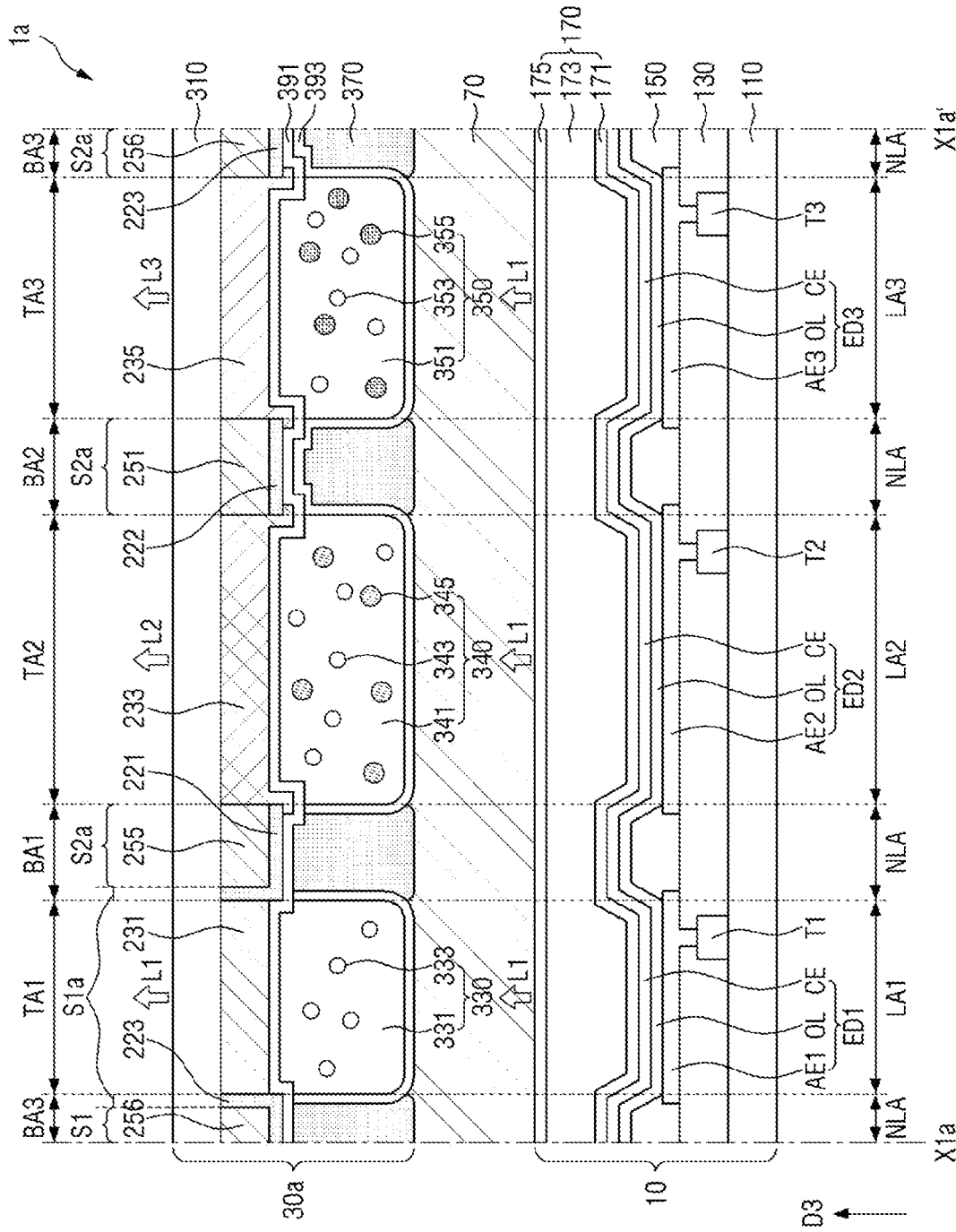
FIG. 18 is a cross-sectional view of the display device according to another embodiment taken along line X1a-X1a' of FIG. 17.
Figure 19:
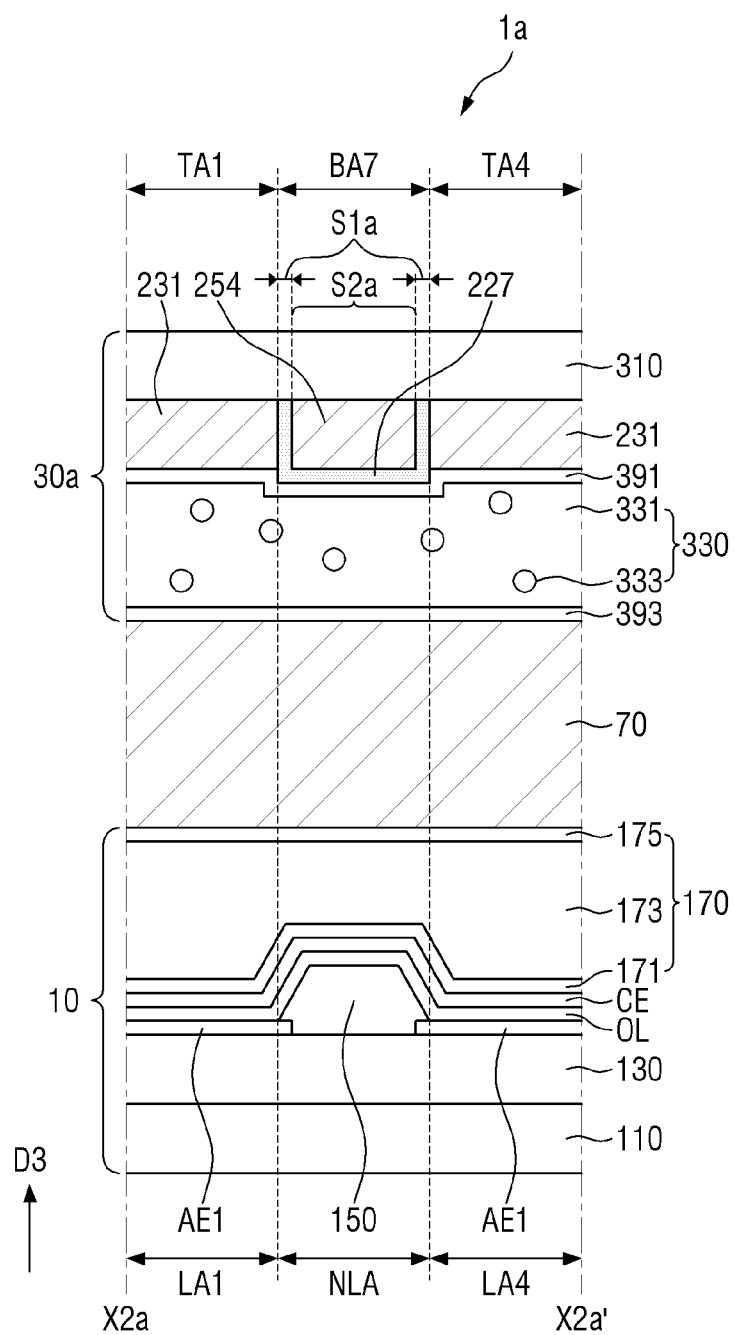
FIG. 19 is a cross-sectional view of the display device according to another embodiment taken along line X2a-X2a' of FIG. 17.
Figure 20:
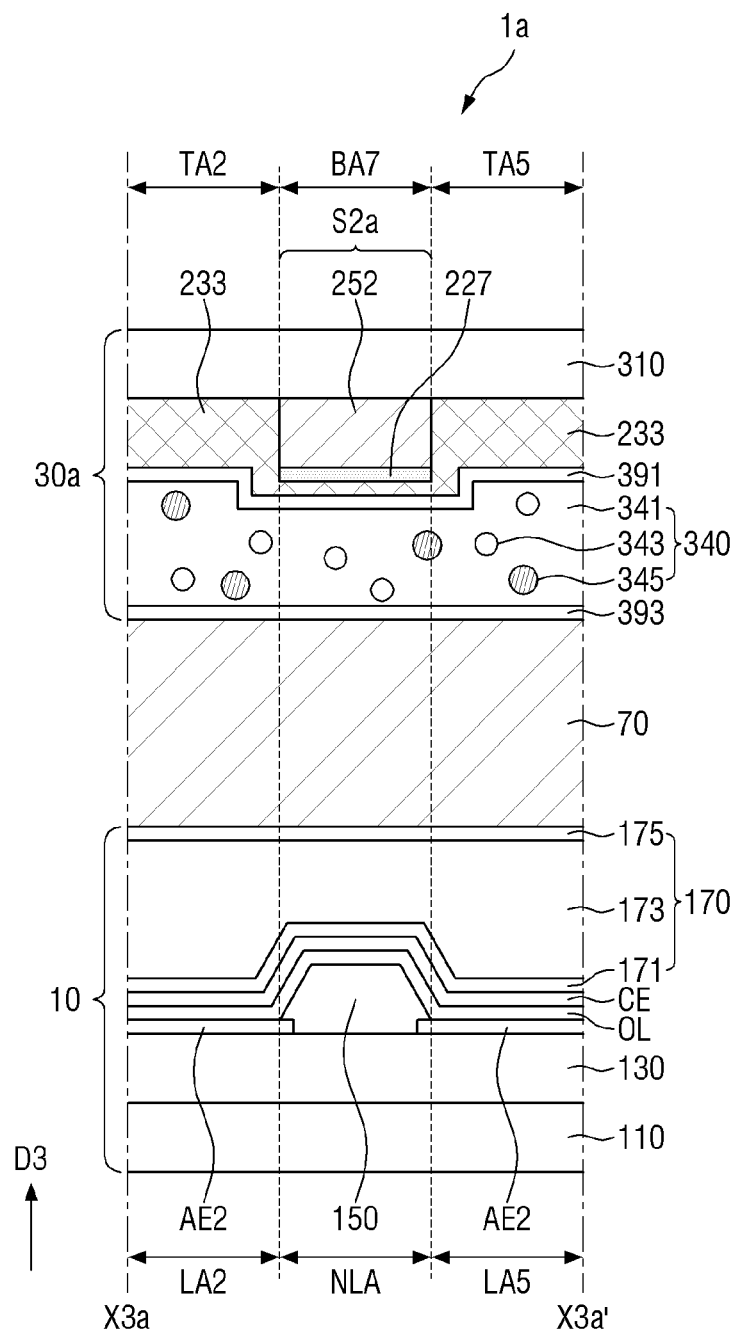
FIG. 20 is a cross-sectional view of the display device according to another embodiment taken along line X3a-X3a' of FIG. 17.
Figure 21:
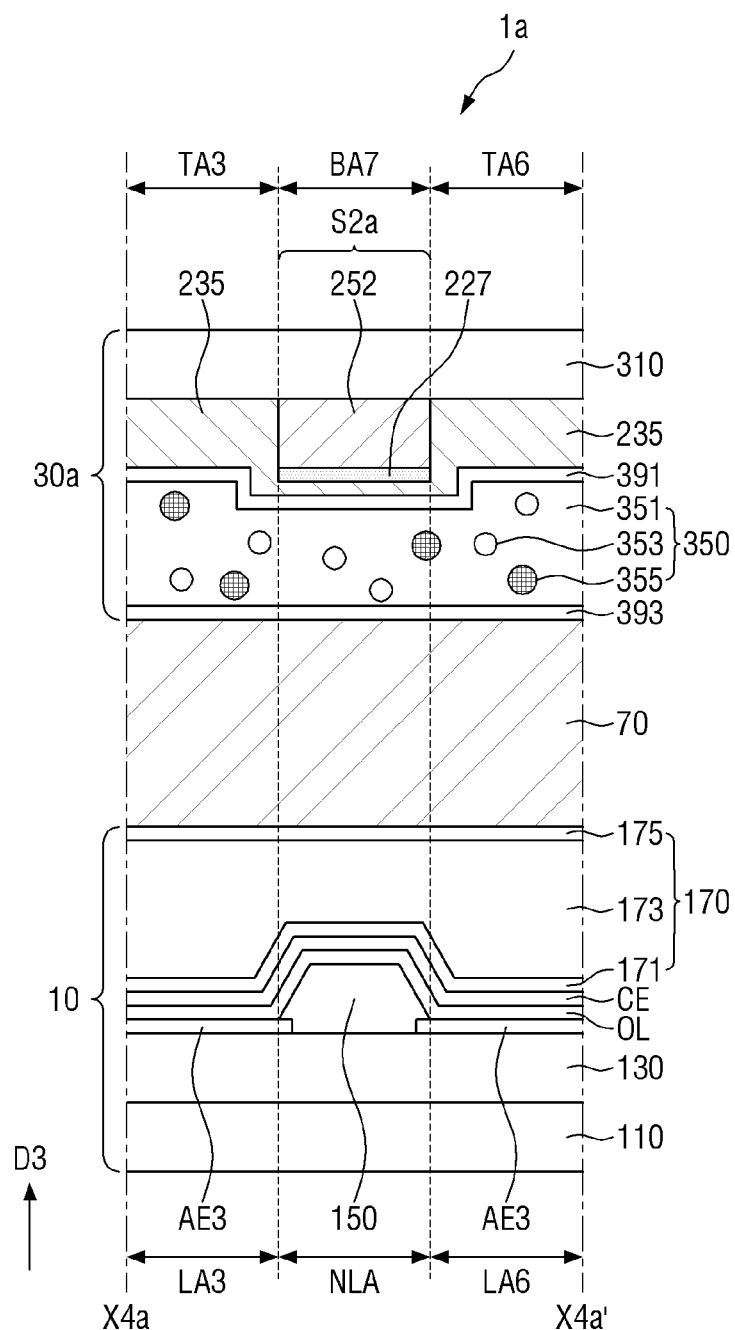
FIG. 21 is a cross-sectional view of the display device according to another embodiment taken along line X4a-X4a' of FIG. 17.
Figure 22:
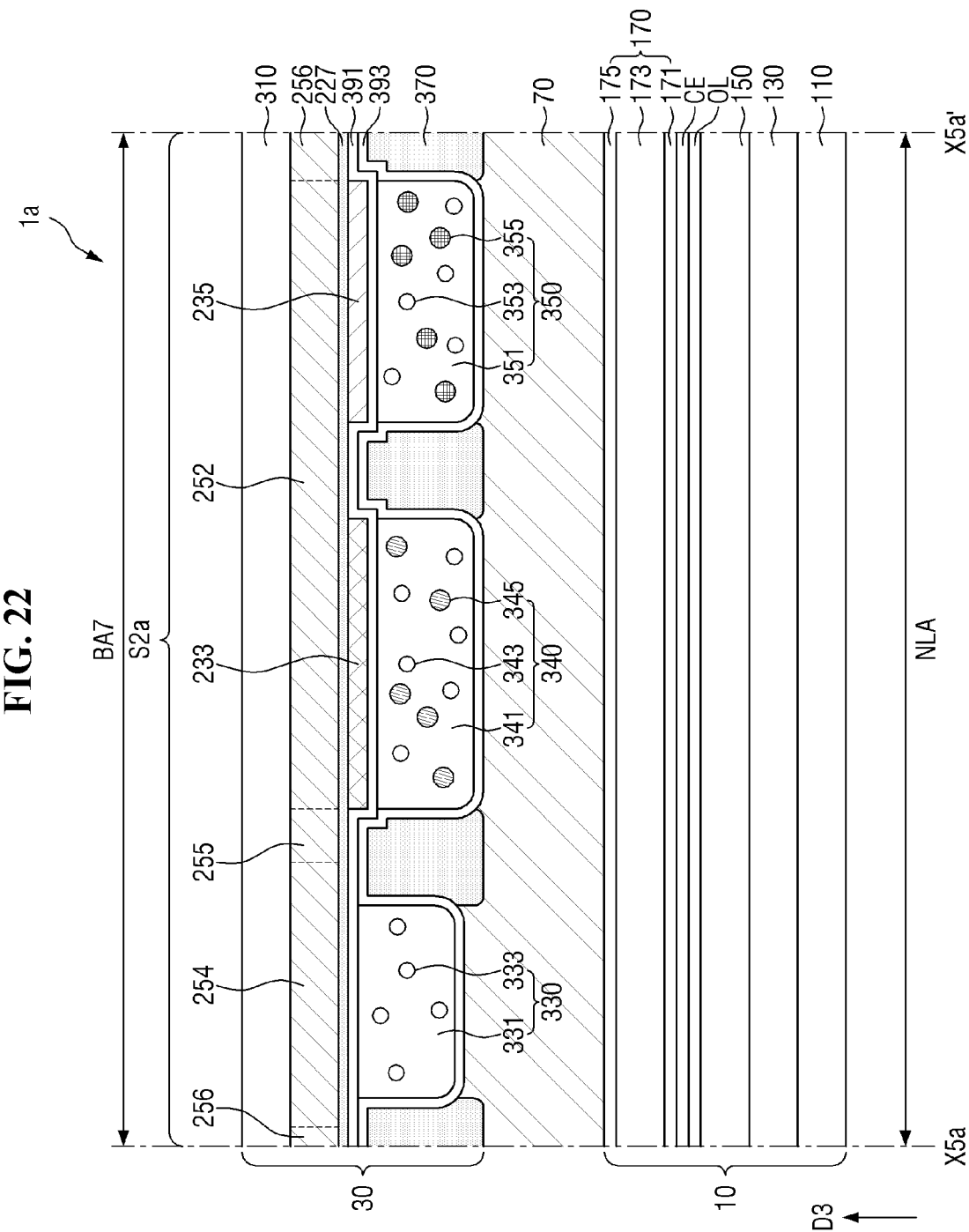
FIG. 22 is a cross-sectional view of the display device according to another embodiment taken along line X5a-X5a' of FIG. 17.

FIG. 16 is a schematic plan view illustrating an arrangement of a color pattern in a color conversion substrate of a display device according to another embodiment, FIG. 17 is a schematic plan view illustrating an arrangement of a first contact area and a second contact area in the color conversion substrate of the display device according to another embodiment, FIG. 18 is a cross-sectional view of the display device according to another embodiment taken along line X1a-X1a' of FIG. 17, FIG. 19 is a cross-sectional view of the display device according to another embodiment taken along line X2a-X2a' of FIG. 17, FIG. 20 is a cross-sectional view of the display device according to another embodiment taken along line X3a-X3a' of FIG. 17, FIG. 21 is a cross-sectional view of the display device according to another embodiment taken along line X4a-X4a' of FIG. 17, and FIG. 22 is a cross-sectional view of the display device according to another embodiment taken along line X5a-X5a' of FIG. 17.

Referring to FIGS. 16 to 22, a display device 1a according to the present embodiment includes a display substrate 10, a color conversion substrate 30a, and a filler 70. The display device 1a has configurations that are substantially the same as or similar to those in the embodiment described with reference to FIGS. 5 to 14 except for the configuration of the color conversion substrate 30a, in particular, a color pattern 250a of the color conversion substrate 30a. Thus, repeated descriptions will be omitted, and the description will be focused on the differences.

The color pattern 250a may be disposed on one surface of a second base portion 310 and may be disposed in a light-blocking area BA. In some embodiments, the color pattern 250a may be in direct contact with one surface of the second base portion 310.

As shown in FIG. 16, in some embodiments, the color pattern 250a may be disposed in the remaining area of the light-blocking area BA except for a portion of a first light-blocking area BA1, a portion of a third light-blocking area BA3, and a portion of a seventh light-blocking area BA7.

In some embodiments, the color pattern 250a may include a first color pattern 251 disposed in a second light-blocking area BA2, a second color pattern 252 and a fourth color pattern 254 disposed in the seventh light-blocking area BA7, a third color pattern 253 disposed in a fifth light-blocking area BA5, a fifth color pattern 255 disposed in a partial area of the first light-blocking area BA1, a partial area of a fourth light-blocking area BA4, and a partial area of the seventh light-blocking area BA7, and a sixth color pattern 256 disposed in a partial area of the third light-blocking area BA3, a partial area of a sixth light-blocking area BA6, and a partial area of the seventh light-blocking area BA7.

The first color pattern 251 and the third color pattern 253 may be connected to the second color pattern 252 along the second direction D2.

The fifth color pattern 255 and the sixth color pattern 256 may each extend along the second direction D2. The fifth color pattern 255 may be connected to the second color pattern 252 in the seventh light-blocking area BA7, may be spaced apart from a first light-transmitting area TA1 at a predetermined distance along the first direction D1 in the first light-blocking area BA1, and may be spaced apart from a fourth light-transmitting area TA4 at a predetermined distance along the first direction D1 in the fourth light-blocking area BA4.

The sixth color pattern 256 may be connected to the second color pattern 252 in the seventh light-blocking area BA7, may be spaced apart from the first light-transmitting area TA1 at a predetermined distance along the first direction D1 in the third light-blocking area BA3, and may be spaced apart from the fourth light-transmitting area TA4 at a predetermined distance along the first direction D1 in the sixth light-blocking area BA6.

The fourth color pattern 254 may be disposed in the seventh light-blocking area BA7 and may be disposed between the fifth color pattern 255 and the sixth color pattern 256. The fourth color pattern 254 may be connected to the fifth color pattern 255 and the sixth color pattern 256 along the second direction D2. The fourth color pattern 254 may be spaced apart from the first light-transmitting area TA1 and the fourth light-transmitting area TA4 at a predetermined distance along the second direction D2 in the seventh light-blocking area BA7.

A light-blocking member 220 (see FIG. 11) may be disposed on the second base portion 310 and the color pattern 250a, and a planar structure of the light-blocking member 220 (see FIG. 11) may be the same as that shown in FIG. 11. A portion of the light-blocking member 220 (see FIG. 11), for example, a portion thereof not overlapping the color pattern 250a in a plan view, may be in direct contact with one surface of the second base portion 310, and another portion of the light-blocking member 220, for example, a portion thereof overlapping the color pattern 250a in a plan view, may be disposed on the color pattern 250a.

When a description is made in terms of a contact area, as shown in FIG. 17, a first contact area S1a, with which one surface of the second base portion 310 and the light-blocking member 220 (see FIG. 11) are in contact, may be disposed to completely surround the first light-transmitting area TA1 and the fourth light-transmitting area TA4. In a first row RT1, the first contact area S1a may be disposed on a portion of the first light-blocking area BA1, a portion of the third light-blocking area BA3, and a portion of the seventh light-blocking area BA7 so as to completely surround the first light-transmitting area TA1.

In some embodiments, a second contact area S2a may not be disposed between the first contact area S1a and the first light-transmitting area TA1 which are arranged along the first direction D1, and only the second contact area S2a may be disposed between the first contact area S1a and a third light-transmitting area TA3 and between the first contact area S1a and a second light-transmitting area TA2.

In a second row RT2, the first contact area S1a may be disposed on a portion of the fourth light-blocking area BA4, a portion of the sixth light-blocking area BA6, and a portion of the seventh light-blocking area BA7 so as to completely surround the fourth light-transmitting area TA4. In some embodiments, the second contact area S2a may not be disposed between the first contact area S1a and the fourth light-transmitting area TA4 which are arranged along the first direction D1, and only the second contact area S2a may be disposed between the first contact area S1a and a sixth light-transmitting area TA6 and between the first contact area S1a and a fifth light-transmitting area TA5.

In some embodiments, the first contact area S1a in the first row RT1 and the first contact area S1a in the second row RT2 may be adjacent to each other along the second direction D2 but may be separated without being connected to each other.

In some embodiments, the first contact area S1a, the second contact area S2a, and the first contact area S1a may be sequentially disposed between the first light-transmitting area TA1 and the fourth light-transmitting area TA4 along the second direction D2.

The second contact area S2a may be disposed in the remaining area of the light-blocking area BA except for the area in which the first contact area S1a is disposed. The planar shape of the second contact area S2a may be substantially the same as the area in which the color pattern 250a shown in FIG. 16 is disposed.

When a description is made in terms of a cross section, as shown in FIG. 18, the fifth color pattern 255, which is spaced apart from a first color filter 231 and in direct contact with a second color filter 233, may be disposed on the second base portion 310 in the first light-blocking area BA1, and a first light-blocking member 221 may be disposed on the fifth color pattern 255. The fifth color pattern 255 may be in direct contact with the second base portion 310 to form the second contact area S2a. The first light-blocking member 221 may surround one side of the fifth color pattern 255 and may be in direct contact with the second base portion 310 to form the first contact area S1a. A portion of the first light-blocking member 221, which is in direct contact with the second base portion 310, may be disposed between the first color filter 231 and the fifth color pattern 255.

As shown in FIG. 18, in the second light-blocking area BA2, a second light-blocking member 222 may be disposed on the first color pattern 251 and may not be in direct contact with the second base portion 310.

As shown in FIG. 18, in the third light-blocking area BA3, the sixth color pattern 256, which is spaced apart from the first color filter 231 and is in direct contact with a third color filter 235, may be disposed on the second base portion 310, and a portion of a third light-blocking member 223 may be disposed on the sixth color pattern 256. The sixth color pattern 256 may be in direct contact with the second base portion 310 to form the second contact area S2a. The third light-blocking member 223 may surround one side of the sixth color pattern 256 and may be in direct contact with the second base portion 310 to form the first contact area S1a. A portion of the third light-blocking member 223, which is in direct contact with the second base portion 310, may be disposed between the first color filter 231 and the sixth color pattern 256.

As shown in FIGS. 19 and 22, in the seventh light-blocking area BA7, the fourth color pattern 254, which is spaced apart from the first color filter 231 in the first light-transmitting area TA1 and the first color filter 231 in the fourth light-transmitting area TA4, may be disposed on the second base portion 310. The fourth color pattern 254 may be in direct contact with the second base portion 310 to form the second contact area S2a. A portion of a seventh light-blocking member 227 may be disposed on the fourth color pattern 254. The seventh light-blocking member 227 may surround opposite sides of the fourth color pattern 254 and may be in direct contact with the second base portion 310 to form the first contact area S1a. A portion of the seventh light-blocking member 227, which is in direct contact with the second base portion 310, may be disposed between the first color filter 231 in the first light-transmitting area TA1 and the fourth color pattern 254 and between the first color filter 231 in the fourth light-transmitting area TA4 and the fourth color pattern 254.

As shown in FIGS. 20 to 22, the second color pattern 252 may be disposed between the second light-transmitting area TA2 and the fifth light-transmitting area TA5 and between the third light-transmitting area TA3 and the sixth light-transmitting area TA6 in the seventh light-blocking area BA7, and the second color pattern 252 may be disposed on the second base portion 310. The second color pattern 252 may be in direct contact with the second base portion 310 to form the second contact area S2a. The seventh light-blocking member 227 may be disposed on the second color pattern 252.

Other configurations are the same as those described in the embodiment of FIGS. 5 to 14, and thus, a detailed description thereof will be omitted.

Figure 23:
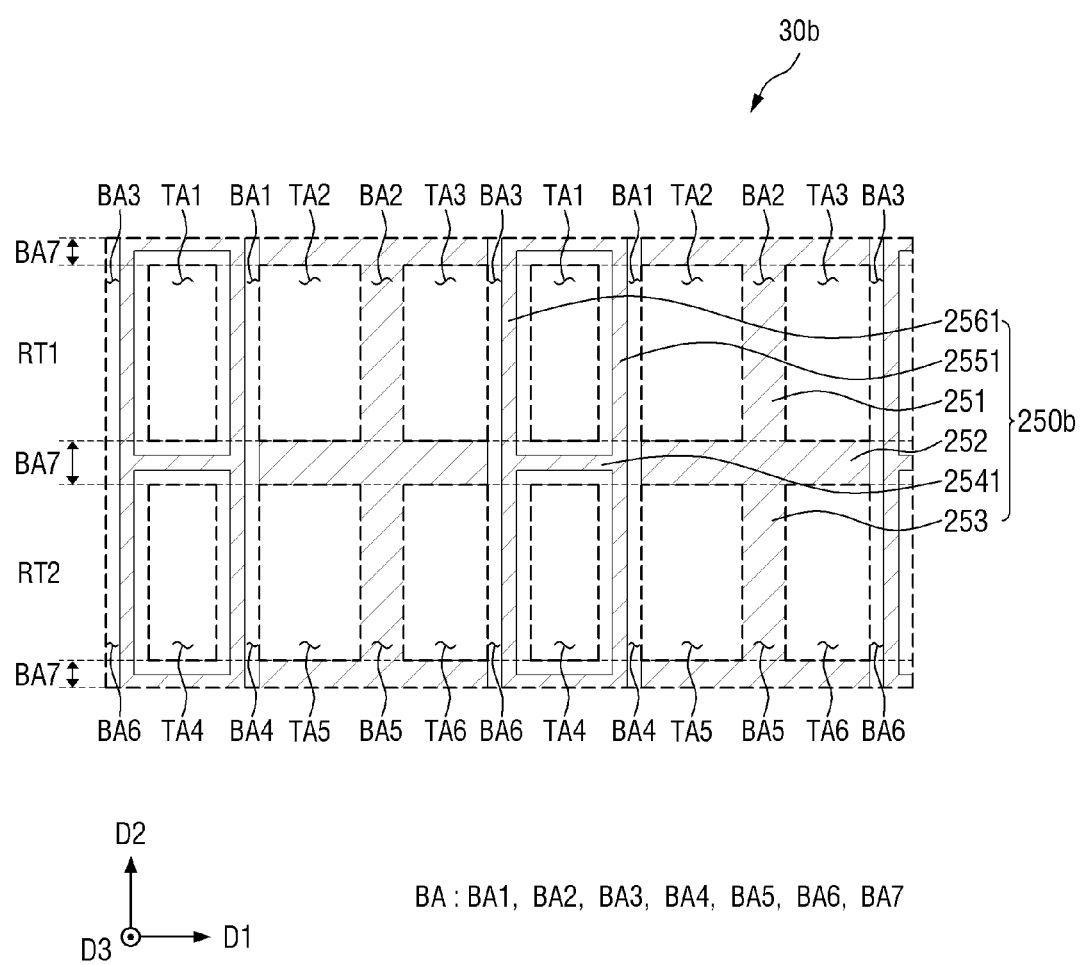
FIG. 23 is a schematic plan view illustrating an arrangement of a color pattern in a color conversion substrate of a display device according to still another embodiment.
Figure 24:
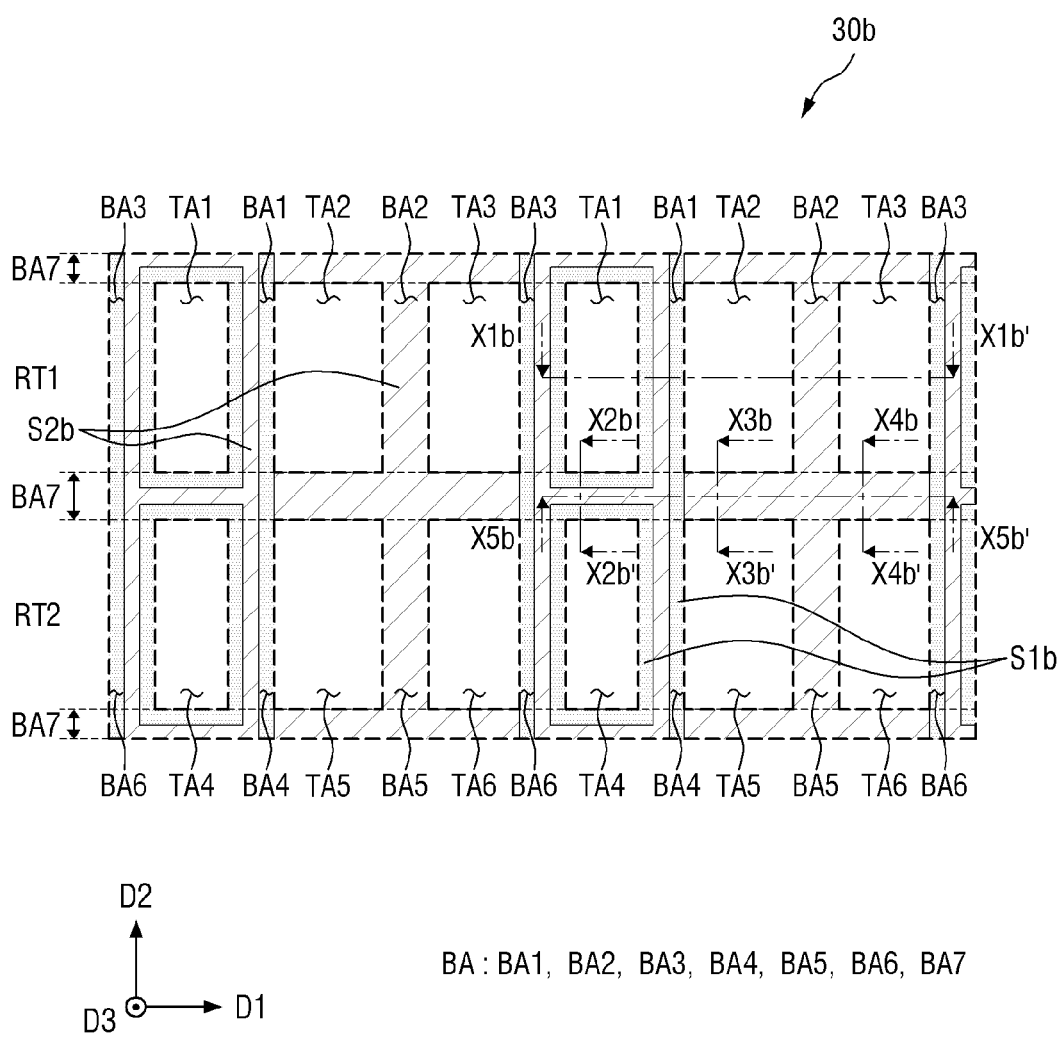
FIG. 24 is a schematic plan view illustrating an arrangement of a first contact area and a second contact area in the color conversion substrate of the display device according to still another embodiment.
Figure 25:
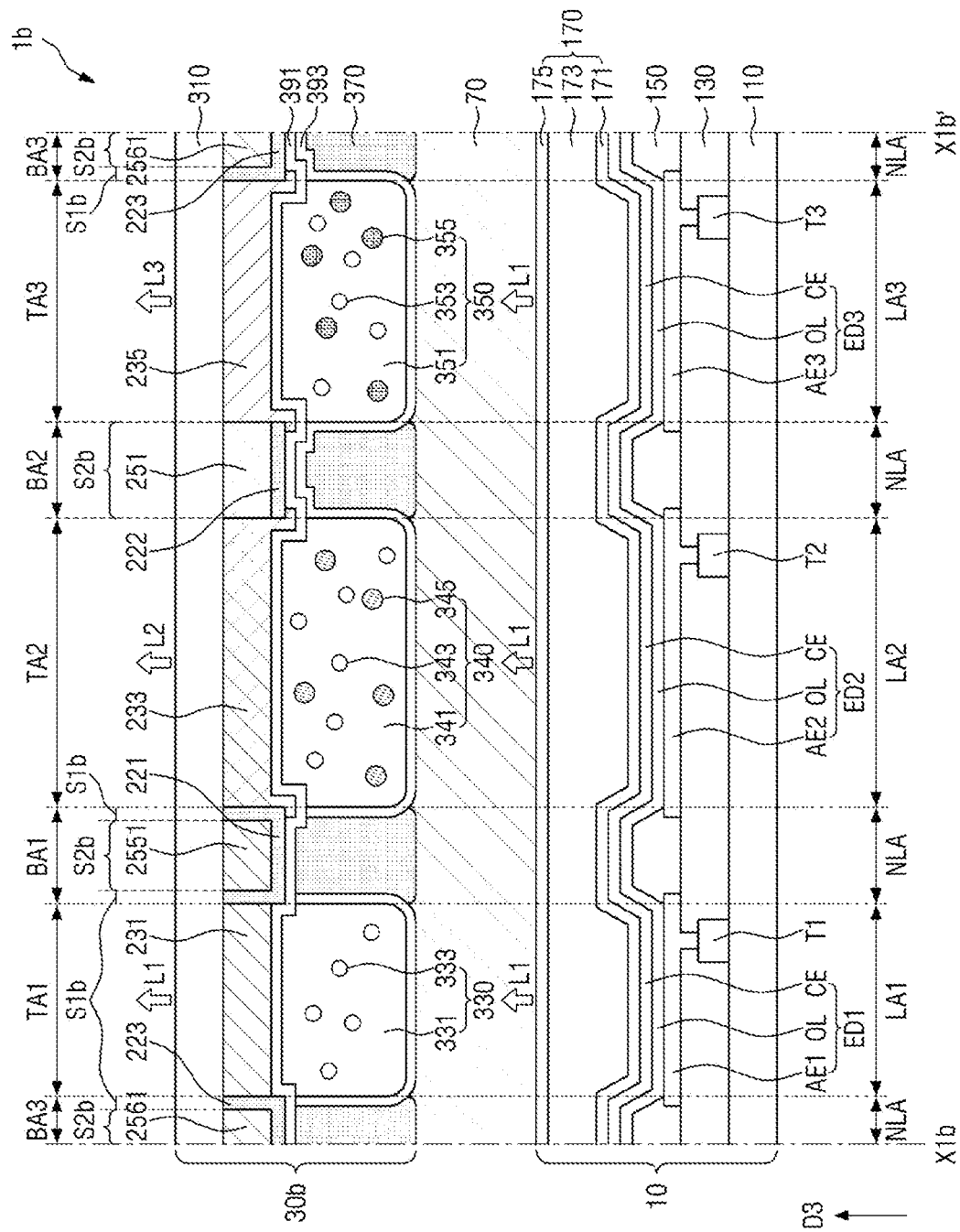
FIG. 25 is a cross-sectional view of the display device according to still another embodiment taken along line X1b-X1b' of FIG. 24.
Figure 26:
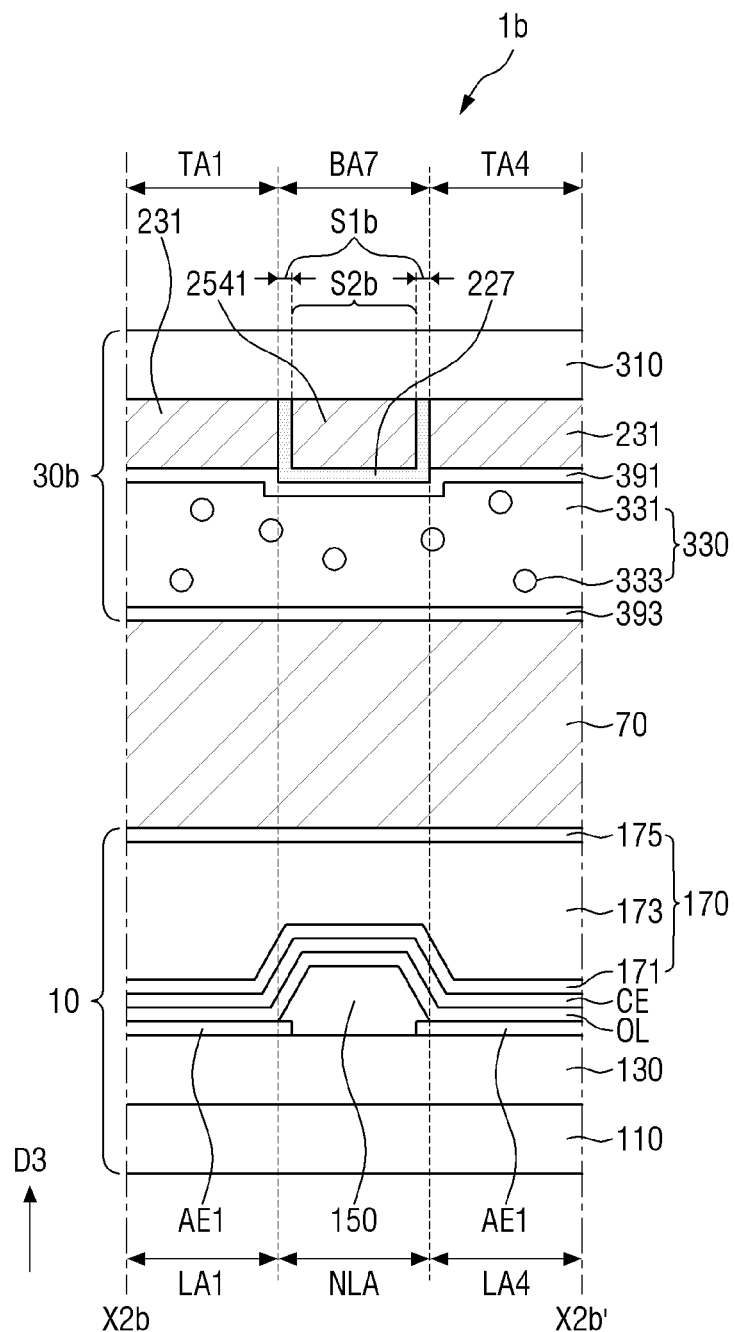
FIG. 26 is a cross-sectional view of the display device according to still another embodiment taken along line X2b-X2b' of FIG. 24.
Figure 27:
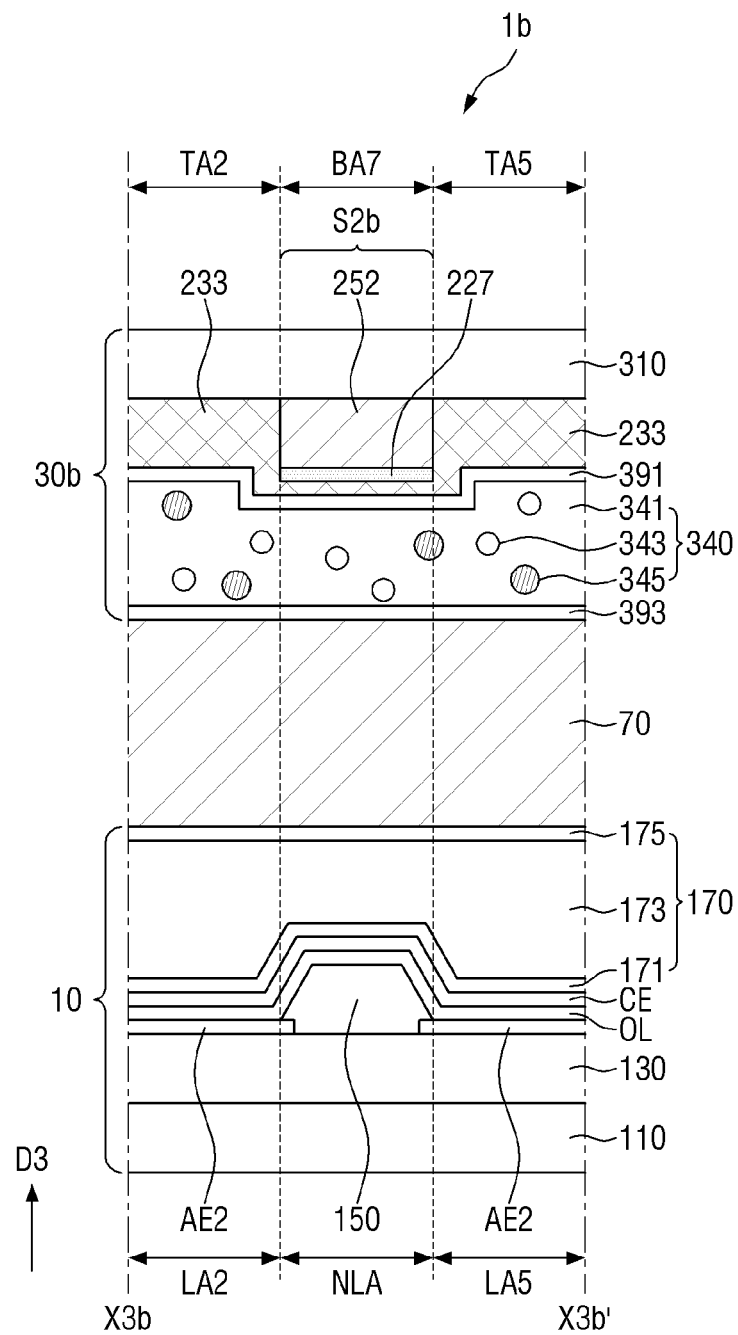
FIG. 27 is a cross-sectional view of the display device according to still another embodiment taken along line X3b-X3b' of FIG. 24.
Figure 28:
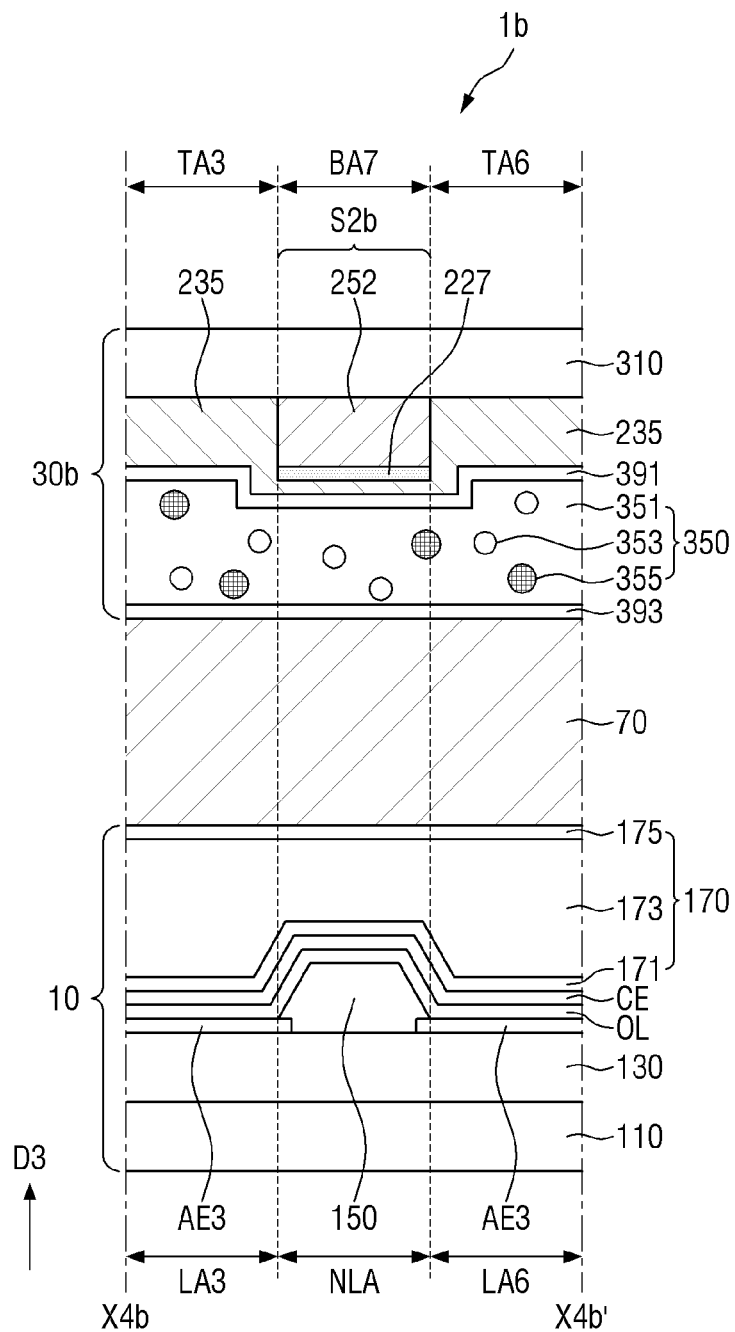
FIG. 28 is a cross-sectional view of the display device according to still another embodiment taken along line X4b-X4b' of FIG. 24.
Figure 29:
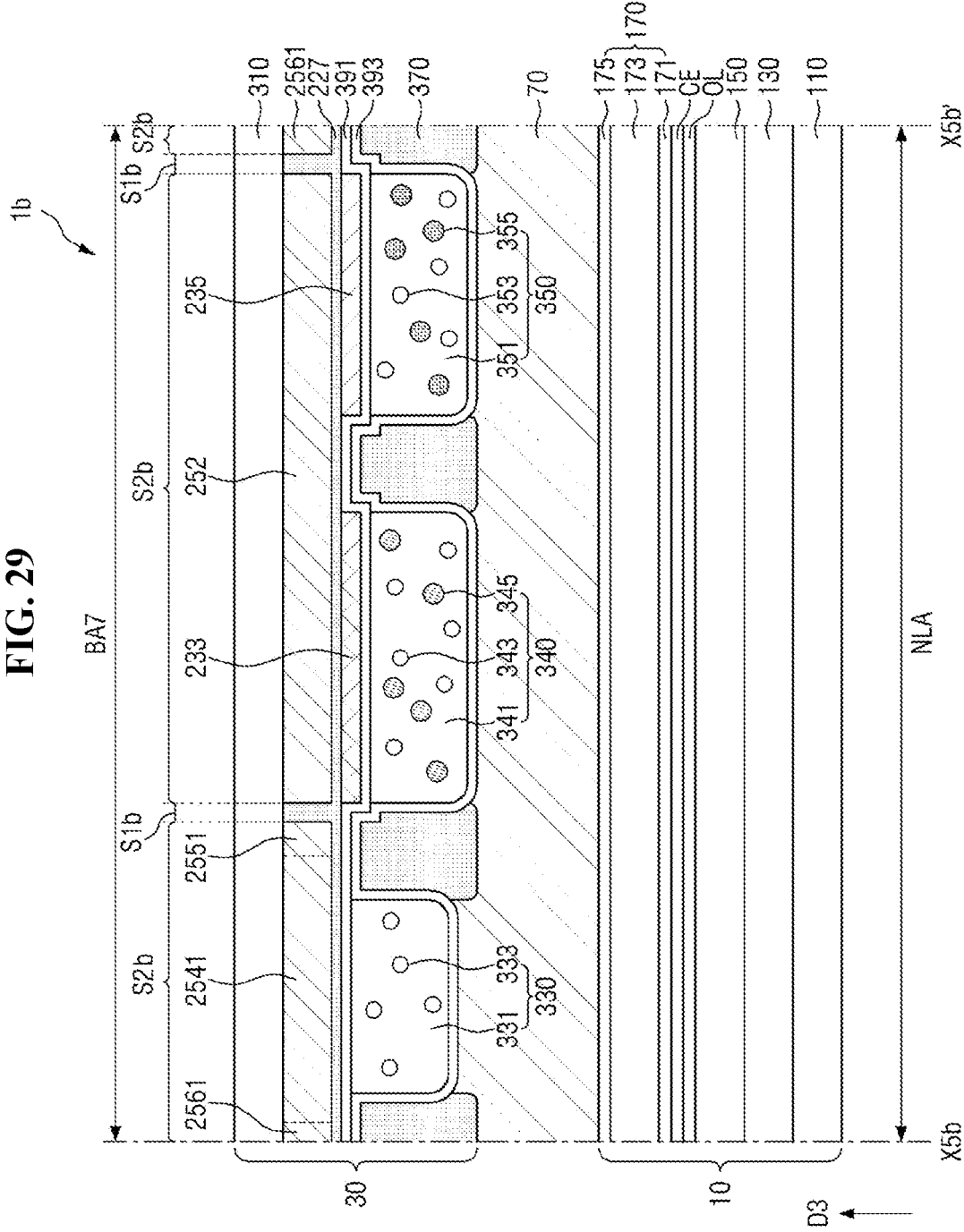
FIG. 29 is a cross-sectional view of the display device according to still another embodiment taken along line X5b-X5b' of FIG. 24.

FIG. 23 is a schematic plan view illustrating an arrangement of a color pattern in a color conversion substrate of a display device according to still another embodiment, FIG. 24 is a schematic plan view illustrating an arrangement of a first contact area and a second contact area in the color conversion substrate of the display device according to still another embodiment, FIG. 25 is a cross-sectional view of the display device according to still another embodiment taken along line X1b-X1b' of FIG. 24, FIG. 26 is a cross-sectional view of the display device according to still another embodiment taken along line X2b-X2b' of FIG. 24, FIG. 27 is a cross-sectional view of the display device according to still another embodiment taken along line X3b-X3b' of FIG. 24, FIG. 28 is a cross-sectional view of the display device according to still another embodiment taken along line X4b-X4b' of FIG. 24, and FIG. 29 is a cross-sectional view of the display device according to still another embodiment taken along line X5b-X5b' of FIG. 24.

Referring to FIGS. 23 to 29, a display device 1b according to the present embodiment includes a display substrate 10, a color conversion substrate 30b, and a filler 70. The display device 1b has configurations that are substantially the same as or similar to those in the embodiment described with reference to FIGS. 15 to 22 except for the configuration of the color conversion substrate 30b, in particular, a color pattern 250b of the color conversion substrate 30b. Thus, repeated descriptions will be omitted, and the description will be focused on the differences.

As shown in FIG. 23, the color pattern 250b may include: a first color pattern 251 disposed in a second light-blocking area BA2; a second color pattern 252 and a fourth color pattern 2541 disposed in a seventh light-blocking area BA7; a third color pattern 253 disposed in a fifth light-blocking area BA5; a fifth color pattern 2551 disposed in a partial area of a first light-blocking area BA1, a partial area of a fourth light-blocking area BA4, and a partial area of the seventh light-blocking area BA7; and a sixth color pattern 2561 disposed in a partial area of a third light-blocking area BA3, a partial area of a sixth light-blocking area BA6, and a partial area of the seventh light-blocking area BA7.

The first color pattern 251 and the third color pattern 253 may be connected to the second color pattern 252 along the second direction D2.

The fifth color pattern 2551 and the sixth color pattern 2561 may each extend along the second direction D2. The fifth color pattern 2551 is spaced apart from the second color pattern 252 in the seventh light-blocking area BA7. The fifth color pattern may be spaced apart from a first light-transmitting area TA1 and a second light-transmitting area TA2 at a predetermined distance along the first direction D1 in the first light-blocking area BA1 and may be spaced apart from a fourth light-transmitting area TA4 and a fifth light-transmitting area TA5 at a predetermined distance along the first direction D1 in the fourth light-blocking area BA4.

The sixth color pattern 2561 is spaced apart from the second color pattern 252 in the seventh light-blocking area BA7. The sixth color pattern 2561 may be spaced apart from the first light-transmitting area TA1 and a third light-transmitting area TA3 at a predetermined distance along the first direction D1 in the third light-blocking area BA3 and may be spaced apart from the fourth light-transmitting area TA4 and a sixth light-transmitting area TA6 at a predetermined distance along the first direction D1 in the sixth light-blocking area BA6.

The fourth color pattern 2541 may be disposed in the seventh light-blocking area BA7 and may be disposed between the fifth color pattern 2551 and the sixth color pattern 2561. The fourth color pattern 2541 may be connected to the fifth color pattern 2551 and the sixth color pattern 2561 along the first direction D1. The fourth color pattern 2541 may be spaced apart from the first light-transmitting area TA1 and the fourth light-transmitting area TA4 at a predetermined distance along the second direction D2 in the seventh light-blocking area BA7.

When a description is made in terms of a contact area, as shown in FIG. 24, a portion of a first contact area S1b, in which one surface of a second base portion 310 is in direct contact with a light-blocking member 220 (see FIG. 11), may be disposed to completely surround the first light-transmitting area TA1 and the fourth light-transmitting area TA4. In addition, another portion of the first contact area S1b may be formed in a shape extending along the second direction D2 in the third light-blocking area BA3 and the sixth light-blocking area BA6, and still another portion of the first contact area S1b may be formed in a shape extending along the second direction D2 in the first light-blocking area BA1 and the fourth light-blocking area BA4.

The first contact area S1b, a second contact area S2b, and the first contact area S1b may be sequentially disposed along the first direction D1 in each of the first light-blocking area BA1 and the third light-blocking area BA3. In addition, the first contact area S1b, the second contact area S2b, and the first contact area S1b may be sequentially disposed along the second direction D2 between the first light-transmitting area TA1 and the fourth light-transmitting area TA4 in the seventh light-blocking area BA7.

When a description is made in terms of a cross section, as shown in FIG. 25, the fifth color pattern 2551, which is spaced apart from a first color filter 231 and a second color filter 233, may be disposed on the second base portion 310 in the first light-blocking area BA1, and a first light-blocking member 221 may be disposed on the fifth color pattern 2551. The fifth color pattern 2551 may be in direct contact with the second base portion 310 to form the second contact area S2b. The first light-blocking member 221 may surround opposite sides of the fifth color pattern 2551 and may be in direct contact with the second base portion 310 to form the first contact area S1b. A portion of the first light-blocking member 221, which is in direct contact with the second base portion 310, may be disposed between the first color filter 231 and the fifth color pattern 255 and between the second color filter 233 and the fifth color pattern 255.

As shown in FIG. 25, in the second light-blocking area BA2, the first color pattern 251 in direct contact with the second color filter 233 and the second base portion 310 may be disposed on the second base portion 310. A second light-blocking member 222 may be disposed on the first color pattern 251 and may not be in direct contact with the second base portion 310.

As shown in FIG. 25, in the third light-blocking area BA3, the sixth color pattern 2561 spaced apart from the first color filter 231 and a third color filter 235 may be disposed on the second base portion 310, and a portion of a third light-blocking member 223 may be disposed on the sixth color pattern 256l. The sixth color pattern 256l may be in direct contact with the second base portion 310 to form the second contact area S2*b*. The third light-blocking member 223 may surround opposite sides of the sixth color pattern 256l and may be in direct contact with the second base portion 310 to form the first contact area S1*b*. A portion of the third light-blocking member 223, which is in direct contact with the second base portion 310, may be disposed between the first color filter 231 and the sixth color pattern 256l and between the third color filter 235 and the sixth color pattern 256l.

As shown in FIGS. 26 and 29, in the seventh light-blocking area BA7, the fourth color pattern 254l, which is spaced apart from the first color filter 231 in the first light-transmitting area TA1 and the first color filter 231 in the fourth light-transmitting area TA4, may be disposed on the second base portion 310. The fourth color pattern 254l may be in direct contact with the second base portion 310 to form the second contact area S2*a*. A portion of a seventh light-blocking member 227 may be disposed on the fourth color pattern 254l. The seventh light-blocking member 227 may surround opposite sides of the fourth color pattern 254l and may be in direct contact with the second base portion 310 to form the first contact area S1*b*. A portion of the seventh light-blocking member 227, which is in direct contact with the second base portion 310, may be disposed between the first color filter 231 in the first light-transmitting area TA1 and the fourth color pattern 254l and between the first color filter 231 in the fourth light-transmitting area TA4 and the fourth color pattern 254l.

As shown in FIGS. 27 to 29, the second color pattern 252 may be disposed between the second light-transmitting area TA2 and the fifth light-transmitting area TA5 and between the third light-transmitting area TA3 and the sixth light-transmitting area TA6 in the seventh light-blocking area BA7, and the second color pattern 252 may be disposed on the second base portion 310. The second color pattern 252 may be in direct contact with the second base portion 310 to form the second contact area S2*a*. The seventh light-blocking member 227 may be disposed on the second color pattern 252.

Detailed descriptions of other configurations are the same as those described above, and thus will be omitted.

Figure 30:
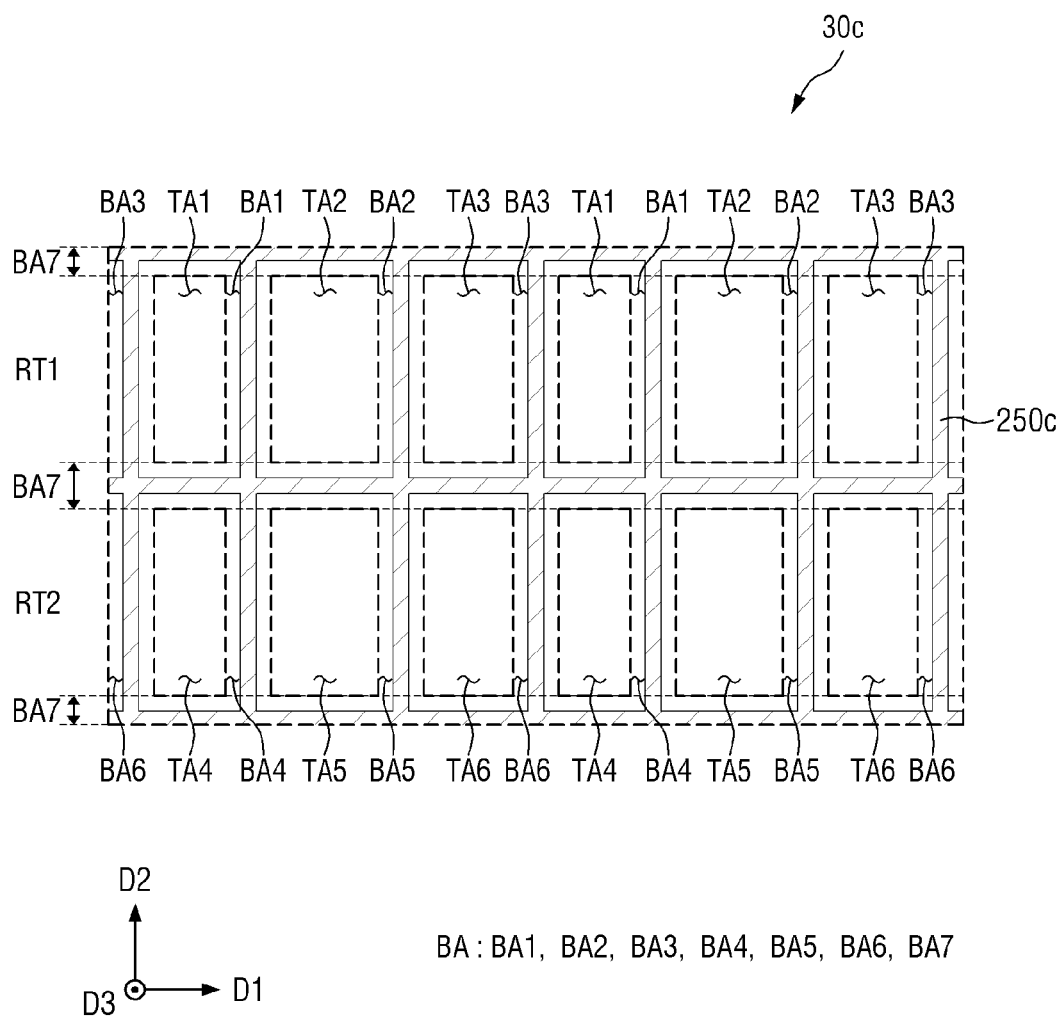
FIG. 30 is a schematic plan view illustrating an arrangement of a color pattern in a color conversion substrate of a display device according to yet another embodiment.
Figure 31:
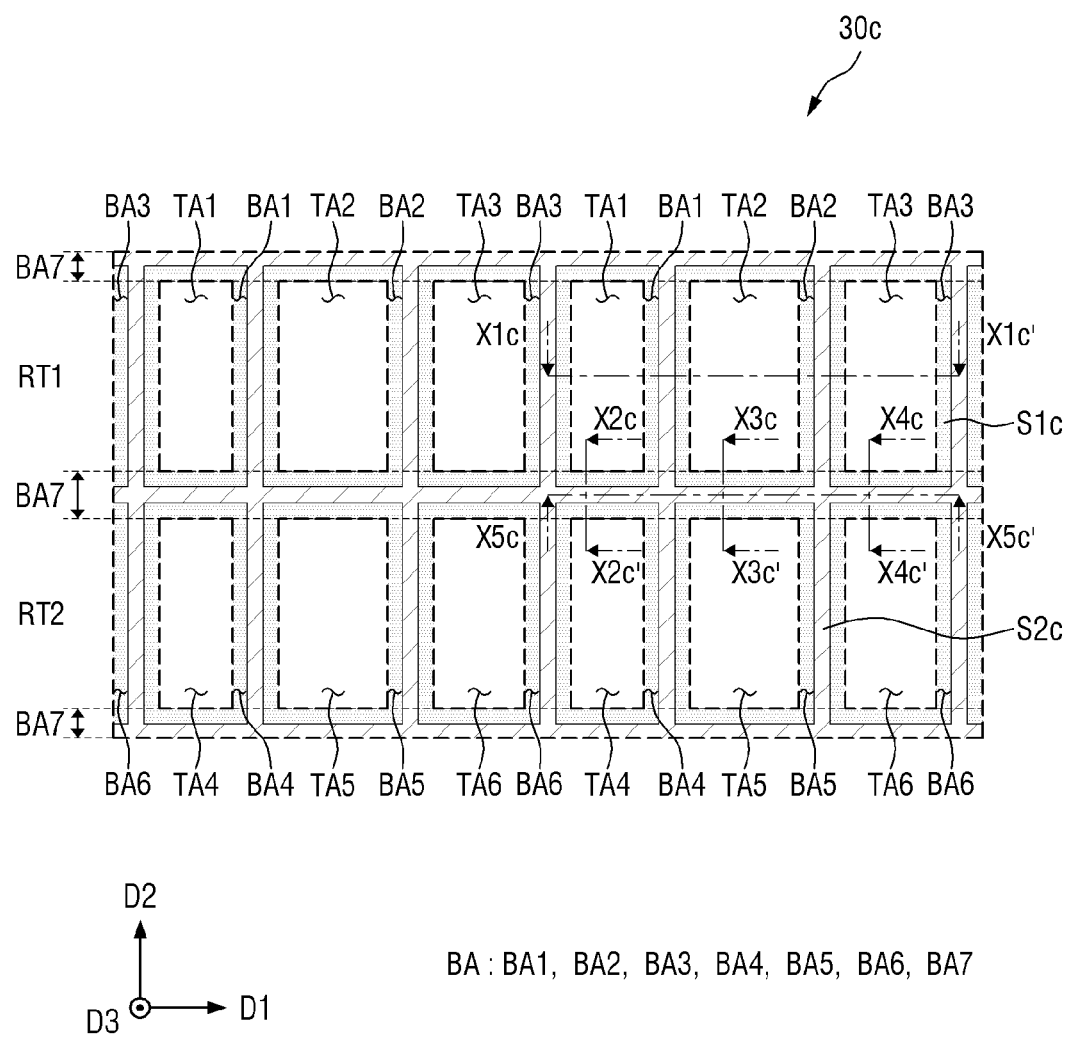
FIG. 31 is a schematic plan view illustrating an arrangement of a first contact area and a second contact area in the color conversion substrate of the display device according to yet another embodiment.
Figure 32:
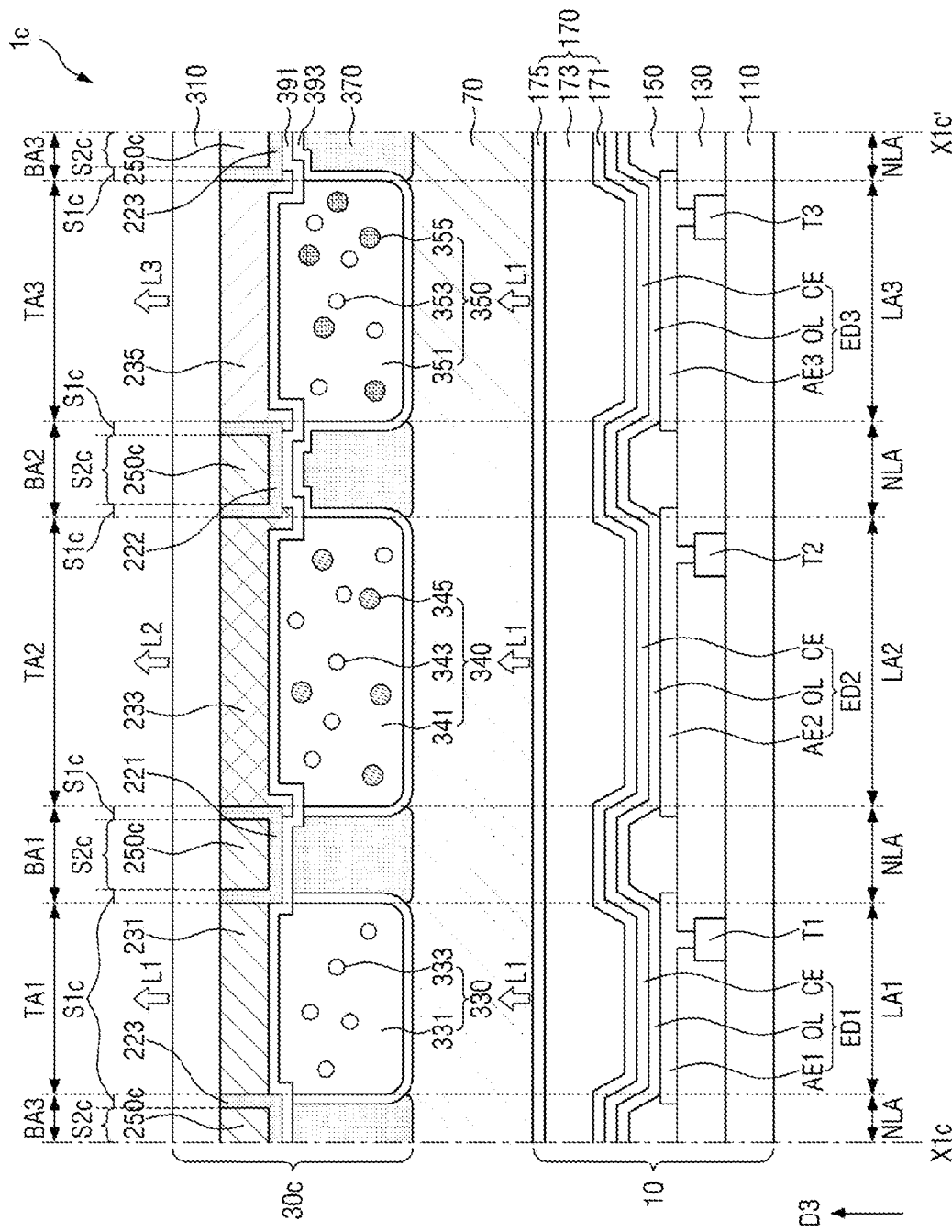
FIG. 32 is a cross-sectional view of the display device according to yet another embodiment taken along line X1c-X1c' of FIG. 31.
Figure 33:
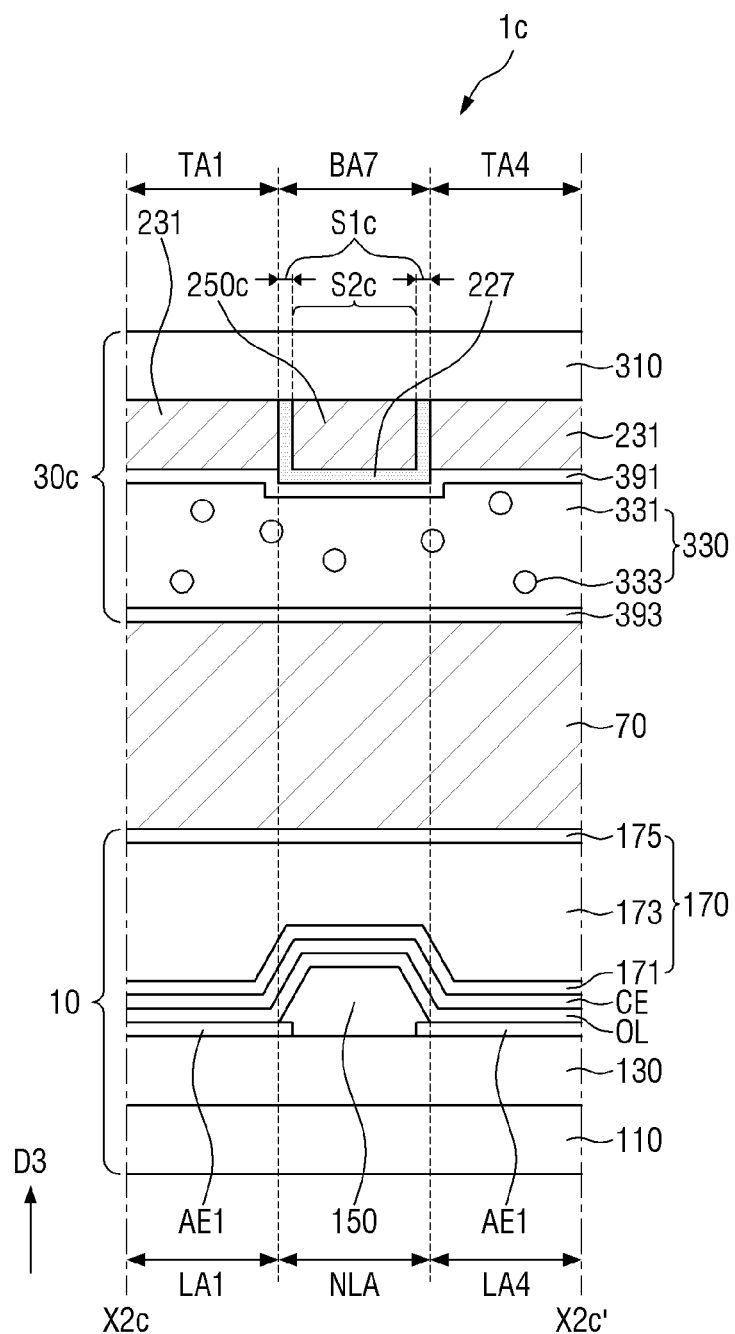
FIG. 33 is a cross-sectional view of the display device according to yet another embodiment taken along line X2c-X2c' of FIG. 32.
Figure 34:
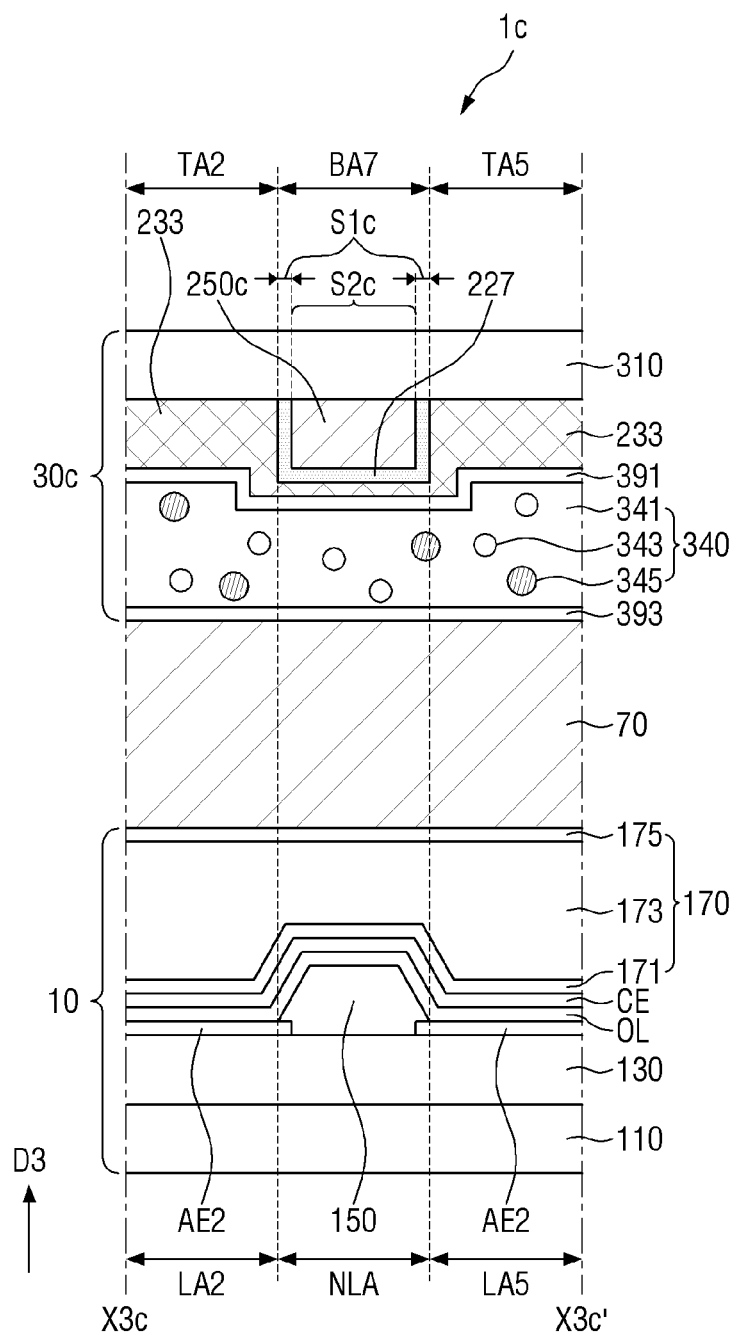
FIG. 34 is a cross-sectional view of the display device according to yet another embodiment taken along line X3c-X3c' of FIG. 32.
Figure 35:
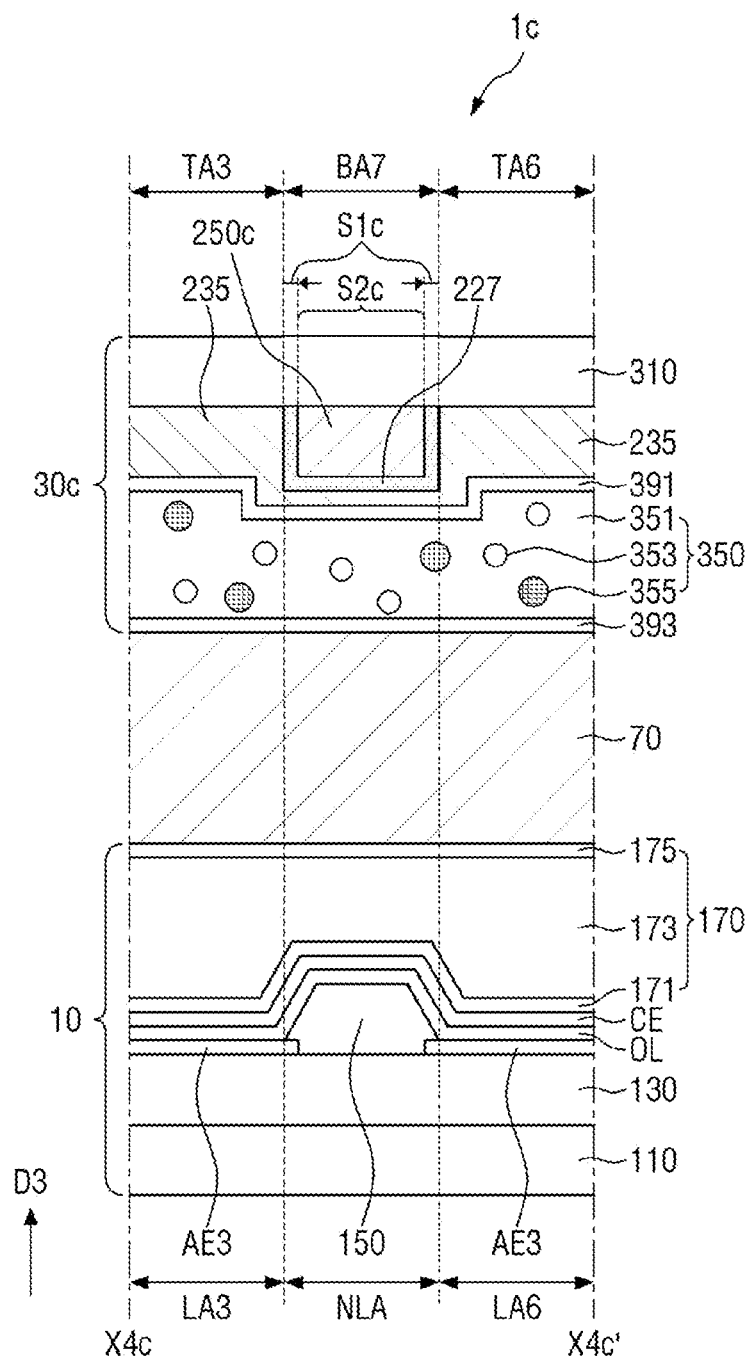
FIG. 35 is a cross-sectional view of the display device according to yet another embodiment taken along line X4c-X4c' of FIG. 32.
Figure 36:
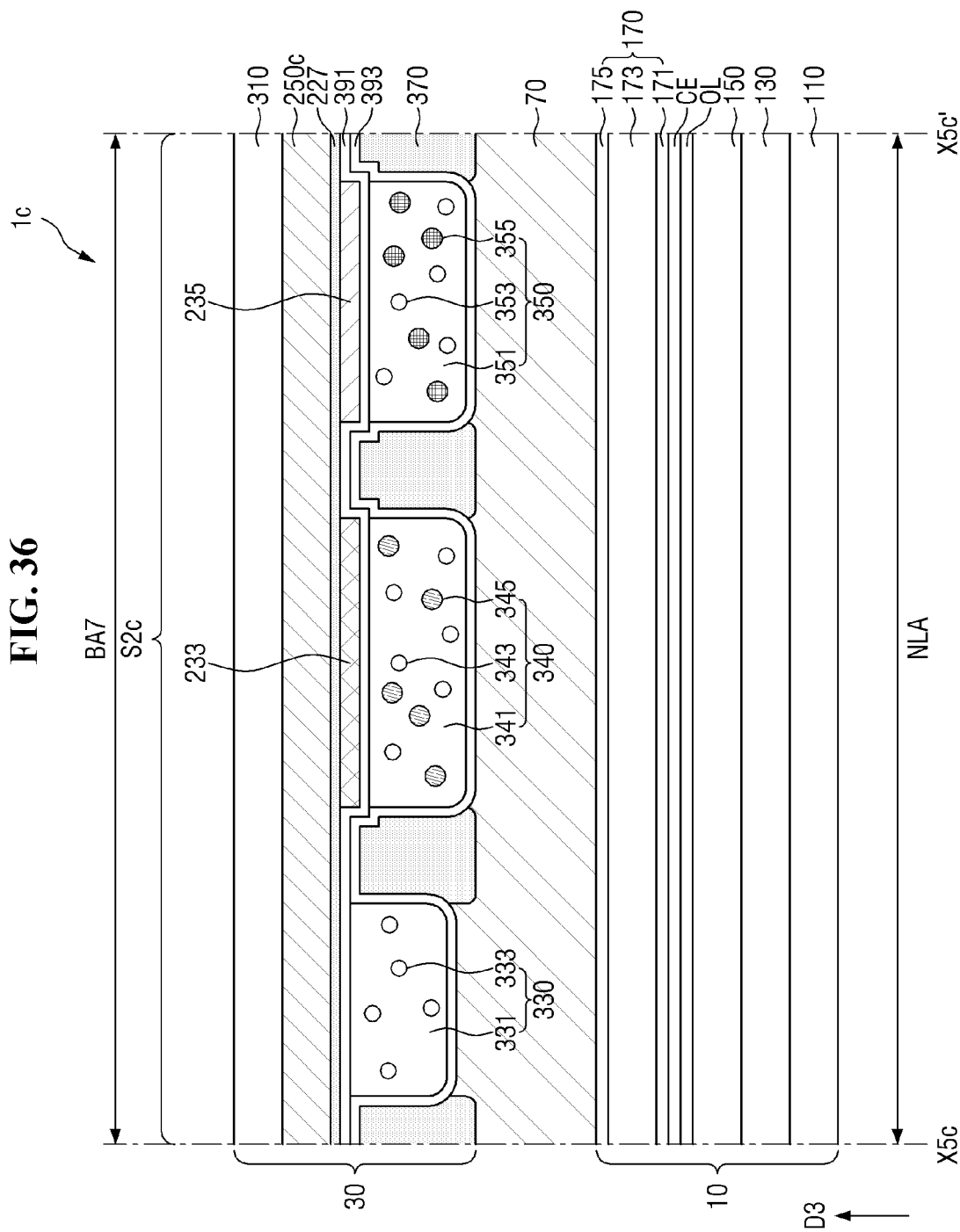
FIG. 36 is a cross-sectional view of the display device according to yet another embodiment taken along line X5c-X5c' of FIG. 32.

FIG. 30 is a schematic plan view illustrating an arrangement of a color pattern in a color conversion substrate of a display device according to yet another embodiment, FIG. 31 is a schematic plan view illustrating an arrangement of a first contact area and a second contact area in the color conversion substrate of the display device according to yet another embodiment, FIG. 32 is a cross-sectional view of the display device according to yet another embodiment taken along line X1*c*-X1*c*' of FIG. 31, FIG. 33 is a cross-sectional view of the display device according to yet another embodiment taken along line X2*c*-X2*c*' of FIG. 32, FIG. 34 is a cross-sectional view of the display device according to yet another embodiment taken along line X3*c*-X3*c*' of FIG. 32, FIG. 35 is a cross-sectional view of the display device according to yet another embodiment taken along line X4*c*-X4*c*' of FIG. 32, and FIG. 36 is a cross-sectional view of the display device according to yet another embodiment taken along line X5*c*-X5*c*' of FIG. 32.

Referring to FIGS. 30 to 36, a display device 1*c* according to the present embodiment includes a display substrate 10, a color conversion substrate 30*c*, and a filler 70. The display device 1*c* has configurations that are substantially the same as or similar to those in the embodiment described with reference to FIGS. 5 to 14 except for the configuration of the color conversion substrate 30*c*, in particular, a color pattern 250*c* of the color conversion substrate 30*c*. Thus, repeated descriptions will be omitted, and the description will be focused on the differences.

As shown in FIG. 30, the color pattern 250*c* may be disposed in a substantially grid shape in a plan view in a light-blocking area BA. The color pattern 250*c* may have a width less than that of the light-blocking area BA and may be disposed in all of a first light-blocking area BA1, a second light-blocking area BA2, a third light-blocking area BA3, a fourth light-blocking area BA4, a fifth light-blocking area BA5, a sixth light-blocking area BA6, and a seventh light-blocking area BA7.

When a description is made in terms of a contact area, as shown in FIG. 31, a first contact area S1*c*, with which one surface of a second base portion 310 and a light-blocking member 220 (see FIG. 11) are in contact, may be disposed to surround each of a first light-transmitting area TA1, a second light-transmitting area TA2, a third light-transmitting area TA3, a fourth light-transmitting area TA4, a fifth light-transmitting area TA5, and a sixth light-transmitting area TA6. In a first row RT1, the first contact area S1*a* may be disposed on a portion of the first light-blocking area BA1, a portion of the third light-blocking area BA3, and a portion of the seventh light-blocking area BA7 so as to completely surround the first light-transmitting area TA1.

In some embodiments, the first contact areas S1*c* adjacent to each other along the first direction D1 or the second direction D2 may be separated with a second contact area S2*c* therebetween.

When a description is made in terms of a cross section, as shown in FIG. 32, the color pattern 250*c*, which is in direct contact with the second base portion 310 and is spaced apart from a first color filter 231 and a second color filter 233, may be disposed on the second base portion 310 in the first light-blocking area BA1, and a first light-blocking member 221 may be disposed on the color pattern 250*c* and may surround opposite sides of the color pattern 250*c*. A portion of the first light-blocking member 221, which is in direct contact with the second base portion 310, may be disposed between the first color filter 231 and the color pattern 250*c* and between the second color filter 233 and the color pattern 250*c* in the first light-blocking area BA1.

As shown in FIG. 32, in the second light-blocking area BA2, the color pattern 250*c*, which is in direct contact with the second base portion 310 and spaced apart from the second color filter 233 and a third color filter 235, may be disposed on the second base portion 310. A second light-blocking member 222 may be disposed on the color pattern 250*c* and may surround opposite sides of the color pattern 250*c*. In the second light-blocking area BA2, a portion in which the second light-blocking member 222 is in direct contact with the second base portion 310 may be disposed between the color pattern 250*c* and the second color filter 233 and between the color pattern 250*c* and the third color filter 235.

As shown in FIG. 32, in the third light-blocking area BA3, the color pattern 250*c*, which is in direct contact with the second base portion 310 and spaced apart from the first color filter 231 and the third color filter 235, may be disposed on the second base portion 310. A third light-blocking member 223 may be disposed on the color pattern 250*c* and may surround opposite sides of the color pattern 250*c*. In the third light-blocking area BA3, a portion in which the third light-blocking member 223 is in direct contact with the second base portion 310 may be disposed between the color pattern 250c and the first color filter 231 and between the color pattern 250c and the third color filter 235.

As shown in FIGS. 33 to 36, the color pattern 250c in direct contact with the second base portion 310 may be disposed on the second base portion 310 in the seventh light-blocking area BA7. A seventh light-blocking member 227 may surround opposite sides of a fourth color pattern 2541 and may be in direct contact with the second base portion 310 to form the first contact area S1c.

Detailed descriptions of other configurations are the same as those described above, and thus will be omitted.

Hereinafter, the other embodiments of the color conversion substrate will be described based on the first contact area and the second contact area. The fact that the first contact area is an area in which the light-blocking member and the second base portion are in direct contact with each other and the second contact area is an area in which the color pattern and the second base portion are in direct contact with each other is the same as described above, and thus a detailed description thereof will be omitted.

FIGS. 37, 38, 39, 40, 41, 42, and 43 are schematic plan views each illustrating an arrangement of a first contact area and a second contact area in a color conversion substrate of a display device according to yet another embodiment.

Figure 37:
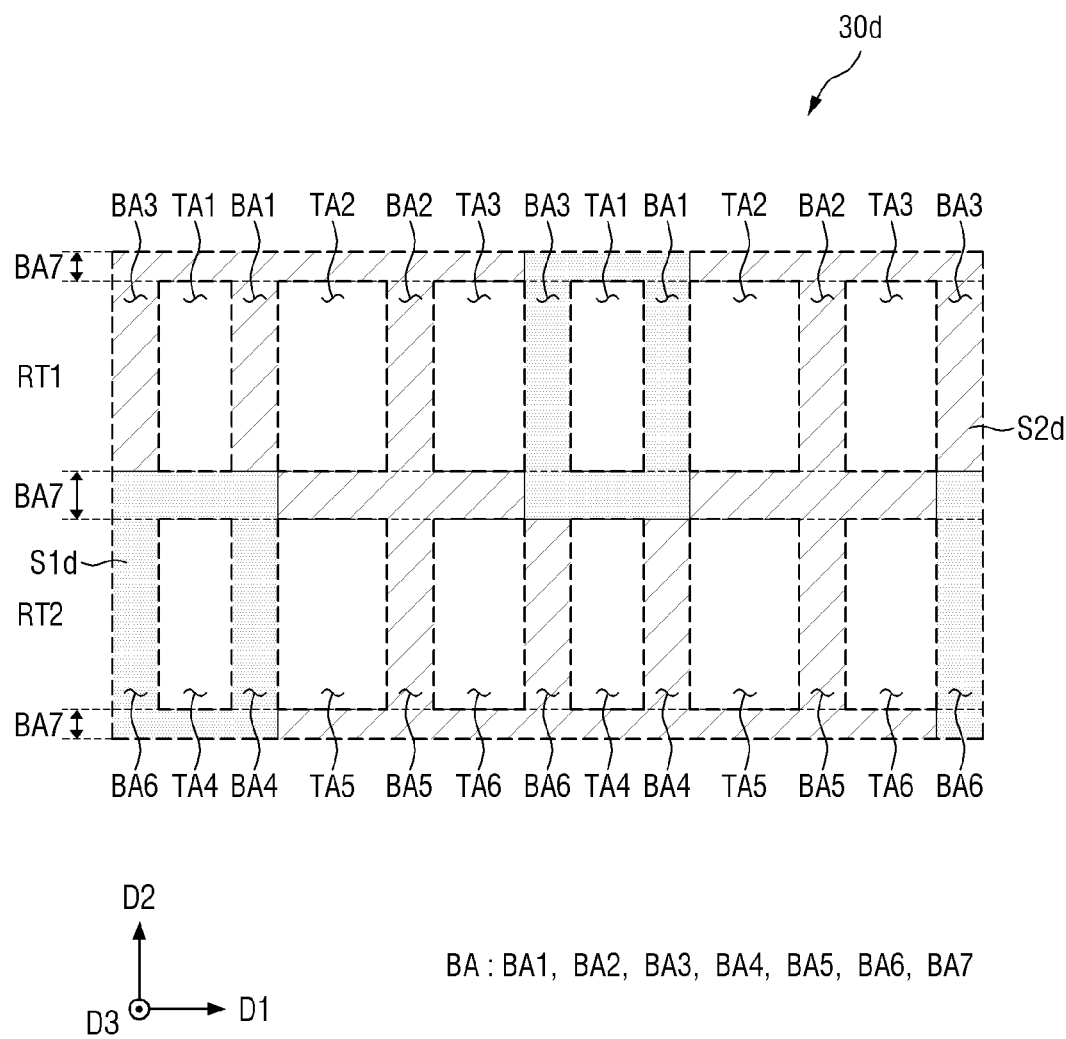
FIGS. 37, 38, 39, 40, 41, 42, and 43 are schematic plan views each illustrating an arrangement of a first contact area and a second contact area in a color conversion substrate of a display device according to yet another embodiment.

Referring to FIG. 37, a color conversion substrate 30d of the present embodiment is different from that of the embodiment of FIGS. 5 to 14 in that a first contact area S1d is disposed to surround a first light-transmitting area TA1 and a fourth light-transmitting area TA4, and the first contact area S1d in a first row RT1 and the first contact area S1d in a second row RT2 are disposed so as not to be adjacent to each other along the second direction D2.

A second contact area S2d may be disposed in the remaining area of a light-blocking area BA except for an area in which the first contact area S1d is disposed.

In the first row RT1, the first light-transmitting area TA1 disposed at a leftmost side of FIG. 37 may not be surrounded by the first contact area S1d, and the first light-transmitting area TA1 disposed fourth among the six light-transmitting areas in FIG. 37 may be completely surrounded by the first contact area S1d.

In the second row RT2, the fourth light-transmitting area TA4 disposed at the leftmost side of FIG. 37 may be completely surrounded by the first contact area S1d, and the fourth light-transmitting area TA4 disposed fourth among the six light-transmitting areas in FIG. 37 may not be surrounded by the first contact area S1d.

When a description is made based on the first row RT1, in some embodiments, the second contact area S2d may not be disposed between the first light-transmitting area TA1, which is disposed fourth among the six light-transmitting areas in FIG. 37, and a second light-transmitting area TA2, which is disposed fifth among the six light-transmitting areas and not be disposed between the first light-transmitting area TA1, which is disposed fourth among the six light-transmitting areas, and a third light-transmitting area TA3, which is disposed third among the six light-transmitting areas. In addition, the second contact area S2d may not be disposed in parts of a seventh light-blocking area BA7 between the first light-transmitting area TA1 disposed fourth among the six light-transmitting areas in the first row RT1 and the fourth light-transmitting area TA4 disposed fourth among the six light-transmitting areas in the second row RT2. That is, in a first light-blocking area BA1 between the first light-transmitting area TA1, which is disposed fourth among the six light-transmitting areas in the first row RT1, and the second light-transmitting area TA2, which is disposed fifth among the six light-transmitting areas in the first row RT1, and in a third light-blocking area BA3 between the first light-transmitting area TA1, which is disposed fourth among the six light-transmitting areas in the first row RT1, and the third light-transmitting area TA3 disposed third among the sixth light-transmitting areas in the first row RT1, only the first contact area S1d may be disposed and the second contact area S2d may not be disposed.

Similarly, when a description is made based on the second row RT2, in some embodiments, in a sixth light-blocking area BA6 and a fourth light-blocking area BA4 that are disposed at opposite sides of the fourth light-transmitting area TA4, which is disposed first among the six light-transmitting areas in FIG. 37, only the first contact area S1d may be disposed and the second contact area S2d may not be disposed.

Of the seventh light-blocking area BA7, even in an area between the fourth light-transmitting area TA4, which is disposed first among the six light-transmitting areas in the second row RT2, and the first light-transmitting area TA1, which is disposed first among the six light-transmitting areas in the first row RT1, and an area between first light-transmitting area TA1, which is disposed fourth among the six light-transmitting areas in the first row RT1, and the fourth light-transmitting area TA4, which is disposed fourth among the six light-transmitting areas in the second row RT2, only the first contact area S1d may be disposed and the second contact area S2d may not be disposed.

Figure 38:
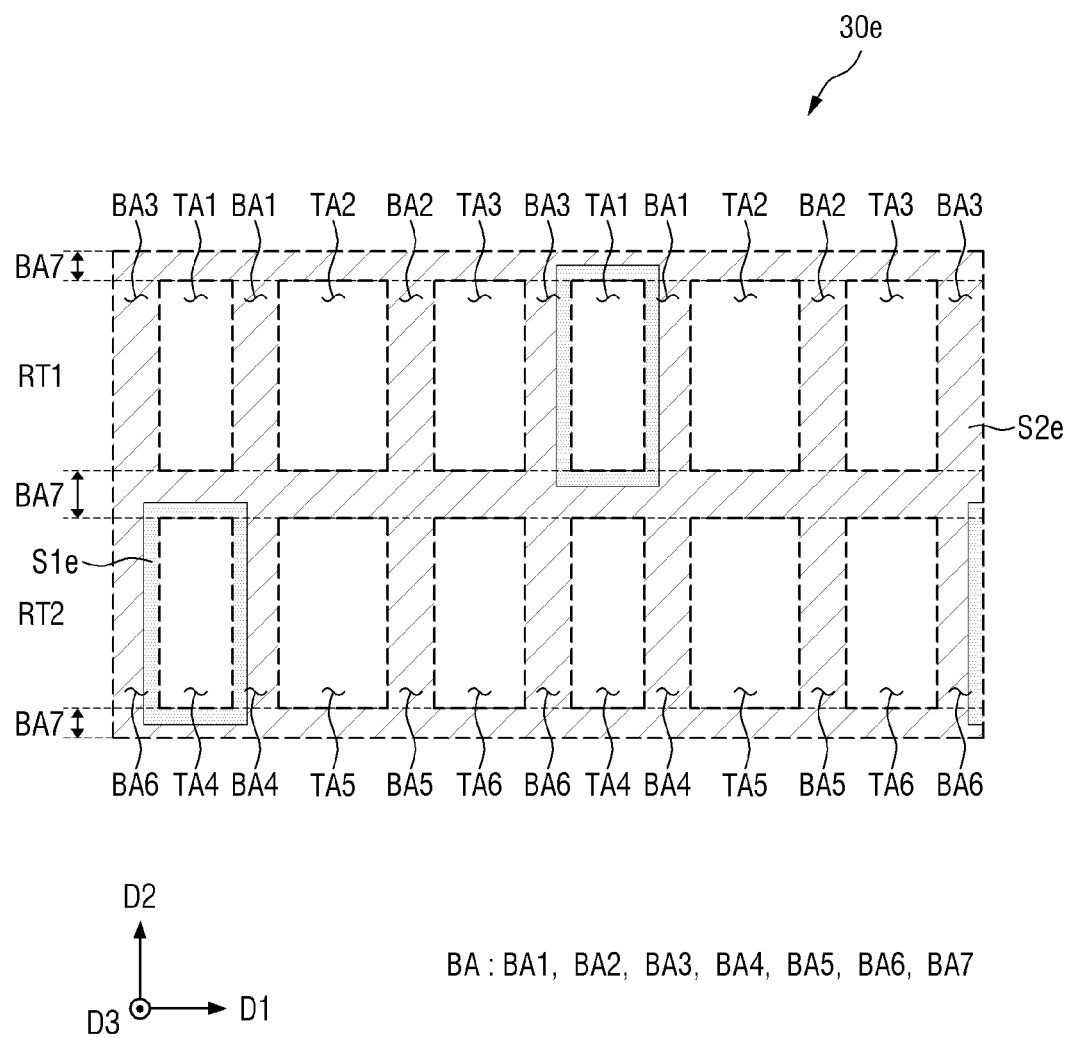

Referring to FIG. 38, configuration of a color conversion substrate 30e of the present embodiment is different from that of the embodiment of FIG. 37 in that a second contact area S2e surrounding a first contact area S1e is disposed on a periphery of the first contact area S1e, and other configurations are substantially the same or similar.

When a description is made based on a first row RT1, in some embodiments, the first contact area S1e and the second contact area S2e may be sequentially disposed along the first direction D1 in a third light-blocking area BA3 and a first light-blocking area BA1 that are disposed on opposite sides of a first light-transmitting area TA1 disposed fourth among the six light-transmitting areas, and the first contact area S1e may be disposed relatively closer to the first light-transmitting area TA1 disposed fourth among the six light-transmitting areas than the second contact area S2e.

When a description is made based on a second row RT2, in some embodiments, the first contact area S1e and the second contact area S2e may be sequentially disposed in a sixth light-blocking area BA6 and a fourth light-blocking area BA4 that are disposed on opposite sides of a fourth light-transmitting area TA4, which is disposed first among the six light-transmitting areas, and the first contact area S1e may be disposed relatively closer to the fourth light-transmitting area TA4 disposed first among the six light-transmitting areas than the second contact area S2e.

The first contact area S1e and the second contact area S2e may be sequentially disposed along the second direction D2 in an area of a seventh light-blocking area BA7 between the fourth light-transmitting area TA4, which is disposed first among the six light-transmitting areas, and the first light-transmitting area TA1, which is disposed first among the six light-transmitting areas, and the first contact area S1e may be disposed relatively closer to the fourth light-transmitting area TA4 disposed first among the six light-transmitting areas than the second contact area S2e. The first contact area S1e and the second contact area S2e may also be sequentially disposed along the second direction D2 in an area of the seventh light-blocking area BA7 between the first light-transmitting area TA1, which is disposed fourth among the six light-transmitting areas, and the fourth light-transmitting area TA4, which is disposed fourth among the six light-transmitting areas, and the first contact area S1e may be disposed relatively closer to the first light-transmitting area TA1 disposed fourth among the six light-transmitting areas than the second contact area S2e.

Figure 39:
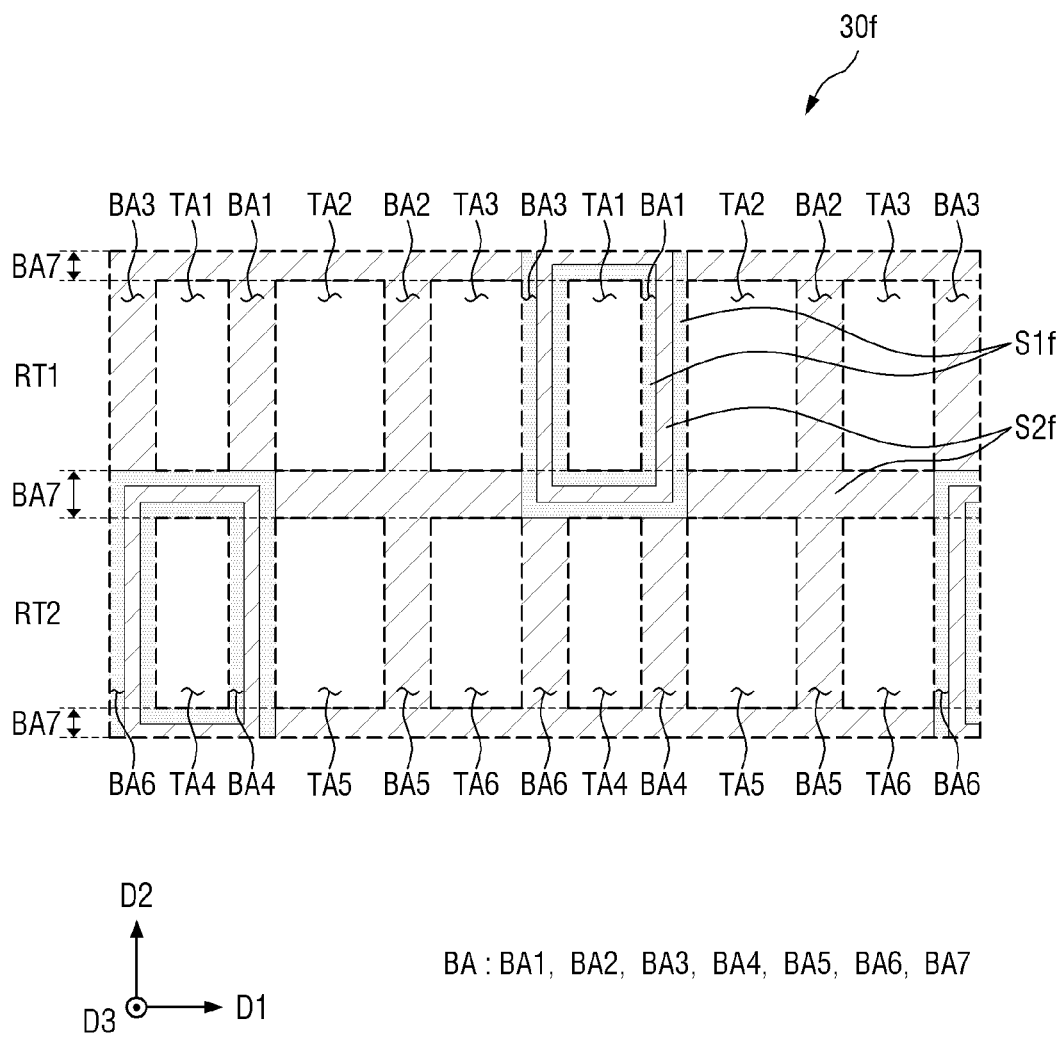

Referring to FIG. 39, the configuration of a color conversion substrate 30f of the present embodiment is different from that of the embodiment of FIG. 38 in that a first contact area S1f is disposed to surround a first light-transmitting area TA1 and a fourth light-transmitting area TA4, a second contact area S2f is disposed so as to surround the first contact area S1f, and the first contact area S1f is disposed to further surround an outer side of the second contact area S2f, and other configurations are substantially the same or similar.

When a description is made based on a first row RT1, the first contact area S1f, the second contact area S2f, and the first contact area S1f may be sequentially disposed along the first direction D1 in a third light-blocking area BA3 and a first light-blocking area BA1 that are disposed at opposite sides of the first light-transmitting area TA1 disposed fourth among the six light-transmitting areas.

When a description is made based on a second row RT2, the first contact area S1f, the second contact area S2f, and the first contact area S1f may be sequentially disposed along the first direction D1 in the third light-blocking area BA3 and the first light-blocking area BA1 that are disposed at opposite sides of the fourth light-transmitting area TA4 disposed first among the light-transmitting areas.

The first contact area S1f, the second contact area S2f, and the first contact area S1f may be sequentially disposed along the second direction D2 in an area of a seventh light-blocking area BA7 between the fourth light-transmitting area TA4, which is disposed first among the light-transmitting areas, and the first light-transmitting area TA1, which is disposed first among the light-transmitting areas, and an area of the seventh light-blocking area BA7 between first light-transmitting area TA1, which is disposed fourth among the six light-transmitting areas in the first row RT1, and the fourth light-transmitting area TA4 disposed fourth among the six light-transmitting areas in the second row RT2.

Figure 40:
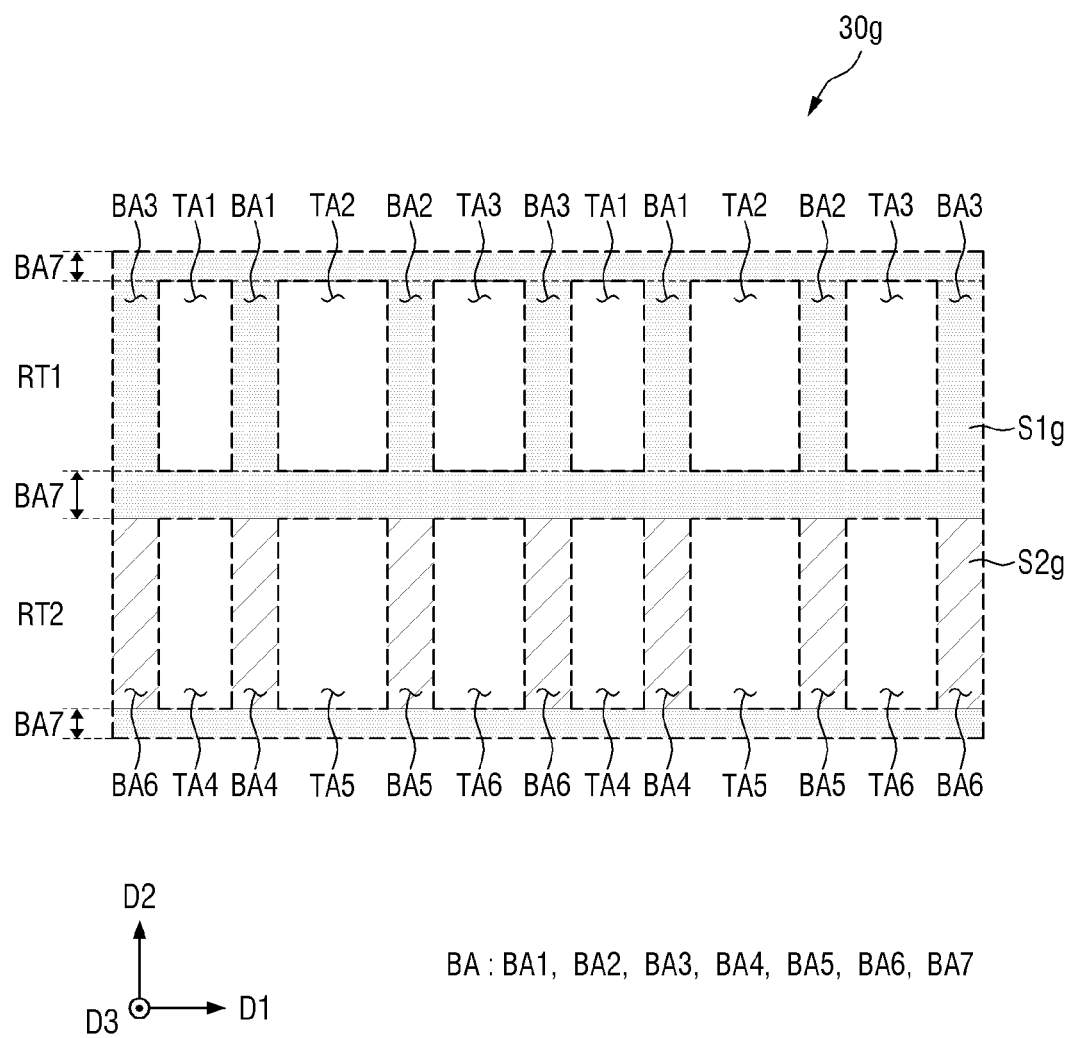

Referring to FIG. 40, in a color conversion substrate 30g of the present embodiment, a first contact area S1g is disposed throughout a seventh light-blocking area BA7, a first light-blocking area BA1, a second light-blocking area BA2, and a third light-blocking area BA3, and a second contact area S2g is disposed throughout a fourth light-blocking area BA4, a fifth light-blocking area BS5, and a sixth light-blocking area BA6. Thus, in a first row RT1, a first light-transmitting area TA1, a second light-transmitting area TA2, and a third light-transmitting area TA3 may be completely surrounded by the first contact area S1g, and the second contact area S2g may not be disposed in the first row RT1.

In addition, in a second row RT2, a fourth light-transmitting area TA4, a fifth light-transmitting area TA5, and a sixth light-transmitting area TA6 may not be completely surrounded by the first contact area S1g.

Figure 41:
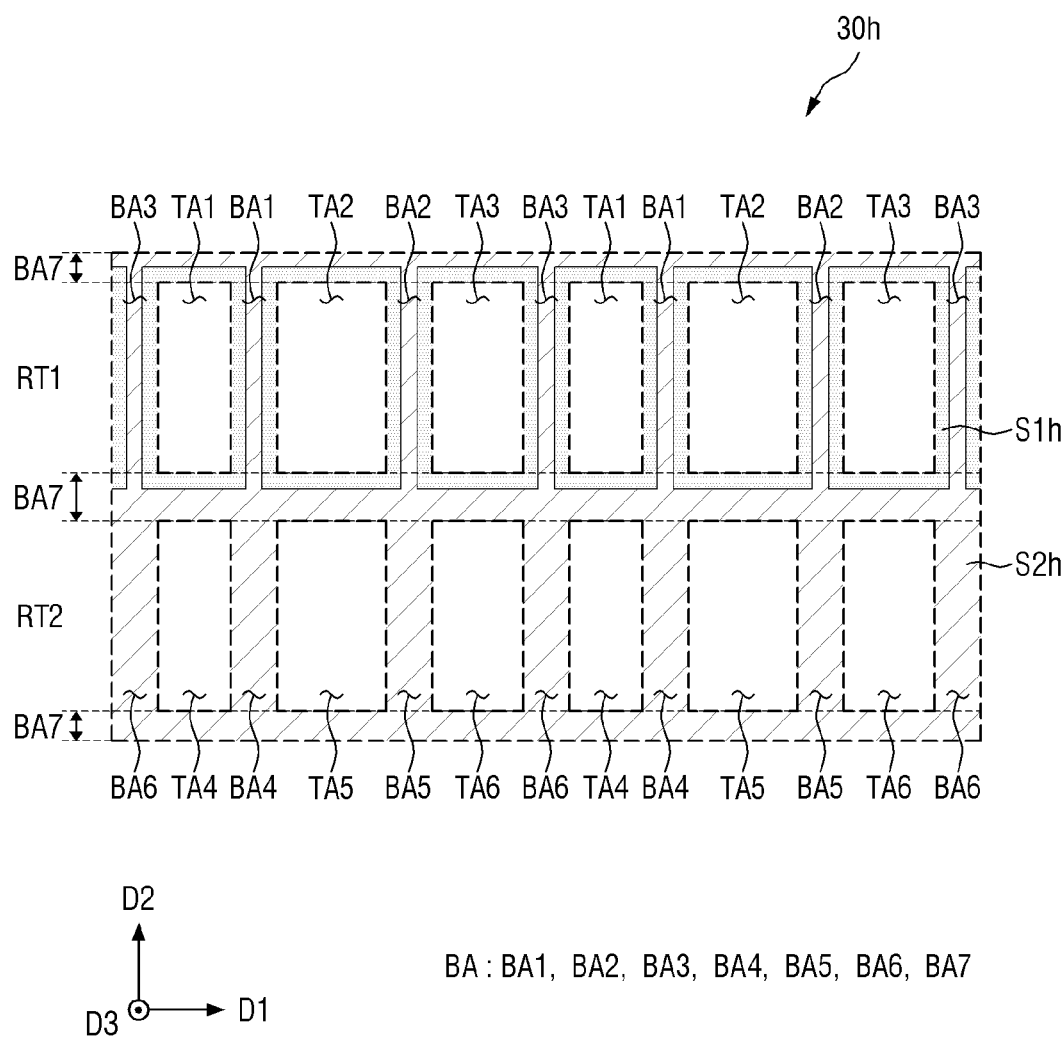

Referring to FIG. 41, in a color conversion substrate 30h of the present embodiment, a first contact area S1h is disposed only in a first row RT1 and is disposed to surround each of a first light-transmitting area TA1, a second light-transmitting area TA2, and a third light-transmitting area TA3. In the first row RT1, the first contact area S1h surrounding the first light-transmitting area TA1, the first contact area S1h surrounding the second light-transmitting area TA2, and the first contact area S1h surrounding the third light-transmitting area TA3 are spaced apart from each other with a second contact area S2h therebetween.

Both the first contact area S1h and the second contact area S2h are disposed in a seventh light-blocking area BA7, a first light-blocking area BA1, a second light-blocking area BA2, and a third light-blocking area BA3. In a fourth light-blocking area BA4, a fifth light-blocking area BS5, and a sixth light-blocking area BA6, the first contact area S1h may not be disposed and only the second contact area S2h may be disposed.

Figure 42:
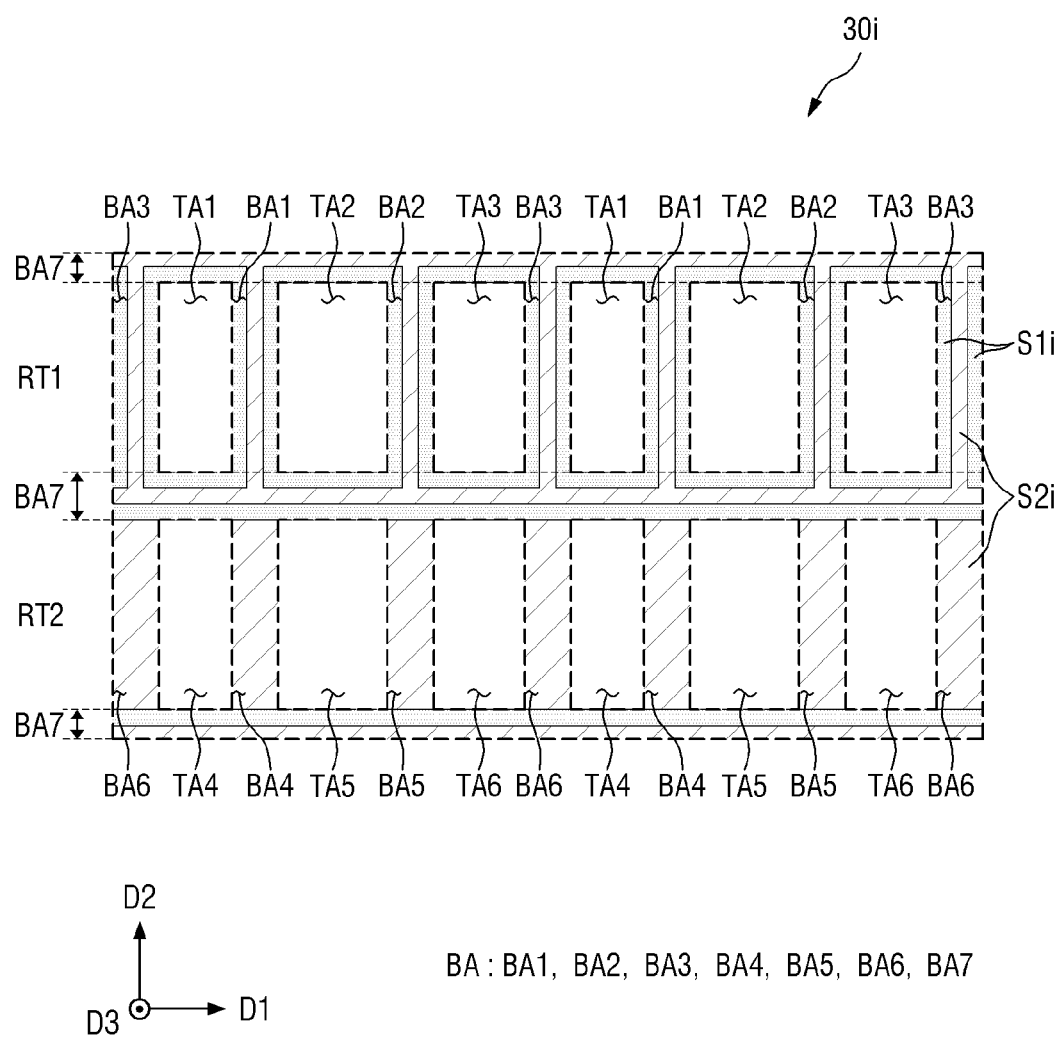

Referring to FIG. 42, the configuration of a color conversion substrate 30i of the present embodiment is different from that of the embodiment of FIG. 41 in that a first contact area S1i is further disposed in a seventh light-blocking area BA7, and the first contact area S1i, a second contact area S2i, and the first contact area S1i are sequentially disposed along the second direction D2 in the seventh light-blocking area BA7, and other configurations may be substantially the same. Thus, a duplicate description thereof will be omitted.

Figure 43:
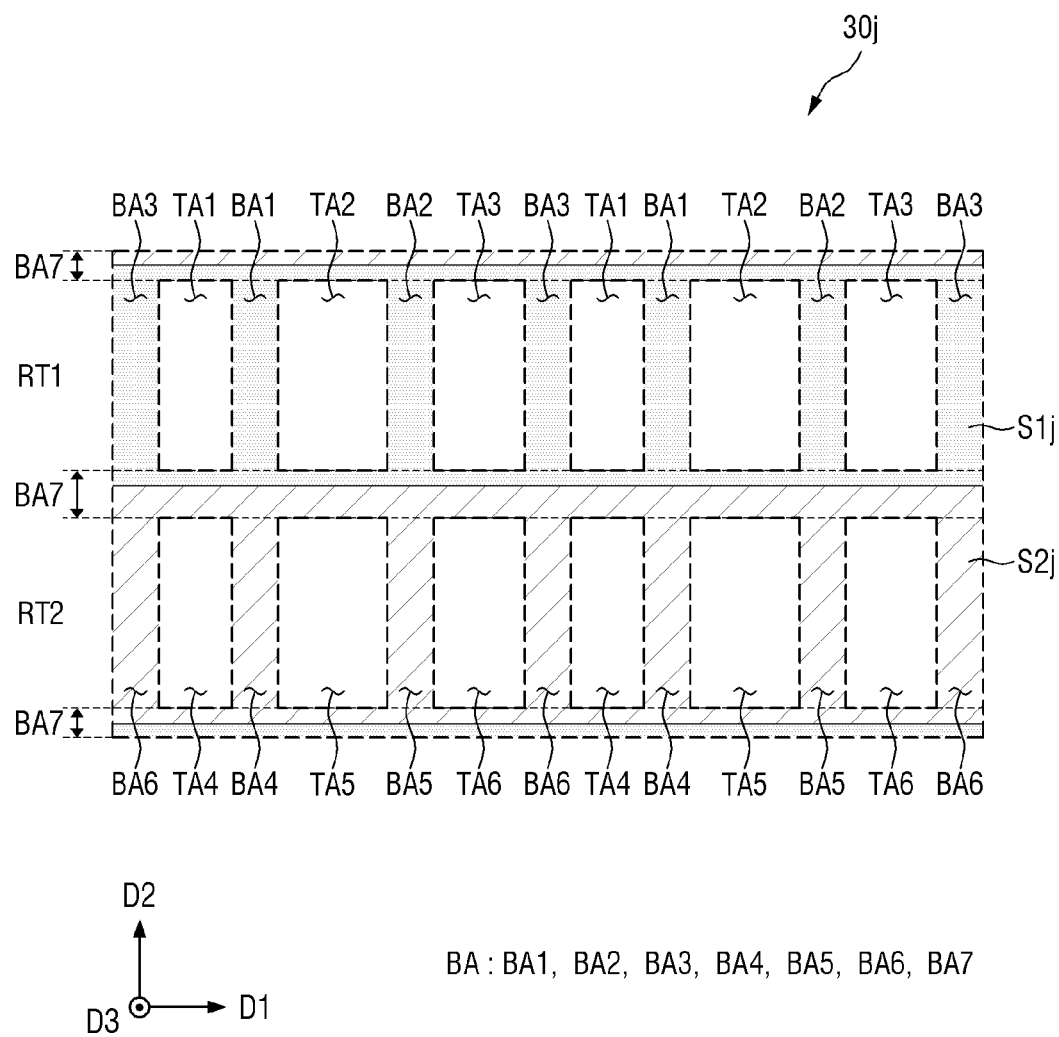

Referring to FIG. 43, the configuration of a color conversion substrate 30j of the present embodiment is different from that of the embodiment of FIG. 40 in that a second contact area S2j is further disposed in a seventh light-blocking area BA7, a first contact area S1j and the second contact area S2j are sequentially disposed along the second direction D2 in the seventh light-blocking area BA7, and the first contact area S1j is disposed relatively closer to the first row RT1 than the second contact area S2j, and other configurations may be substantially the same. Thus, a duplicate description thereof will be omitted.

The color conversion substrate and the display device according to the above-described embodiments may reduce the color distortion due to the external light reflection and improve the display quality.

While the embodiments of the present invention have been described with reference to the accompanying drawings, it should be understood by those skilled in the art that various modifications may be made without departing from the scope of the present invention and without changing essential features thereof. Therefore, it should be understood that the above-described embodiments are not restrictive but illustrative in all aspects.

The invention claimed is:

1. A color conversion substrate comprising:
  a base portion in which a first light-blocking area, a second light-blocking area, a first light-transmitting area, a second light-transmitting area, and a third light-transmitting area are defined, wherein the first light-transmitting area, the second light-transmitting area, and the third light-transmitting area are sequentially disposed along a first direction;
  a first color filter disposed on the base portion and disposed in the first light-transmitting area;
  a second color filter disposed on the base portion and disposed in the second light-transmitting area;
  a third color filter disposed on the base portion and disposed in the third light-transmitting area;
  a light-blocking member including a first light-blocking member which is disposed on the base portion, disposed in the first light-blocking area, and includes a portion in contact with the base portion;
  a color pattern including a first color pattern which is disposed on the base portion, disposed in the second light-blocking area, and in contact with the base portion;

a first capping layer disposed on the base portion and covering the first color filter, the second color filter, the third color filter, the light-blocking member, and the color pattern, wherein the first capping layer is made of an inorganic material;

a light-transmitting pattern disposed on the first color filter, wherein the light-transmitting pattern includes a base resin and a scatterer disposed in the base resin;

a first wavelength conversion pattern disposed on the second color filter and which wavelength-converts light of a first color into light of a second color; and a second wavelength conversion pattern disposed on the third color filter and which wavelength-converts the light of the first color into light of a third color, wherein the light of the third color is different from the light of the second color, wherein the color pattern and the first color filter include a same colorant, wherein the light-transmitting pattern, the first wavelength conversion pattern, and the second wavelength conversion pattern are disposed on the first capping layer.

2. The color conversion substrate of claim 1, wherein the first light-blocking area is disposed between the first light-transmitting area and the second light-transmitting area which are arranged along the first direction, and the second light-blocking area is disposed between the second light-transmitting area and the third light-transmitting area which are arranged along the first direction.

3. The color conversion substrate of claim 2, wherein the first color filter transmits the light of the first color and blocks the light of the second color and the light of the third color, the second color filter transmits the light of the second color and blocks the light of the first color and the light of the third color, and the third color filter transmits the light of the third color and blocks the light of the first color and the light of the second color.

4. The color conversion substrate of claim 2, wherein the light-blocking member further includes a second light-blocking member which is disposed in the second light-blocking area and is disposed on the color pattern in the second light-blocking area.

5. The color conversion substrate of claim 4, wherein the second light-blocking member is not in direct contact with the base portion in the second light-blocking area.

6. The color conversion substrate of claim 2, wherein the light-blocking member further includes a third light-blocking member which is in contact with the base portion, wherein the light-blocking member completely surrounds the first light-transmitting area in a plan view.

7. A color conversion substrate comprising:

a base portion in which a first light-blocking area, a second light-blocking area, a first light-transmitting area, a second light-transmitting area, and a third light-transmitting area are defined, wherein the first light-transmitting area, the second light-transmitting area, and the third light-transmitting area are sequentially disposed along a first direction;

a first color filter disposed on the base portion and disposed in the first light-transmitting area;

a second color filter disposed on the base portion and disposed in the second light-transmitting area;

a third color filter disposed on the base portion and disposed in the third light-transmitting area;

a light-blocking member including a first light-blocking member which is disposed on the base portion, disposed in the first light-blocking area, and includes a portion in contact with the base portion;

a color pattern including a first color pattern which is disposed on the base portion, disposed in the second light-blocking area, and in contact with the base portion;

a first wavelength conversion pattern disposed on the second color filter and which wavelength-converts light of a first color into light of a second color; and a second wavelength conversion pattern disposed on the third color filter and which wavelength-converts the light of the first color into light of a third color, wherein the light of the third color is different from the light of the second color, wherein the color pattern and the first color filter include a same colorant, wherein the first light-blocking area is disposed between the first light-transmitting area and the second light-transmitting area which are arranged along the first direction, and the second light-blocking area is disposed between the second light-transmitting area and the third light-transmitting area which are arranged along the first direction, wherein the color pattern further includes a second color pattern which is disposed in the first light-blocking area and is in contact with the base portion in the first light-blocking area, a portion of the first light-blocking member in the first light-blocking area is disposed on the second color pattern, and another portion of the first light-blocking member in the first light-blocking area is in direct contact with the base portion.

8. The color conversion substrate of claim 7, wherein, a first contact area, in which the first light-blocking member is in contact with the base portion in the first light-blocking area, is disposed relatively closer to the first light-transmitting area than a second contact area in which the second color pattern is in contact with the base portion in the first light-blocking area.

9. The color conversion substrate of claim 7, wherein a first contact area, in which the first light-blocking member is in contact with the base portion in the first light-blocking area, is disposed in areas of the first light-blocking area 1) between a second contact area, in which the second color pattern is in contact with the base portion, and the first light-transmitting area and 2) between the second contact area and the second light-transmitting area.

10. The color conversion substrate of claim 7, wherein the light-blocking member further includes a second light-blocking member which is disposed in the second light-blocking area, a portion of the second light-blocking member in the second light-blocking area is disposed on the first color pattern, and another portion of the second light-blocking member in the second light-blocking area is in direct contact with the base portion.

11. The color conversion substrate of claim 10, wherein a first contact area, in which the another portion of the second light-blocking member is in direct contact with the base portion in the second light-blocking area, is disposed in areas of the second light-blocking area 1) between a second contact area, in which the first color pattern is in contact with the base portion, and the second light-transmitting area and 2) between the second contact area and the third light-transmitting area.

12. The color conversion substrate of claim 1, wherein
the first light-blocking area is disposed adjacent to the first light-transmitting area and extends along a second direction intersecting the first direction, and
the second light-blocking area is disposed between the second light-transmitting area and the third light-transmitting area and extends along the second direction.

13. The color conversion substrate of claim 1, wherein the first capping layer is in direct contact with the light-blocking member.

14. The color conversion substrate of claim 1, further comprising:
a second capping layer disposed on the first capping layer and covering the light-transmitting pattern, the first wavelength conversion pattern, and the second wavelength conversion pattern; and
a color mixing preventing member disposed on the second capping layer and disposed between the light-transmitting pattern and the first wavelength conversion pattern and between the first wavelength conversion pattern and the second wavelength conversion pattern.

15. A display device comprising:
a first base portion in which a first light-emitting area and a second light-emitting area are defined;
a first light-emitting element disposed on the first base portion and disposed in the first light-emitting area;
a second light-emitting element disposed on the first base portion and disposed in the second light-emitting area;
a thin-film encapsulation layer disposed on the first light-emitting element and the second light-emitting element;
a second base portion disposed on the thin-film encapsulation layer;
a blue color filter disposed on a surface of the second base portion, which faces the thin-film encapsulation layer, and overlapping the first light-emitting element in a plan view;
a red color filter disposed on the surface of the second base portion and overlapping the second light-emitting element in the plan view;
a light-blocking member disposed on the surface of the second base portion, disposed between the blue color filter and the red color filter, and in direct contact with the second base portion;
a color pattern disposed on the surface of the second base portion, disposed on an opposite side of the light-blocking member with the red color filter therebetween, and in direct contact with the second base portion;
a light-transmitting pattern disposed on the blue color filter;
a capping layer disposed between the light-transmitting pattern and the blue color filter, wherein the capping layer is in direct contact with the light-blocking member; and
a wavelength conversion pattern disposed on the red color filter,
wherein each of the first light-emitting element and the second light-emitting element includes an organic light-emitting layer which emits blue light,
the wavelength conversion pattern is configured to wavelength-convert blue light into red light, and
the color pattern includes a blue colorant.

16. The display device of claim 15, wherein the wavelength conversion pattern includes a base resin and a quantum dot dispersed in the base resin.

17. The display device of claim 15, wherein
the capping layer is further disposed on the light-transmitting pattern and the wavelength conversion pattern; and
a filler disposed between the thin-film encapsulation layer and the capping layer,
wherein the capping layer is in direct contact with the filler.

18. A color conversion substrate comprising:
a base portion in which a first light-blocking area, a second light-blocking area, a first light-transmitting area, a second light-transmitting area, and a third light-transmitting area are defined, wherein the first light-transmitting area, the second light-transmitting area, and the third light-transmitting area are sequentially disposed along a first direction;
a first color filter disposed on the base portion and disposed in the first light-transmitting area;
a second color filter disposed on the base portion and disposed in the second light-transmitting area;
a third color filter disposed on the base portion and disposed in the third light-transmitting area;
a light-blocking member including a first light-blocking member which is disposed on the base portion, disposed in the first light-blocking area, and includes a portion in contact with the base portion;
a color pattern including a first color pattern which is disposed on the base portion, disposed in the second light-blocking area, and in contact with the base portion;
a first wavelength conversion pattern disposed on the second color filter and which wavelength-converts light of a first color into light of a second color; and
a second wavelength conversion pattern disposed on the third color filter and which wavelength-converts the light of the first color into light of a third color, wherein the light of the third color is different from the light of the second color,
a light-transmitting pattern disposed on the first color filter, wherein the light-transmitting pattern includes a base resin and a scatterer disposed in the base resin;
a first capping layer disposed between the light-transmitting pattern and the first color filter,
wherein the first capping layer is in direct contact with the first light-blocking member,
wherein the color pattern and the first color filter include a same colorant.

* * * * *